(12) United States Patent
Miyasita et al.

(10) Patent No.: US 7,761,071 B2
(45) Date of Patent: Jul. 20, 2010

(54) VARIABLE GAIN AMPLIFIER, AND AM-MODULATED SIGNAL RECEPTION CIRCUIT AND DETECTION CIRCUIT

(75) Inventors: Tokio Miyasita, Tokyo (JP); Junichi Yanagihara, Tokyo (JP); Takashi Taya, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 625 days.

(21) Appl. No.: 11/806,873

(22) Filed: Jun. 5, 2007

(65) Prior Publication Data

US 2007/0238432 A1    Oct. 11, 2007

Related U.S. Application Data

(62) Division of application No. 10/735,720, filed on Dec. 16, 2003, now abandoned.

(30) Foreign Application Priority Data

May 16, 2003    (JP) .............................. 2003/139182

(51) Int. Cl.
*H04B 7/00*    (2006.01)
(52) U.S. Cl. .............. 455/232.1; 455/245.1; 455/226.2; 455/334; 455/337; 375/257; 375/260
(58) Field of Classification Search .............. 455/232.1, 455/245.1, 226.2, 334, 337; 375/257, 260
See application file for complete search history.

(56) References Cited

U.S. PATENT DOCUMENTS 4,884,141 A * 11/1989 Hyakutake .................. 348/678
5,978,664 A * 11/1999 Janssen .................... 455/226.2
6,014,180 A * 1/2000 Kawano .................... 348/678
6,532,268 B1 * 3/2003 Morisawa .................... 375/257

(Continued)

FOREIGN PATENT DOCUMENTS

JP       07 107024        4/1995

(Continued)

OTHER PUBLICATIONS

"Notice of Reason for Rejection" No. 2005-269431 dated Nov. 20, 2007 from the Japanese Patent Office. (with Excerpt Translation).

(Continued)

*Primary Examiner*—Sanh D Phu
(74) *Attorney, Agent, or Firm*—Studebaker & Brackett PC; Donald R. Studebaker

(57) ABSTRACT

In order to provide a variable gain amplifier of enhanced linearity and wide variable gain range, an AM-modulated signal reception circuit in which the noise of an input portion is reduced so as to improve the follow-up characteristic of an AGC circuit, and an AM-modulated signal detection circuit which produces an output precisely corresponding to a peak value envelope, the variable gain amplifier comprises a differential input amplifier which includes transistors T1 and T2 (in FIG. 8) constituting a differential pair, and a constant current circuit Is operating as an absorption current circuit of the transistors T1 and T2, and a variable impedance which is connected between the sources of the respective transistors T1 and T2, wherein the gain of the differential input amplifier is made variable by variably controlling the value of the variable impedance.

28 Claims, 31 Drawing Sheets

U.S. PATENT DOCUMENTS

2005/0266693 A1  12/2005  Maekawa

FOREIGN PATENT DOCUMENTS

| JP | 2000-294378 | 10/2000 |
| JP | 2001 272482 | 10/2001 |
| JP | 2002 267775 | 9/2002 |
| JP | 2002 311167 | 10/2002 |
| JP | 2003-100609 | 4/2003 |

OTHER PUBLICATIONS

M. Okinaka et al., "Fine patterning of $SiO_2$ thin film using polysilane as a precursor", 52nd Japan Society of Applied Physics and Related Societies, 24p-F-1 (Mar. 22, 2006).

* cited by examiner

CHANGEOVER CONTROL
(TURN-ON OF EITHER)

VARIABLE GAIN AMPLIFIER, AND AM-MODULATED SIGNAL RECEPTION CIRCUIT AND DETECTION CIRCUIT

This application is Divisional of U.S. application Ser. No. 10/735,720 filed Dec. 16, 2003 now abandoned.

BACKGROUND OF THE INVENTION

1. Field of the Invention

This invention relates to the circuits of reception portions for radio frequency (RF) communications employing AM modulation, such as the RF reception portion of a radio timepiece.

2. Description of Related Art

FIG. 1-FIG. 3 are circuit diagrams each showing a practicable example of a prior-art variable gain amplifier for auto gain control (AGC). Besides, FIG. 6 is a circuit diagram showing the basic constructional example of the RF reception portion of a prior-art radio timepiece.

In the variable gain amplifier shown in FIG. 1, a differential amplifier 1 is so configured that transistors T1 and T2 constitute a first differential pair, the absorption current of which is caused to flow to the drain of a transistor T5. Also, a differential amplifier 2 is so configured that a transistor T3 having a source resistance Rs1 connected to its source, and a transistor T4 having a source resistance Rs2 connected to its source constitute a second differential pair, the absorption current of which is caused to flow to the drain of a transistor T6. In order to connect the inputs and outputs of the differential amplifiers 1 and 2 in parallel, the positive inputs thereof (the gates of the transistors T1 and T3) and the negative inputs thereof (the gates of the transistors T2 and T4) are respectively connected to each other (whereby the differential amplifiers 1 and 2 receive the same differential inputs). Further, the positive-phase current outputs of the differential amplifiers 1 and 2 (the drains of the transistors T1 and T3) and the negative-phase current outputs thereof (the drains of the transistors T2 and T4) are respectively connected to each other (whereby the differential output currents of the differential amplifiers 1 and 2 are added up). The sum of the positive-phase output currents of the differential amplifiers 1 and 2 is caused to flow through a load resistance RL1 one end of which is connected to a supply voltage VDD, thereby to be converted into a negative-phase output voltage Vo$^-$, while the sum of the negative-phase output currents thereof is caused to flow through a load resistance RL2 one end of which is connected to the supply voltage VDD, thereby to be converted into a positive-phase output voltage Vo$^+$.

The absorption current transistor T5 of the differential amplifier 1 and that T6 of the differential amplifier 2 have their sources connected to each other, and further to a constant current circuit Is being an absorption current circuit, whereby a third differential amplifier is configured.

In the above construction, Is×M (where M denotes a value "0" to "1") which is part of the constant current Is of the constant current circuit Is flows through the transistor T5, while Is (1−M) which is the remaining part of the constant current Is flows through the transistor T6. The allocation ratio M can be changed at will by a gain-control differential voltage Vgc which is applied across the inputs of the third differential amplifier (across the gates of the transistors T5 and T6).

Besides, in the above construction, the transfer conductance Gm1 of the differential amplifier 1 is determined by the absorption current flowing through the first differential pair. The transfer conductance Gm2 of the differential amplifier 2 is determined by the absorption current flowing through the second differential pair, and the source resistances Rs1 and Rs2. A gain which is attained from a differential input (the difference between the input voltages Vi$^+$ and Vi$^-$) to a differential output (the difference between the output voltages Vo$^+$ and Vo$^-$), is determined by a composite conductance Gm (=Gm1+Gm2) and the load resistances RL1 and RL2.

Letting I1 and I2 denote the currents which flow through the transistors T5 and T6, respectively, Gm(I1) denote the transfer conductance of the transistors T1 and T2 as is determined by the current I1, and Gm(I2) denote the transfer conductance of the transistors T3 and T4 as is determined by the current I2, the following relations hold:

$$Is=I1+I2(I1=Is\times M, I2=Is(1-M), 0<M<1)$$

$$Gm1=Gm(I1)/2$$

$$Gm2=1/(Rs1+Rs2+(2/Gm(I2)))$$

Accordingly, the transfer conductances Gm1 and Gm2 are appropriately changed by controlling the current allocation ratio M stated above, whereby the maximum gain can be attained when the constant current Is has flowed through the differential amplifier 1 (at M≅1), and the minimum gain when the constant current Is has flowed through the differential amplifier 2 (at M≅0). That is, the allocation ratio M between the currents to flow through the differential amplifiers 1 and 2 is controlled by the gain-control differential voltage Vgc, whereby the variable gain amplifier capable of attaining any desired gain between the maximum gain and the minimum gain can be realized.

The variable gain amplifier circuit in FIG. 2 performs an operation equivalent to that of the circuit in FIG. 1 in such a way that transistors T1-T4 and load resistances RL1-RL2 are made the same transistors T1-T4 and load resistances RL1-RL2 as in the circuit shown in FIG. 1, respectively, that a resistance Rs in FIG. 2 is set at the value (Rs=Rs1+Rs2) of the sum of the resistances Rs1 and Rs2 in FIG. 1, and that the sum of the sizes of transistors T6a and T6b in FIG. 2 is equalized to the size of the transistor T6 in FIG. 1 (T6a size =T6b size, T6 size=T6a size+T6b size).

In the variable gain amplifier circuit shown in FIG. 3, a first differential pair is constituted by transistors T1 and T2 to which differential input voltages Vi$^+$ and Vi$^-$ are respectively inputted, and a second differential pair is constituted by transistors T3 and T4 to which the differential input voltages Vi$^+$ and Vi$^-$ are not inputted. The allocation between an absorption current to flow through the first differential pair and an absorption current to flow through the second differential pair is changed by changing the potential differential between a DC bias VB (FIG. 4 exemplifies an equivalent circuit therefor, in which either a resistance R or a choke coil L is sometimes omitted) connected to a differential input and a gain control voltage Vgc, so as to change the transfer conductance Gm1 of the first differential pair which is pertinent to amplification. Thus, a gain which is attained from the differential input (the difference between the voltages Vi$^+$ and Vi$^-$) to a differential output (the difference between voltages Vo$^+$ and Vo$^-$) is changed. Incidentally, the second differential pair constituted by the transistors T3 and T4 functions to hold the DC bias of the output voltages Vo$^+$ and Vo$^-$ constant without changing them.

The DC bias VB is sometimes included in the differential input voltages Vi$^+$ and Vi$^-$.

Although FIGS. 1-3 show the examples each of which is constructed of the transistors of MOS type, such a variable gain amplifier can also be constructed of field effect transistors of junction type or transistors of bipolar type.

In Japan, Communications Research Laboratory is incessantly transmitting standard radio waves serving as frequency standards, at 40 kHz from a transmitting station located in Fukushima Prefecture and at 60 kHz from a transmitting station located in Saga Prefecture.

Time information (Japan Standard Time) based on an AM-modulated signal is superposed on each of the standard radio waves. The standard radio wave is received, and a time code is restored and interpreted, whereby a time can be known at an accuracy which corresponds to the degree of a delay time (several mess) involved from the transmission of the radio wave till the arrival thereof.

When the function of correcting a time by employing the time information is bestowed on a timepiece, the timepiece in which the above time accuracy is always kept can be realized as a so-called "radio timepiece".

The image of the standard radio waves is shown in FIG. 5. Each of the standard radio waves in Japan is the AM-modulated signal which has the above transmission frequency as a carrier, and which consists only of two amplitude states of a large amplitude of 1 and a small amplitude of 0.1 (modulation percentage: 90%). The standard radio wave has a transmission speed of 1 (one) bit/sec. When one bit length consists of the large amplitude state for 200 msec and the small amplitude state for the remaining 800 msec, a code "M" (mark signal) is expressed; when it consists of the large amplitude state for 800 msec and the small amplitude state for the remaining 200 msec, a code "0" is expressed; and when it consists of the large amplitude state for 500 msec and the small amplitude state for the remaining 500 msec, a code "1" is expressed. The time code is formed by combining the three statuses.

The time code is a code train having a length of 60 bits as a unit, which begins with the "M" code, in which the information items of minutes, o'clock, days summed up since New Year's Day, the dominical year, and a day of the week are delimited by the "M" codes, and which ends in the "M" code. Accordingly, the delimitation and head positions of time codes can be respectively identified by detecting the positions of "M" code successions. (the tail of the preceding code train and the head of the next code train).

In the circuit of the RF reception portion of the radio timepiece as shown in FIG. 6, a bar antenna L and a tuning capacitor C are tuned to the standard radio wave so as to selectively receive this standard wave and to input it to a preamplifier PA. A bias circuit VB (the equivalent circuit example of which is shown in FIG. 4) feeds an input bias to the preamplifier PA.

A variable gain amplifier GCA receives the output of the preamplifier PA as its input Vi, and amplifies the input Vi at a gain complying with a control from a gain control terminal.

A band-pass filter BPF removes a low-frequency component and a high-frequency component which are noise components outside the necessary bandwidth of the output of the variable gain amplifier GCA.

A peak detection circuit PDet which is constituted by a first rectification circuit Rec1, a first peak holding capacitor C1 and a first discharge resistance R1, detects the peak value of the output Vo of the band-pass filter BPF so as to output a peak value voltage Vp.

A gain control amplifier DA feeds the gain control terminal of the variable gain amplifier GCA with a DC voltage for lowering the gain of the variable gain amplifier GCA, in a case where the output Vp of the peak detection circuit PDet is larger than a first reference voltage VR1, and with a DC voltage for heightening the gain, in a case where the former is smaller than the latter. Thus, a control (negative feedback control) is performed so that the potential difference between the output Vp of the peak detection circuit PDet and the first reference voltage VR1 may become substantially zero. As a result, the large amplitude side of the output amplitude Vo of the band-pass filter BPF becomes a substantially constant level.

A low-pass filter LPF which is insertively connected to the output of the gain control amplifier DA, is endowed with a time constant so as to prevent the gain control of the variable gain amplifier GCA from becoming unstable.

An envelope detection circuit SDet which is constituted by a second rectification circuit Rec2, a second peak holding capacitor C2 and a second discharge resistance R2, outputs a voltage which becomes the peak value envelope of the RF amplitude value of the output Vo of the band-pass filter BPF (as indicated by a broken-line waveform in FIG. 7).

A comparator Comp compares the output of the envelope detection circuit SDet with a second reference voltage VR2 (set at the intermediate value between the high and low voltages of the envelope detection output). It outputs a logic signal "H" in a case where the output of the envelope detection circuit SDet is larger than the second reference voltage VR2, and a logic signal "L" in a case where the former is smaller than the latter.

The time length of the logic signal "H" or "L" is identified by a microcomputer or the like not shown, thereby to identify which of the codes "M", "0" and "1" of the time code train. The microcomputer recognizes the current time by decoding the received time code, and it corrects and displays the time (as radio timepiece functions).

Since the timepiece may be set aright several times a day, a power source circuit Reg which controls power supply from an external power source VDD to the individual circuits in accordance with a control signal PON (for power ON/OFF, constant voltage supply, etc.) is disposed so as to avoid wasteful power dissipation.

In the example of FIG. 6, the band-pass filter BPF is sometimes omitted in a case where the output noise of the variable gain amplifier GCA is small. Besides, an appropriate buffer circuit which satisfies the terminating condition of the band-pass filter BPF and which can drive the first rectification circuit Rec1 as well as the second rectification circuit Rec2 is located between the band-pass filter BPF and the first rectification circuit Rec1 as well as the second rectification circuit Rec2. Further, the low-pass filter LPF is sometimes omitted in a case where the gain control amplifier DA includes an appropriate low-pass filter characteristic.

The radio timepiece requires AGC (auto gain control) which can cope with inputs in a wide range of approximately 1 μVrms -100 mVrms. In some cases, therefore, the reception preamplifier PA is also constructed as part of the variable gain amplifier GCA (as a control indicated by a broken line drawn to the reception preamplifier PA in FIG. 6).

In the ensuing description, a circuit which corresponds to a portion including the variable gain amplifier GCA, gain control amplifier DA and low-pass filter LPF in FIG. 6 will be sometimes expressed as a variable gain amplifier block GCAb, and a circuit which corresponds to a portion with the band-pass filter BPF added to the block GCAb will be sometimes expressed as a gain control amplifier block GCA-B. Further, a circuit which corresponds to a portion including the gain control amplifier block GCA-B and peak detection circuit PDet will be sometimes expressed as an auto gain control circuit AGC or an AGC circuit.

Since each standard radio wave to be received by the radio timepiece is of AM modulation scheme, a linearity is required of the amplification of the auto gain control circuit AGC.

Besides, since the number of the transmitting stations of the standard radio waves is small, places which range from positions underneath transmission antennae to positions at very long distances need to be capable of receiving the standard radio waves, and a wide AGC range is necessitated. It is accordingly desired to realize a variable gain amplifier in which the linearity is always ensured and the variable gain range of which is wide.

In each of the variable gain amplifiers shown in FIG. 1 and FIG. 2, the minimum gain which is determined by the transfer. conductances Gm(Is) of the transistors T1-T4 and the resistances Rs1 and Rs2 (or the combined resistance Rs) is existent, and a variable gain range becomes narrow unless the transfer conductances Gm(Is) of the transistors T1-T4 cannot be made sufficiently large as compared with the inverse number of the source resistance Rs. Besides, since the differential pairs based on the transistors T1-T4 and the differential pair of the transistors T5-T6 are serially connected between power source voltages, the minimum operating supply voltage cannot be made small, and hence, the variable gain amplifier is unsuited to a low supply voltage operation such as of battery drive (having a supply voltage of 1.5 V). It is accordingly desired to realize a variable gain amplifier which has a wide variable gain range and which can lower the minimum operating voltage.

The variable gain amplifier circuit in FIG. 3 includes only one differential pair between power source voltages, and is therefore suited to a low supply voltage operation. However, in a case where the input potential has increased and where the gain control voltage Vgc is heightened so as to lower the gain by an AGC operation, an output dynamic range and a linear input range narrow as the current through the differential pair (transistors T1 and T2) pertinent to the gain decreases (though the gain is lowered by the current decrease). Therefore, as the amplifier circuit enters a large input potential (low gain operation) region, the AGC operation shifts to a limit amplification operation, and the linearity worsens.

It is accordingly desired to realize a variable gain amplifier whose output dynamic range is kept even in the large input potential (low gain operation) region, and whose linear input range is expanded with increase in the input potential, so that the linearity can be always kept.

In case of the radio timepiece of wall clock type or the like, the direction of the timepiece changes depending upon the place of installation, and also the sense of the bar antenna of the reception portion changes. An antenna reception gain changes depending upon the sense of the bar antenna. With the single antenna as in the reception portion of the radio timepiece in FIG. 6, therefore, a situation can occur where a reception level is zero in a certain sense. It is accordingly desired to realize a bar antenna mounting method/reception method in which, even when the direction of the radio timepiece has changed, a predetermined reception level or above can be ensured.

In the case where the reception preamplifier PA is the differential input amplifier, the connection of the bias circuit (s) VB to both or either of differential input differentially amplifies a noise component generated by the bias circuit VB and degrades the S/N ratio (signal-to-noise ratio) of the reception portion. It is accordingly desired to realize a reception preamplifier in which the influence of noise generated by the bias circuit VB is suppressed to improve the S/N ratio of the reception portion and to afford a favorable minimum reception sensitivity characteristic.

Each standard radio wave conforms to the AM modulation scheme, and the information transmission thereof is as very slow as 1 bit/sec, so that an AGC scheme in which the ratio between the large and small amplitude levels is held correct for a long time is required. Therefore, it becomes necessary to enlarge the holding time constant of the peak detection circuit PDet or the time constant of the low-pass filter LPF. When the time constant is enlarged, a large time constant capacitance is necessitated, a time period since the start of reception till the stabilization of AGC becomes long, and an AGC follow-up speed in the case of a reception level fluctuation lowers.

It is accordingly desired to realize an AGC circuit which can attain such an AGC operation that the increase of the time constant capacitance can be suppressed to hold the ratio between the large and small amplitude levels correct for long, that the time period since the start of reception till the stabilization of the AGC is short, and that the follow-up speed in the case of the reception level fluctuation is high.

In peak-value envelope detection for the AM-modulated wave as employs a rectifier, a detection waveform rises fast and falls slowly as indicated by a broken-line waveform in FIG. 7, so that a pulse width precision for discriminating the time code degrades to lower a reception time accuracy. It is accordingly desired to realize a detection circuit which can produce an output precisely corresponding to a peak-value envelope.

SUMMARY OF THE INVENTION

The present invention provides a variable gain amplifier which enhances a linearity and which has a wide variable gain range, an AM-modulated signal reception circuit in which the noise of an input portion is reduced to improve the follow-up characteristic of an AGC circuit, and an AM-modulated signal detection circuit which produces an output precisely corresponding to a peak-value envelope.

In the variable gain amplifier of the present invention, in a differential input amplifier which is constructed including transistors T1 and T2 that constitute a differential pair, and a constant current circuit Is that operates as an absorption current circuit for the transistors T1 and T2 constituting the differential pair, a variable impedance is connected between sources of the respective transistors T1 and T2 constituting the differential pair, and a gain of the differential input amplifier is made variable by variably controlling a value of the variable impedance.

Besides, in the AM-modulated signal reception circuit of the present invention, in receiving an AM-modulated signal Vi in two states of a large amplitude state and a small amplitude state, and identifying the two states, there are comprised a gain control amplifier block (GCA-B) whose gain is controlled by a peak value voltage Vp from a peak value input terminal, and which amplifies the input AM-modulated signal Vi so as to deliver an output Vo; an envelope detection circuit (SDet) which detects an envelope of the amplification output Vo of the gain control amplifier block (GCA-B); a comparator circuit (Comp) which compares an output of the envelope detection circuit (SDet) and a reference voltage VR2 so as to output a logic signal TCO; and a peak detection circuit (PDet) which receives the output signal TCO of the comparator circuit (Comp) as a control input, which, when the control input is an "H" status (or "L" status), detects a peak value of the output Vo of the gain control amplifier block (GCA-B) so as to deliver the detection peak value Vp to the peak value input terminal of the control amplifier block (GCA-B), and which, when the output signal of the comparator circuit (Comp) has changed into the "L" status (or "H" status), holds the detection peak value Vp detected immediately before the change, so as to output the held detection peak value to the peak value input terminal.

Besides, in the AM-modulated signal detection circuit of the present invention, in receiving an AM-modulated signal Vi in two states of a large amplitude state and a small amplitude state, and identifying the two states, there are comprised a timing extraction unit which extracts a carrier frequency component from an output signal Vo of an AGC circuit that controls and amplifies the received AM-modulated signal to a predetermined amplitude value, and which outputs a clock pulse CL that is timed to a peak position of an amplitude of an output signal Vo of the AGC circuit; a clock generation unit to which the clock pulse CL is inputted so as to output a sampling clock pulse SCL timed to the peak position; a reference voltage setting unit which outputs a comparison reference voltage VR2; and a sampling comparison-and-holding unit which samples, and compares the output Vo of the AGC, circuit and the comparison reference voltage VR2 so as to output a comparison result signal TCO when the sampling clock pulse SCL is inputted, and which holds the sampled and compared voltages until the next sampling clock pulse SCL is inputted.

DESCRIPTION OF THE PREFERRED EMBODIMENTS

Now, embodiments of the present invention will be described in detail with reference to the drawings.

First Embodiment

Figure 8:
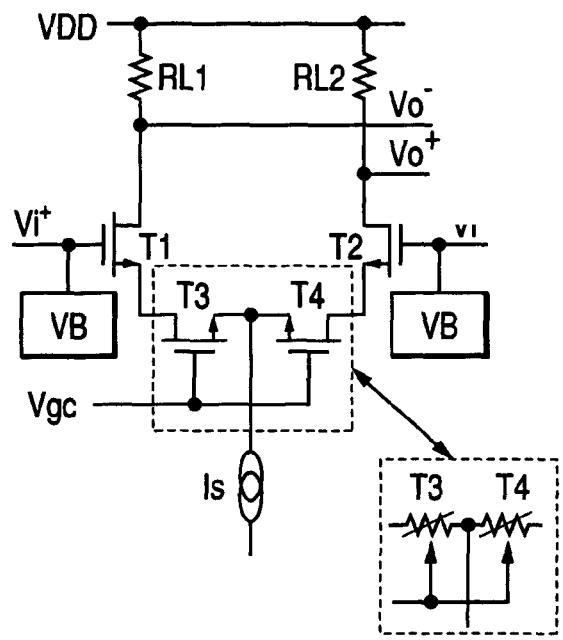
FIG. 8-FIG. 10 are circuit diagrams of variable gain amplifiers in the first embodiment of the present invention.
Figure 9:
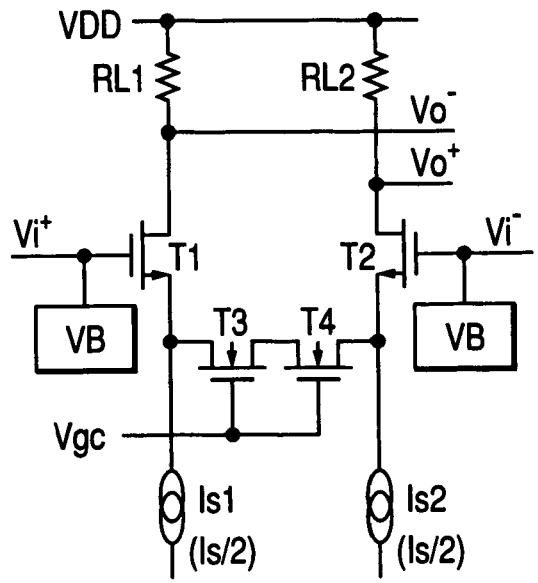
Figure 10:
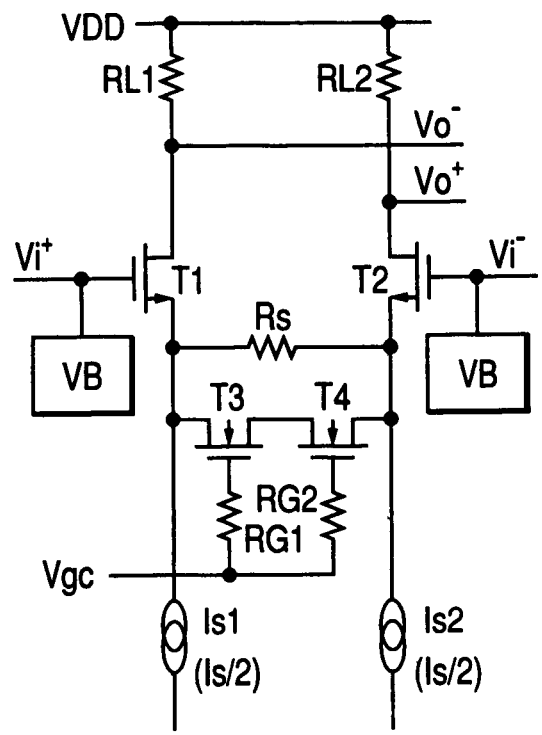

FIGS. 8-10 are circuit diagrams of variable gain amplifier circuits in the first embodiment of the present invention. The variable gain amplifier circuit in FIG. 8 includes a differential amplifier. The differential amplifier is so constructed that the gates of transistors T1 and T2 forming a differential pair are respectively connected to inputs $Vi^+$ and $Vi^-$ (with a bias VB), that an absorption current circuit Is is connected to the sources of the transistors T1 and T2, and that load resistances RL1 and RL2 each having one end connected to a supply voltage VDD are respectively connected to the drains of the transistors T1 and T2. Besides, the drains and sources of transistors T3 and T4 are insertively connected between the sources of the respective transistors T1 and T2 of the differential pair and the absorption current circuit Is, and a gain control voltage Vgc is connected to the gates of the transistors T3 and T4.

The gate configurations of the transistors T1 and T2 and those T3 and T4 are set so that the MOS transistors T1 and T2 may operate in a saturation region, and that the MOS transistors T3 and T4 may operate in a linear region (short-channel MOSs difficult of saturation are desirable as them).

Owing to such setting of the gate configurations, the MOS transistors T1 and T2 operate as the active amplification elements of the differential amplifier, and the MOS transistors T3 and T4 operate as negative feedback resistances connected to the sources of the MOS transistors T1 and T2 (as indicated by broken lines in FIG. 8).

The transfer conductance Gm1 and gate-source voltage VGS1 of each of the MOS transistors T1 and T2 are determined by the configuration of each transistor itself and a bias current (½ of an absorption current Is) flowing through itself. The source potential of each transistor is calculated by subtracting the gate-source voltage VGS1 from the gate bias voltage VB, and it becomes a fixed voltage Vs1:

$$Vs1 = VB - VGS1$$

On the other hand, the MOS transistors T3 and T4 operate in the linear region, that is, as variable resistance elements Rs3 and Rs4 (usually, Rs3=Rs4), respectively, owing to such setting of their gate sizes that their drain-source potential differences become substantially zero. The resistance value Rs3 of each transistor is determined by the configuration of itself and a voltage VGS3 applied between the gate and source of itself. The gate-source voltage VGS3 becomes a value obtained by subtracting the fixed voltage Vs1 from the gain control voltage Vgc:

$$VGS3 = Vgc - Vs1 = Vgc - (VB - VGS1) = Vgc - VB + VGS1$$

Accordingly, the gate-source voltage VGS3 of each of the transistors T3 and T4 can be changed by changing the gain control voltage Vgc (or the gate bias voltage VB), with the result that the resistances Rs3 and Rs4 of the respective transistors T3 and T4 can be changed.

After all, the transfer conductance Gm and differential voltage gain A of the differential circuit in which all the transistors T1-T4 are included become:

$$Gm = 1/(Rs3 + Rs4 + 2/Gm1)$$

$$A = Gm \times (RL1 + RL2) = (RL1 + RL2)/(Rs3 + Rs4 + 2/Gm1)$$

Thus, the transfer conductance Gm and the differential voltage gain A can be changed by changing the gain control voltage Vgc (or the gate bias voltage VB), and the differential circuit operates as the variable gain amplifier.

The variable gain amplifier circuit in FIG. 9 is so constructed that the absorption current circuit Is in the arrangement of FIG. 8 is divided in two (so as to have a current value of Is/2), and that the divisional absorption current circuits Is1 and Is2 are respectively connected to the sources of the transistors T1 and T2. Basically, it operates similarly to the variable gain amplifier circuit in FIG. 8. In the circuit in FIG. 9, bias currents do not flow through transistors T3 and T4, and hence, both ± voltage regions are usable as the source-drain linear operation region of each of these transistors. Therefore, the linearity of a variable impedance operation is good, and the linearity between inputs and outputs becomes favorable.

In each of the variable gain amplifier circuits shown in FIG. 8 and FIG. 9, when the gate-source voltage VGS3 of the transistors T3 and T4 is brought close to zero, the resistances Rs3 and Rs4 increase limitlessly, and the differential voltage gain A comes close to zero limitlessly. However, when a fixed resistance Rs is connected in parallel with the variable resistances constructed of the transistors T3 and T4, as shown in FIG. 10, the parallel combined resistance between the fixed resistance Rs and the transistors T3 and T4 does not become smaller than the fixed resistance value Rs, and hence, the variable gain amplifier of this construction comes to have the minimum gain. Even when the fixed resistance Rs is connected between the sources of the transistors T1 and T2 in FIG. 8, a similar effect is attained.

In a layout wherein variable gain amplifiers are connected in multiple stages in order to heighten a total gain and to widen a variable gain width, the input levels of the variable gain amplifiers are enlarged from the minimum level. In this case, the gains of the respective stages are not uniformly lowered, but they are lowered successively from the rearmost stage side, for the reason that the gain of the initial stage amplifier as greatly affect a noise characteristic when lowered can be ensured, so a signal-to-noise ratio is enhanced. Such a construction necessitates the variable gain amplifier having the minimum gain as shown in FIG. 10.

It has been described that the transistors T3 and T4 operate as the variable resistances. However, an actual MOS transistor has capacitance components between the gate and source thereof and the gate and drain thereof, and the capacitance components are connected in parallel with the variable resistance in the form in which they are combined (into a series-connected capacitance). There occurs high frequency peaking which has a peak at a frequency that is determined by the time constant between the capacitance and the variable resistance.

When gate resistances RG1 and RG2 are respectively connected to the gates of the transistors T3 and T4 as in the variable gain amplifier circuit shown in FIG. 10, the peaking effect ascribable to the combined capacitance between the gate and source and between the gate and drain can be relieved.

The transistors T3 and T4 in each of the variable gain amplifier circuits in FIG. 9 and FIG. 10 may well be replaced with a single transistor if the combined resistance values are equal. To the contrary, three or more transistors may well be connected in series or in parallel. The number of the transistors is appropriately selected and set considering the peaking effect ascribable to the combined capacitance between the gate and source and between the gate and drain, and so forth.

Although each of the examples of the variable gain amplifier circuits in FIG. 8-FIG. 10 is constructed of N-MOS elements, it may well be a construction employing PMOSs, a hybrid construction employing P-MOSs and N-MOSs, or a construction employing junction type field effect elements. Regarding the transistors T1 and T2, bipolar transistors may well be employed. Regarding the transistors T3 and T4, an N-MOS element and a P-MOS element may well be combined. Besides, when a short channel type transistor is employed, the minimum resistance value can be lowered, and a saturation characteristic is weakened or nullified, so that a region usable as the variable resistance is widened.

Figure 1:
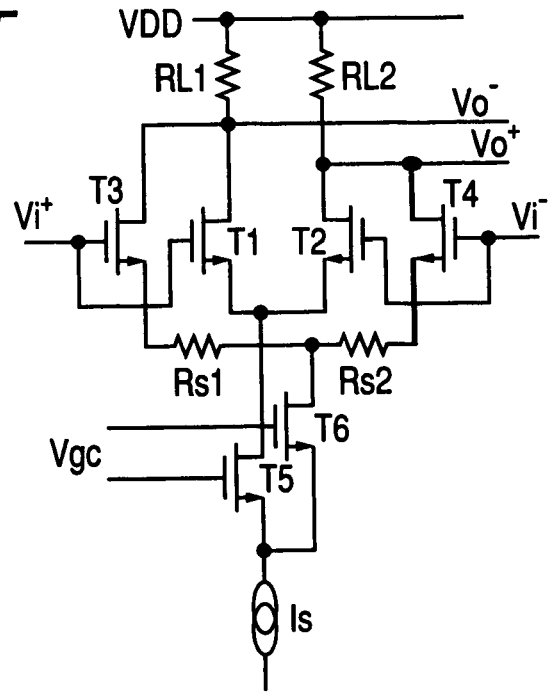
FIG. 1-FIG. 3 are circuit diagrams each showing a practicable example of a prior-art variable gain amplifier for AGC.
Figure 2:
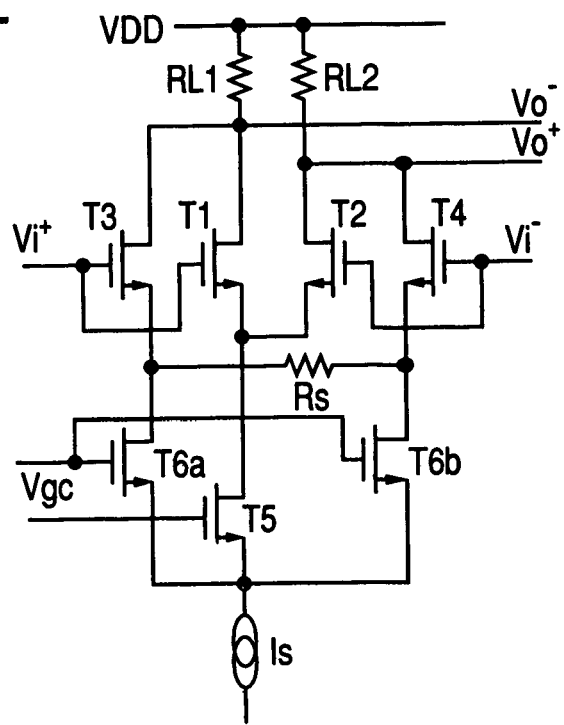

As thus far described, according to the first embodiment, the following advantages are brought forth:

(1) Since differential circuits are not vertically stacked between the supply voltage and the ground, the minimum operating supply voltage can be made lower than in the circuit arrangements shown in FIG. 1 and FIG. 2.

Figure 3:
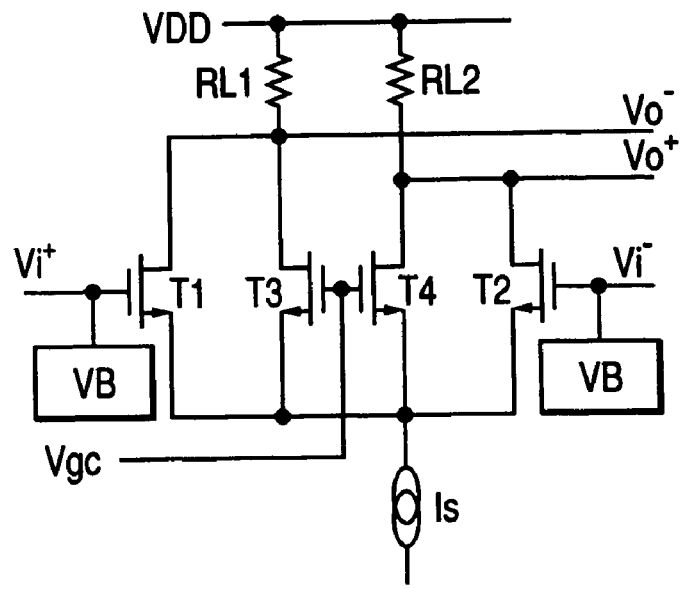
Figure 4:
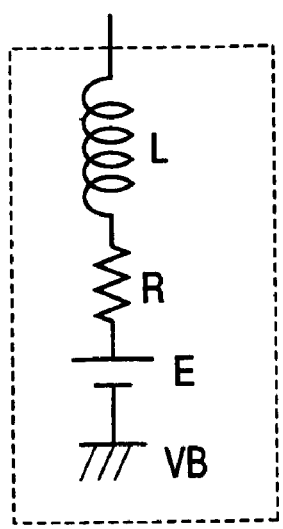
FIG. 4 is a diagram showing an example of a bias circuit.

(2) Owing to the construction in which all the absorption current (Is) is always caused to flow through the differential pair transistors (T1 and T2) performing the amplification operation, even when the gain is lowered as compared with that of the circuit arrangement in FIG. 3, the output dynamic range is constant and does not narrow.

(3) As the gain is lowered, the linear input range of input voltages becomes wider than in the circuit shown in FIG. 3.

(4) Within the output dynamic range which is determined by the absorption current Is and the load resistances RL1 and RL2, the linearity (uniformity in the relationship of magnitudes) between inputs and outputs is kept more than in the circuit shown in FIG. 3.

(5) It is possible to realize both a construction whose minimum gain becomes infinitesimal, and a construction which has the minimum gain being a fixed value.

Second Embodiment

FIGS. 11A-11D are circuit diagrams of AM-modulated signal reception circuits in the second embodiment of the present invention. The AM-modulated signal reception circuit in FIG. 11A includes a gain control amplifier block GCA-B which lowers its gain when an input voltage Vp from a peak value input terminal is larger than a built-in reference value, and heightens its gain when the former is smaller than the latter, and which amplifies an input AM-modulated signal Vi with the gain so as to deliver an output signal Vo. Also included is an envelope detection circuit SDet which detects the envelope of the output signal Vo of the gain control amplifier block GCA-B. A comparator. circuit Comp compares the output of the envelope detection circuit SDet and a reference voltage VR2 so as to output a comparison result signal TCO. A peak detection circuit PDet receives the output signal TCO of the comparator circuit Comp as a control input. When the output signal TCO of the comparator circuit Comp is an output signal corresponding to a large amplitude input state, the circuit PDet falls into a state where it detects the peak value of the output signal Vo of the gain control amplifier block GCA-B, and it outputs the detection peak value Vp to the peak value input terminal of the gain control amplifier block GCA-B. Besides, when the output signal TCO of the comparator circuit Comp has changed to an output signal corresponding to a small amplitude input state, the circuit PDet holds the detection peak value Vp detected immediately before the change, and it outputs the held detection peak value Vp to the peak value input terminal of the gain control amplifier block GCA-B.

Figure 6:
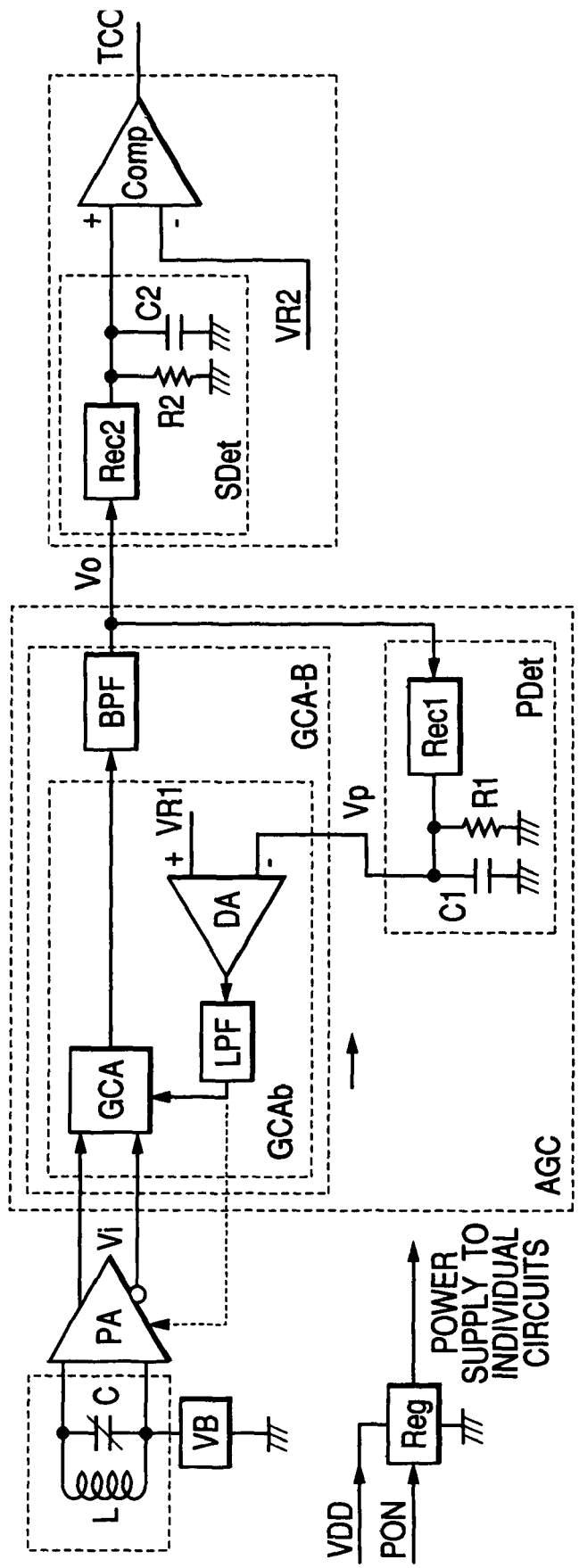
FIG. 6 is a circuit diagram showing the basic constructional example of the RF reception portion of a prior-art radio timepiece.

The input AM-modulated signal Vi mentioned above is generated by the bar antenna L, tuning capacitor C, preamplifier PA, etc. exemplified in FIG. 6. The constructions of the gain control amplifier block GCA-B and the envelope detection circuit SDet are the same as in FIG. 6.

Figure 11A:
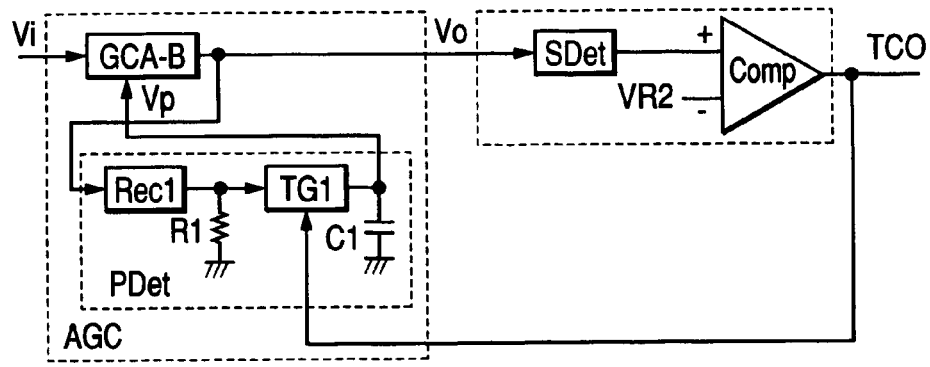
FIGS. 11A-11D are circuit diagrams of AM-modulated signal reception circuits in the second embodiment.

The peak detection circuit PDet in FIG. 11A is configured of a rectification circuit Rec1, a resistance R1 for a discharge path (or a constant current circuit I1), a transfer gate TG1, and a peak holding capacitance C1. The rectification circuit Rec1 rectifies the output signal Vo of the gain control amplifier block GCA-B. The resistance R1 is connected between the output of the rectification circuit Rec1 and the ground (or a supply voltage). The transfer gate TG1 has one end of its conduction terminal connected to the output of the rectification circuit Rec1, it receives the output signal TCO of the comparator circuit Comp as the control input, and it falls into a conductive state when the output signal TCO of the comparator circuit Comp is the output corresponding to the large amplitude input state, whereas it falls into a nonconductive state when the output signal TCO of the comparator circuit Comp has changed to the output corresponding to the small amplitude input state. The peak holding capacitance C1 has one end connected to the other end of the conduction terminal of the transfer gate TG1 and the peak value input terminal of the gain control amplifier block GCA-B, and has the other end connected to the ground (or the supply voltage).

Figure 11B:
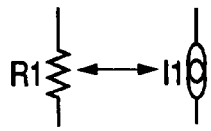

FIG. 11B shows the fact that the resistance R1 for the discharge path as shown in FIG. 11A can be replaced with the constant current circuit I1 for the discharge path.

As the AM-modulated signal Vi which the AM-modulated signal reception circuit in FIG. 11A receives, only the two states of the large amplitude state and the small amplitude state exist in a steady reception state. The output TCO of the comparator circuit Comp is set into an "H" status (or "L" status) when the large amplitude state is being received, and into the "L" status (or "H" status) when the small amplitude state is being received. The level of the AM-modulated signal Vi which is received, greatly fluctuates depending upon a distance from a transmitting station.

A concrete example of the AM-modulated signal Vi having only the two states of the large amplitude state and the small amplitude state is the standard radio wave which is transmitted by Communications Research Laboratory as stated in the description on the prior-art circuit.

In the circuit shown in FIG. 11A, when the output TCO of the comparator circuit Comp is in the "H" status (or "L" status), the transfer gate TG1 included in the peak detection circuit PDet becomes conductive, and hence, the peak detection circuit PDet operates as an ordinary peak detection circuit. Accordingly, the peak detection circuit PDet and the gain control amplifier block GCA-B operate as an ordinary AGC amplifier in association, so that the output amplitude Vo of the gain control amplifier block GCA-B is controlled to become constant.

When the output signal TCO of the comparator circuit Comp is in the "L" status (or "H" status), the transfer gate TG1 included in the peak detection circuit PDet becomes nonconductive, and hence, a fixed voltage which is based on charges accumulated in the peak holding capacitance C1 immediately before the transfer gate TG1 becomes nonconductive is delivered as the output Vp of the peak detection circuit PDet.

The output response of the peak detection circuit PDet in the case where the output amplitude of the gain control amplifier block GCA-B has enlarged in the prior-art circuit shown in FIG. 6, is a quick response which is based on the small time constant between the ON resistance (low resistance) of the rectification circuit Rec1 and the peak holding capacitance C1. However, the output response of the peak detection circuit PDet in the case where the output amplitude of the gain control amplifier block GCA-B has become small is a slow response which is ascribable to the large time constant between the resistance R1 (high resistance) for the discharge path and the peak holding capacitance C1.

In order to quicken the response in the case where the output amplitude of the gain control amplifier block GCA-B has become small, the time constant between the resistance R1 (high resistance) for the discharge path and the peak holding capacitance C1 may be made small. With this countermeasure, however, the output Vp of the peak detection circuit PDet becomes small rapidly during the reception of the small amplitude state of the AM-modulated wave, so that the gain of the gain control amplifier block GCA-B increases rapidly. Accordingly, in a case where the reception time period of the small amplitude state is long (as in the case of the code "M" in FIG. 5), also the output signal Vo of the gain control amplifier block GCA-B increases on and on rapidly, the output of the envelope detection circuit SDet comes to exceed the reference voltage VR2 (the threshold voltage of the comparator Comp) in spite of the small amplitude input state, and the output signal TCO of the comparator Comp is inverted into the "H" status (or "L" status) corresponding to the large amplitude input state, resulting in a malfunction.

In order to prevent such a malfunction, the holding time constant between the resistance R1 for the discharge path and the peak holding capacitance C1 in the circuit shown in FIG. 6 needs to be set at a large time constant as corresponds to several bits.

Since the time code superposed on the standard radio wave is as very slow as 1 bit/sec, even a time period corresponding to several bits is very long.

According to the circuit in FIG. 11A, since the accumulated charges of the peak holding capacitance C1 are null at the closure of power supply, the gain control amplifier block GCA-B starts the reception in the state of the maximum gain, and the output amplitude Vo of this gain control amplifier block GCA-B begins with a level greater than the amplitude of an AGC stable state without fail. Consequently, the detection output signal obtained by detecting this output becomes larger than the reference voltage VR2 without fail. Therefore, the output signal TCO of the comparator Comp becomes the "H" status (or "L" status) corresponding to the large amplitude input state, the transfer gate TG1 becomes conductive, the peak holding capacitance C1 is rapidly charged conjointly with the fact that the output amplitude Vo of the gain control amplifier block GCA-B is large, and the control voltage Vp of the gain control amplifier block GCA-B rises rapidly. Thus, the gain lowers rapidly, and the AGC stable state is reached at high speed.

When the input Vi has become the small amplitude input state, the detection output becomes smaller than the reference voltage VR2, and the output signal TCO of the comparator Comp becomes the "L" status (or "H" status). Consequently, the transfer gate TG1 becomes nonconductive, the charge and discharge of the peak holding capacitance C1 are stopped, the control voltage Vp of the gain control amplifier block GCA-B becomes a fixed value, and the gain control amplifier block GCA-B comes to perform a fixed gain operation. Thus, the reception circuit in FIG. 11A can perform a small amplitude reception operation which is stable irrespective of the length of the duration of the small amplitude input state.

When the reception circuit has become the large amplitude reception state again, the detection output signal of the envelope detection circuit SDet becomes larger than the reference voltage VR2, the output signal TCO of the comparator Comp is restored into the "H" status (or "L" status), and the transfer gate TG1 is restored into the conductive state, so that the gain control amplifier block GCA-B resumes the ordinary AGC operation which adjusts the output amplitude to the constant value. Thenceforth, the above operation is continued.

Since the charge and discharge of the peak holding capacitance C1 are stopped in the small amplitude input state, the stable AGC operation can be performed even when the holding time constant between the resistance R1 for the discharge path and the peak holding capacitance C1 is made small.

When this time constant is made small, a time period in which the AGC stable state in the reception mode is reached since the turn-ON of the power supply can be shortened. Moreover, reception level fluctuations due to phading, etc. are quickly responded to, and the amplitude of the output signal Vo of the gain control amplifier block GCA-B is quickly stabilized.

In the circuit example shown in FIG. 11A, the resistance R1 is employed for the discharge path, but it may well be substituted by the constant current circuit I1 for the discharge path (not shown in the drawing).

Figure 11C:
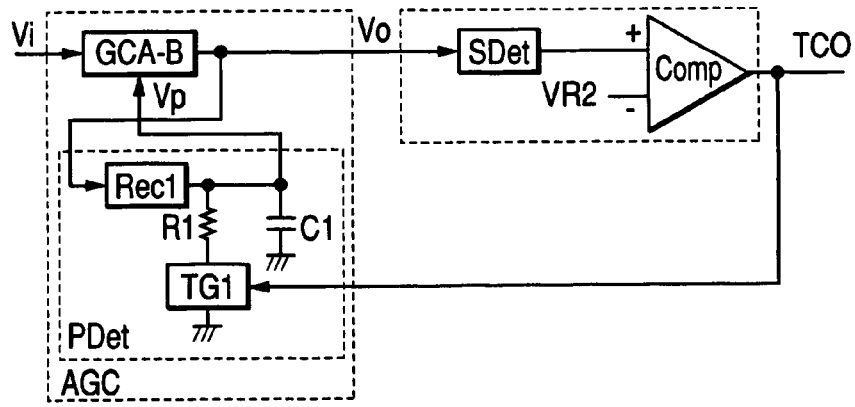

Besides, in the circuit example shown in FIG. 11A, the transfer gate TG1 is employed for turning ON/OFF the charge and discharge operations of the peak holding capacitance C1. In FIG. 11C, however, the same advantage as in FIG. 11A is attained in such a way that a transfer gate TG1 which turns ON/OFF a discharge current to flow through a resistance R1 for a discharge path is arranged so as to stop the discharge of the peak holding capacitance C1 in the small amplitude input state.

Figure 11D:
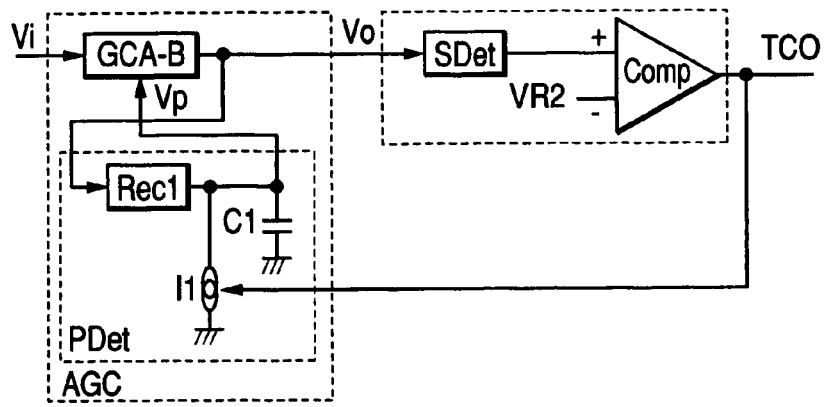

Further, in FIG. 11D, the same advantage as in FIG. 11A is attained by a construction in which a discharge current I1 to flow through a constant current circuit I1 for a discharge path is turned ON/OFF.

When the transfer gate is configured by combining transistors of N-channel type and P-channel type, the fluctuation of the stored charges of the peak holding capacitance C1 (leading to the fluctuation of the voltage Vp) attributed to the charge and discharge of gate-channel capacitances can be relieved at the turn-ON/OFF of this transfer gate.

As thus far described, according to the second embodiment, the following advantages are brought forth:

(1) The duration of the small amplitude input state need not be considered in determining the holding time constant for the AGC as is determined by the resistance R1 for the discharge path (or the constant current I1 of the constant current circuit I1) and the peak holding capacitance C1, so that the holding time constant can be made small, and the peak holding capacitance C1 can be made small.

(2) Since the holding time constant for the AGC can be made small, an AGC response in the large amplitude input state can be quickened.

(3) Owing to the advantage (2), the time period in which the AGC stable state in the reception mode is reached since the turn-ON of the power supply can be shortened, and the amplitude of the output Vo of the gain control amplifier block GCA-B is stabilized at a quick response to the reception level fluctuations ascribable to the phading, etc.

(4) Even in the case where the duration of the small amplitude input state is long, the phenomenon in which the gain of the gain control amplifier block GCA-B increases on and on does not develop, and the amplitude of the output signal Vo of the gain control amplifier block GCA-B can be held at the fixed amplitude, so that the malfunction of the output signal TCO of the comparator Comp does not occur even when the duration of the small amplitude input state is long.

(5) Even in the case where the duration of the small amplitude input state is long, the phenomenon in which the gain of the gain control amplifier block GCA-B increases on and on does not develop, and hence, the pulse width error of the output signal TCO of the comparator Comp becomes small.

Third Embodiment

FIGS. 12A-12E are circuit diagrams of AM-modulated signal reception circuits in the third embodiment of the present invention. The first construction of the AM-modulated signal reception circuit in the third embodiment is a construction (in FIG. 12A) in which, in the AM-modulated signal reception circuit in the second embodiment, a second resistance R3 (or constant current I3) for a discharge path for causing to flow a current smaller than that of the resistance R1 for the discharge path (or the constant current circuit I1 for the discharge path) is added to the peak holding capacitance C1 of the peak detection circuit PDet.

Figure 12A:
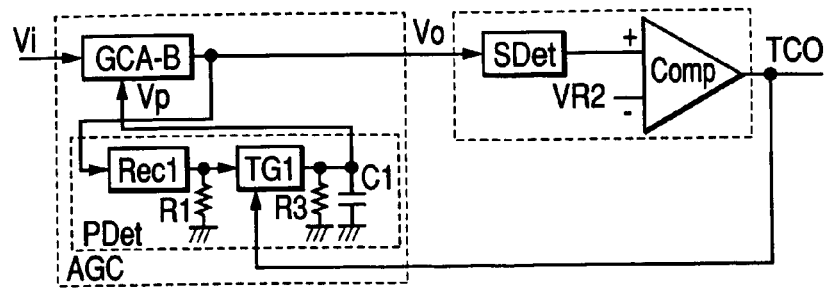
FIGS. 12A-12E are circuit diagrams of AM-modulated signal reception circuits in the third embodiment.
Figure 12B:
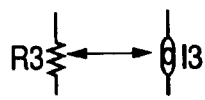

FIG. 12B shows the fact that the resistance R3 for the discharge path as shown in FIG. 12A can be replaced with the second constant current circuit I3 for the discharge path.

The second construction is a construction (in FIG. 12C) in which the turn-ON/OFF of the transfer gate TG1 is controlled through the OR synthesis between the output signal TCO of the comparator Comp and a control signal HS-AGC fed from a microcomputer or the like, not shown, that performs a timekeeping operation, etc. by receiving the output signal TCO of the comparator Comp.

The third construction is a construction (in FIG. 12D) in which the charges of the peak holding capacitance C1 are forcibly discharged by a control signal RESET fed from a microcomputer or the like, not shown, that performs a timekeeping operation, etc. by receiving the Comp output signal TCO.

The fourth construction is a construction (in FIG. 12E) which includes a timer circuit TM that outputs "0" as soon as the output signal TCO of the comparator Comp has changed into an output status corresponding to the large amplitude reception mode and that outputs "1" when a predetermined time period has lapsed since the change of the Comp output signal TCO into an output status corresponding to the small amplitude reception mode, and in which the turn-ON/OFF of the transfer gate TG1 is controlled by a signal obtained through the OR synthesis between the output of the timer circuit TM and the output signal TCO of the comparator Comp.

In the AM-modulated signal reception circuit shown in FIG. 11A, in a state where the AGC operation cannot follow up on account of, for example, the alteration of the direction of the radio timepiece during the small amplitude reception, the reception level might lower greatly to the extent that the output of the envelope detection circuit SDet during the large amplitude reception cannot exceed the reference voltage VR2. Then, the transfer gate TG1 is kept in the nonconductive state, the AGC operation fails to be attained persistently, the gain of the gain control amplifier block GCA-B is fixed, and the logic output TCO of the comparator Comp is fixed in the output status corresponding to the small amplitude reception mode.

In such a case, in the circuit shown in FIG. 12A, a minute current which flows through the second resistance R3 for the discharge path (or the second constant current circuit I3 for the discharge path) discharges the accumulated charges of the peak holding capacitance C1 to gradually increase the gain of the gain control amplifier block GCA-B and to restore this section to the normal AGC operation, so that the reception circuit is freed from the fixed state of the output signal TCO of the comparator Comp.

Figure 12C:
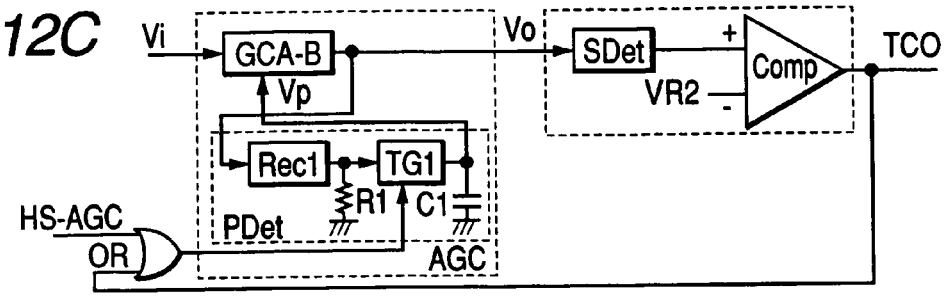

In the circuit shown in FIG. 12C, when the microcomputer or the like, not shown, judges that the logic output TCO of the comparator Comp has been fixed into the output status corresponding to the small amplitude reception mode, it outputs the control signal HS-AGC for forcibly turn ON the transfer gate TG1. The control signal HS-AGC passes through the OR synthesis unit to forcibly bring the transfer gate TG1 into the conductive state and to restore the normal AGC operation, so that the reception circuit is freed from the fixed state of the output signal TCO of the comparator Comp.

Figure 12D:
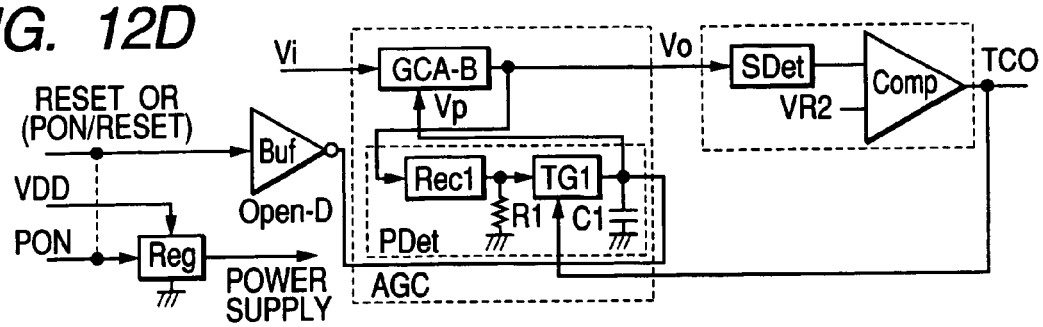

In the circuit shown in FIG. 12D, when the microcomputer or the like, not shown, judges that the logic output TCO of the comparator Comp has been fixed into the output status corresponding to the small amplitude reception mode, it outputs the control signal RESET for forcibly discharging the charges of the peak holding capacitance C1. The control signal RESET forcibly discharges the charges of the peak holding capacitance C1 to restore the gain control amplifier block GCA-B into the initial large gain state and to restore the normal AGC operation, so that the reception circuit is freed from the fixed state of the output signal TCO of the comparator Comp.

It is also allowed to adopt a construction in which the control terminal RESET is connected to the control terminal PON of the power source circuit Reg explained in the prior-art circuit in FIG. 6 (as indicated by a broken line in FIG. 12D), so as to form a PON/RESET terminal, and in which, when the power supply to the individual circuits is turned OFF (as controlled from the PON terminal), the charges of the peak holding capacitance C1 are forcibly discharged simultaneously (as controlled from the RESET terminal).

Figure 12E:
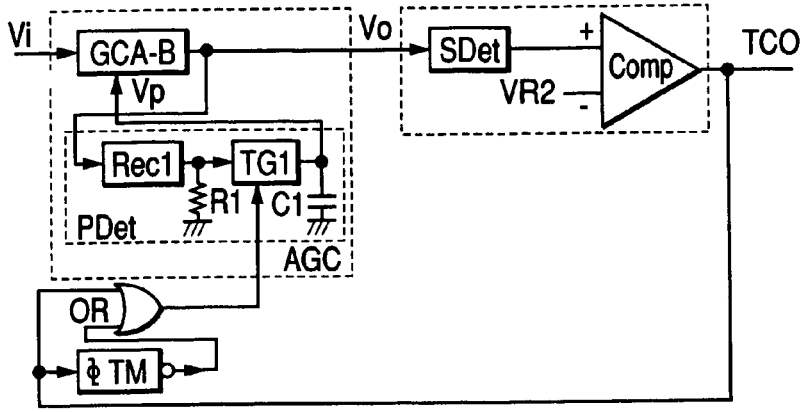

In the circuit shown in FIG. 12E, insofar as, after the output signal TCO of the comparator Comp has changed into the output status corresponding to the small amplitude reception mode, it changes into the output status corresponding to the large amplitude reception mode, within the predetermined time period (for example, within 1 sec), the output of the timer circuit TM continues a "0" status, and the result of the OR synthesis becomes the same as the output signal TCO of the comparator Comp. Thus, the same operation as that of the circuit in FIG. 11A is performed.

In a case where the output signal TCO of the comparator Comp does not become the output status corresponding to the large amplitude reception mode, even after the predetermined time period (that is, where the reception circuit has fallen into the faulty state as stated before), the output of the timer circuit TM is inverted into "1", and the "1" signal having passed through the OR synthesis unit forcibly turns ON the transfer gate TG1. Thus, the same AGC operation as in the prior-art circuit is performed, and the reception circuit is freed from the fixed state of the output signal TCO of the comparator Comp. Thereafter, until the output status corresponding to the large amplitude reception mode appears as the output signal TCO of the comparator Comp, the output of the timer circuit TM continues the "1" status, and the same AGC operation as in the prior-art circuit is continued. As soon as the output status corresponding to the large amplitude reception mode appears during the continuation of the same AGC operation as in the prior-art circuit, the output of the timer circuit TM becomes the "0" status, and the same operation as in FIG. 11A is restored.

Even when, in each of the circuits shown in FIGS. 12C-12E, the transfer gate TG1 and the resistance R1 for the discharge path are substituted as shown in each of FIGS. 11B-11D, the same advantage is attained. Besides, the circuit schemes in FIGS. 12A-12E may well be conjointly employed.

Figure 27:
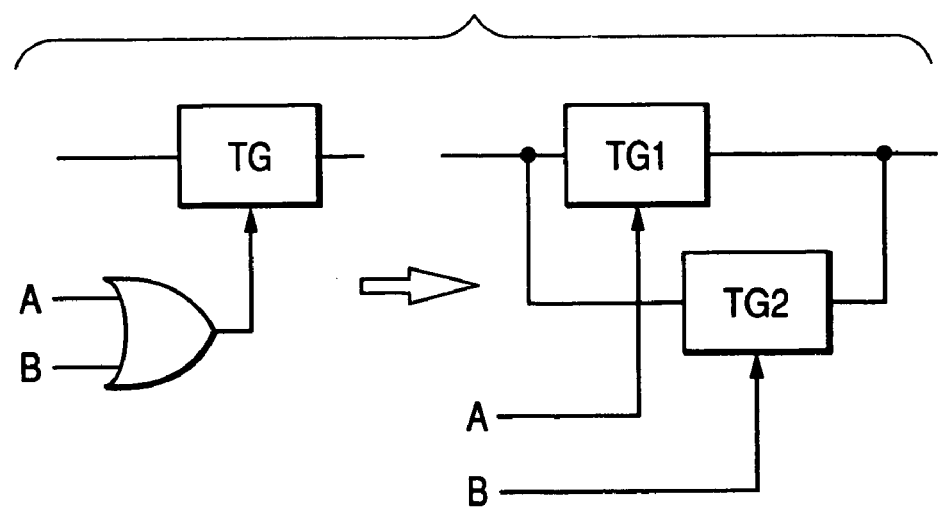
FIG. 27 is a circuit diagram showing an arrangement in which an OR circuit and a transfer gate TG1 in FIG. 12C or 12E in the third embodiment are replaced with a parallel circuit consisting of two transfer gates TG1 and TG2.

Incidentally, a circuit diagram in FIG. 27 shows a circuit example which indicates that the OR circuit and the transfer gate TG1 in FIG. 12C or 12E can be replaced with a parallel circuit consisting of two transfer gates TG1 and TG2.

Figure 30:
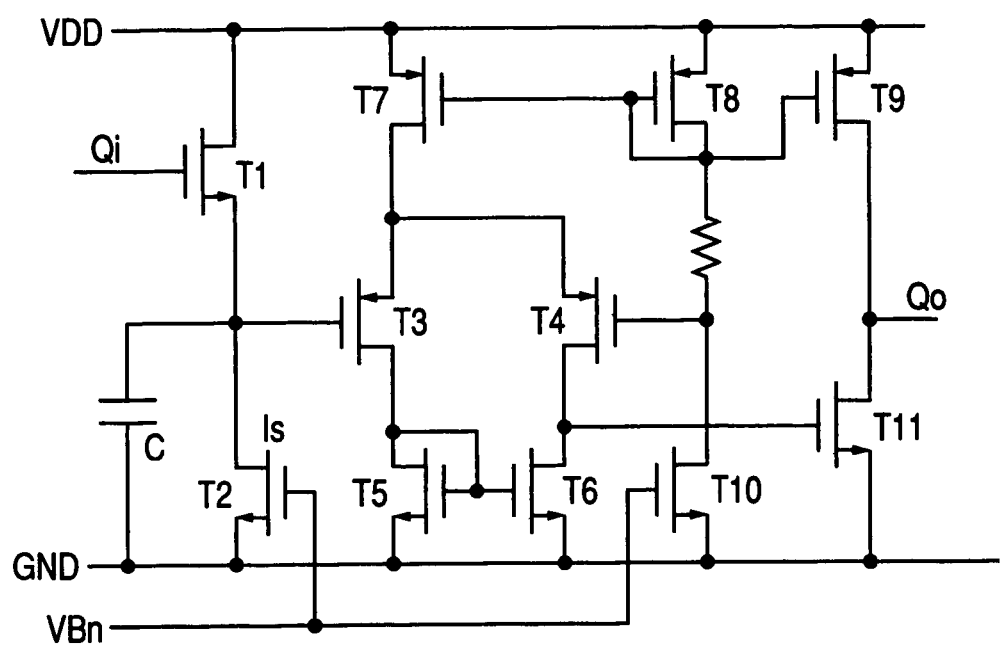
FIG. 30 is a circuit diagram of a timer circuit TM in FIG. 12E in the third embodiment.

Besides, a circuit diagram in FIG. 30 shows a practicable example of the timer circuit TM in FIG. 12E. When an input Qi in FIG. 30 has changed into "H", a capacitor C is rapidly charged by a transistor T1, and an output Qo rapidly changes into "L". When the input Qi has changed into "L", the transistor T1 turns OFF, the discharge of the charges of the capacitor C is started by the constant current Is of a constant current circuit, and the output Qo changes into "H" after a discharge time period (corresponding to the predetermined time period stated before). If the input Qi changes into "H" within the discharge time period (the predetermined time period), the capacitor C is rapidly charged by the transistor T1 again, so that the output Qo is kept at "L".

As thus far described, according to the third embodiment, in addition to the advantages of the second embodiment, the advantage is brought forth that, in the case (malfunctional state) where the reception level lowers during the reception in the state which the AGC operation cannot follow up and where the output signal TCO of the comparator Comp is fixed into the output status corresponding to the small amplitude reception mode, the reception circuit can be freed from the malfunctional state so as to resume the normal operation.

Fourth Embodiment

FIGS. 13A-13D are circuit diagrams of AM-modulated signal reception circuits in the fourth embodiment of the present invention. Each AM-modulated signal reception circuit in the fourth embodiment is so constructed that each AM-modulated signal reception circuit in the second or third embodiment is endowed with the function of forcibly stopping the charge and discharge operations of the peak holding capacitance C1 of the peak detection circuit PDet by an external control signal AGCH.

Figure 13A:
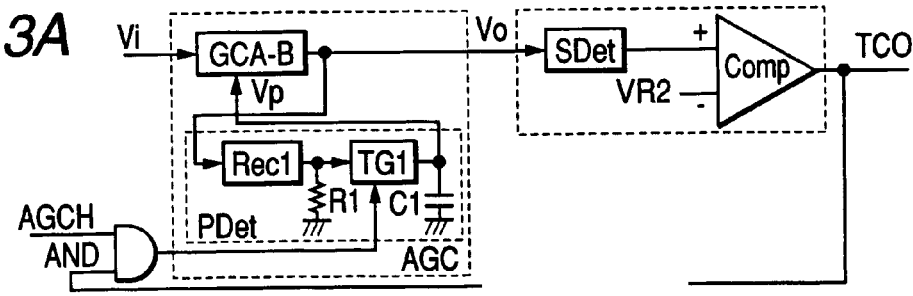
FIGS. 13A-13D are circuit diagrams of AM-modulated signal reception circuits in the fourth embodiment.

The AM-modulated signal reception circuit shown in FIG. 13A is an example in which, in the circuit shown in FIG. 11A in the second embodiment, the output signal TCO of the comparator Comp and the external control signal AGCH are subjected to AND synthesis, so as to control the transfer gate TG1 by the AND-synthesized signal.

Such a method in which the output signal TCO of the comparator Comp and the external control signal AGCH are subjected to AND synthesis, so as to control the transfer gate TG1 by the AND-synthesized signal, is also applicable to the circuit in FIG. 12D, and it is also applicable in conformity with the circuits in FIGS. 11B and 11D (though not shown).

Figure 13B:
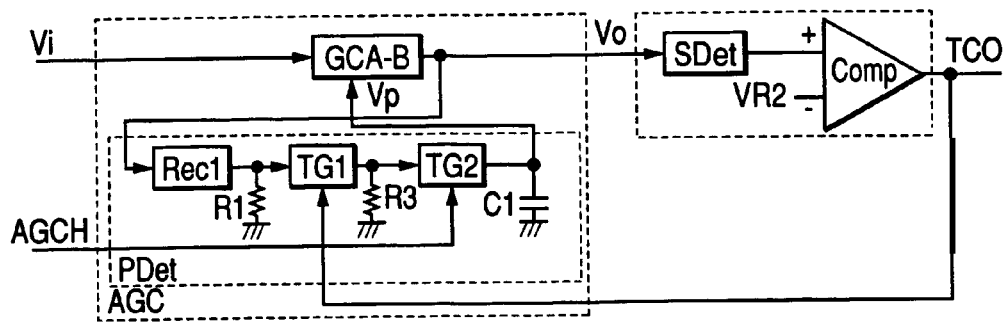

The AM-modulated signal reception circuit shown in FIG. 13B is an example in which, in the circuit shown in FIG. 12A in the third embodiment, a second transfer gate TG2 is inserted between the node of the transfer gate TG1 and second resistance R3 for the discharge path (or second constant current circuit I3 for the discharge path) and the terminal of the peak holding capacitance C1 affording the peak holding output, so as to control the turn-ON/OFF of the second transfer gate TG2 by the external control signal AGCH.

Figure 13C:
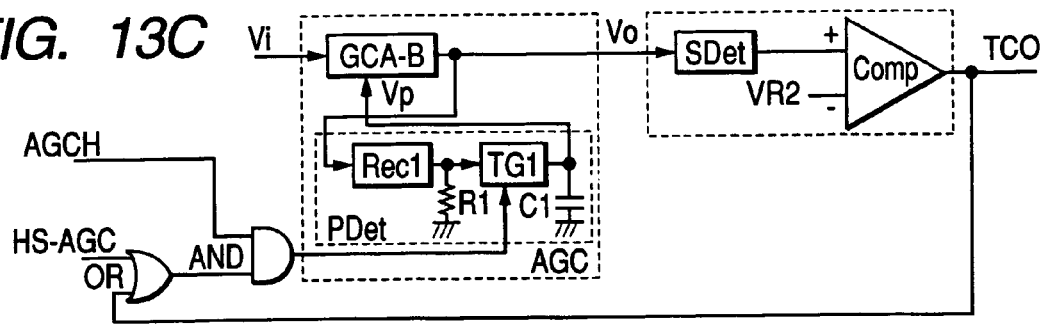

The AM-modulated signal reception circuit shown in FIG. 13C is an example in which, in the circuit shown in FIG. 12C in the third embodiment, the OR synthesis output between the output signal TCO of the comparator Comp and the external control signal HS-AGC stated before is subjected to AND synthesis with the external control signal AGCH, so as to control the transfer gate TG1 by the AND synthesis output.

It is similarly applicable to substitute the external control signal HS-AGC in FIG. 13C by the timer circuit TM shown in FIG. 12E.

Figure 28:
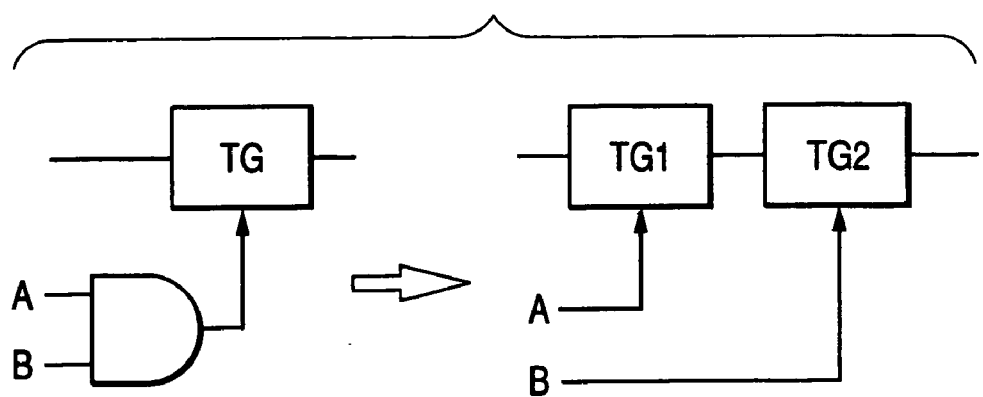
FIG. 28 is a circuit diagram showing an arrangement in which an AND circuit and a transfer gate TG1 in FIG. 13A or 13C in the fourth embodiment are replaced with a series circuit consisting of two transfer gates TG1 and TG2.

Incidentally, a circuit shown in FIG. 28 is a circuit example which indicates that the AND circuit and the transfer gate TG1 in FIG. 13A or 13C can be replaced with a series circuit consisting of two transfer gates TG1 and TG2.

Figure 29:
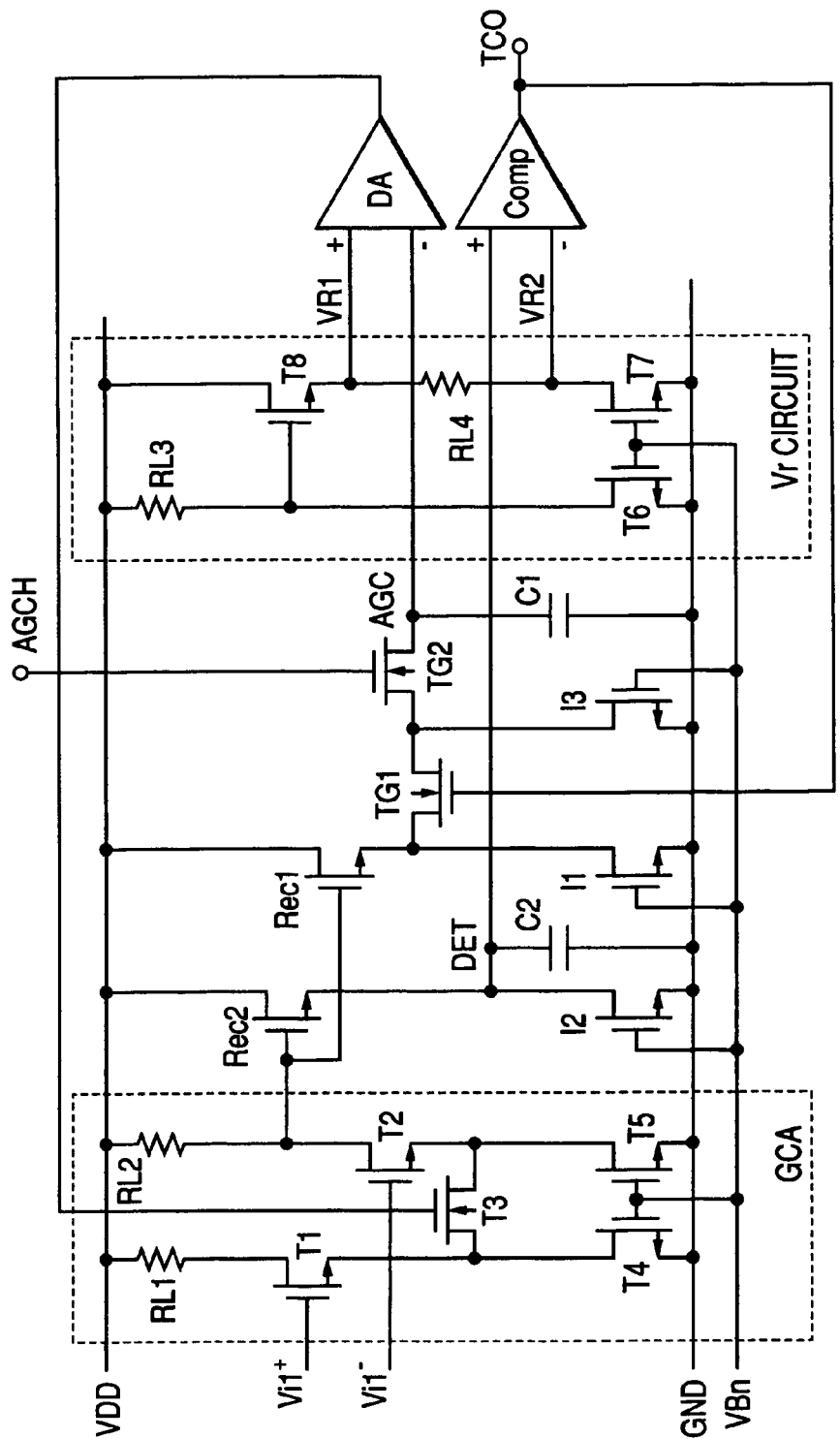
FIG. 29 is a circuit diagram showing the details of a circuit in FIG. 13B in the fourth embodiment.

Besides, FIG. 29 is a detailed circuit diagram corresponding to FIG. 13B. A variable gain amplifier GCA (an example of single-stage construction) and a gain control amplifier DA in FIG. 29 constitute the gain control amplifier block GCA-B in FIG. 13B.

While the external control signal AGCH is in the "L" status, the transfer gate TG1 or the second transfer gate TG2 is nonconductive in the circuit shown in FIG. 13A or 13C or in the circuit shown in FIG. 13B, and the charge/discharge path of the peak holding capacitance C1 is in a cutoff state, whereby the gain control amplifier block GCA-B can perform the fixed gain operation.

In a radio timepiece wherein the hand indications of o'clock, minutes and seconds are driven by stepping motors or the likes, large noise might develop at the drive. When the noise is superposed on the AM-modulated signal amplification path of that circuit in the second or third embodiment in which the AGC response rate is improved by making small the peak holding capacitance C1 for the AGC operation, there can take place a situation where the quantity of charges stored in the peak holding capacitance C1 becomes abnormal to abnormalize the output amplitude of the gain control amplifier block GCA-B.

The developing timing of such noise can be predicted. Therefore, when the external control signal AGCH is set at "L" at this timing, the stored charge quantity of the peak holding capacitance C1 can be prevented from becoming abnormal, and the output amplitude of the gain control amplifier section GCA-B can be held normal.

Figure 13D:
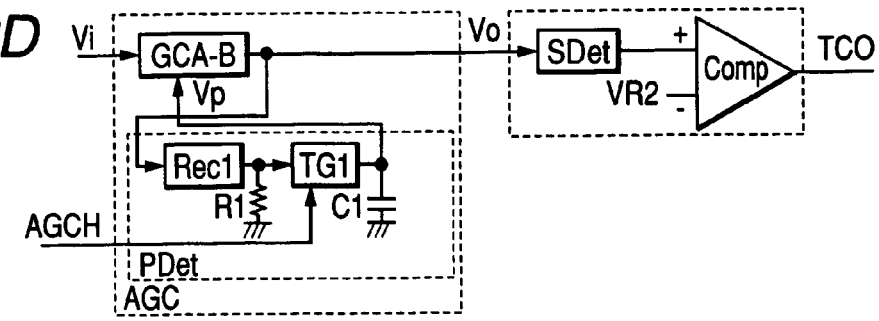

In the second-fourth embodiments, there have been indicated the examples in each of which the transfer gate TG1 or the second transfer gate TG2 is controlled in hardware fashion. However, if a microcomputer or the like (not shown) which performs a timekeeping operation, etc. by receiving the output signal TCO of the comparator Comp has a sufficient operating speed, all the controls of the AM-modulated signal reception circuit may well be performed by the microcomputer or the like in, for example, such a way that, when the output signal TCO of the comparator Comp is the output corresponding to the small amplitude reception mode, the transfer gate TG1 is rendered conductive by using the control signal AGCH fed from the microcomputer or the like. The AM-modulated signal reception circuit in FIG. 13D shows such an example.

As thus far described, according to the fourth embodiment, in addition to the advantages of the second and third embodiments, the advantage is brought forth that the noise which has a large amplitude, but whose developing timing is predictable, such as the noise which develops at the drive of the stepping motors for the hand indications of o'clock, minutes and seconds, can be relieved from influencing the AGC.

Fifth Embodiment

Figure 14A:
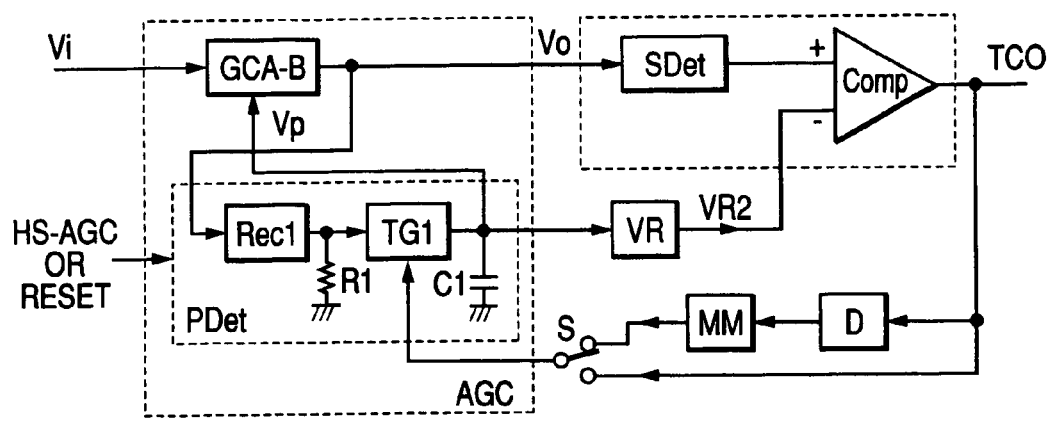
FIGS. 14A and 14B are circuit diagrams of AM-modulated signal reception circuits in the fifth embodiment.
Figure 14B:
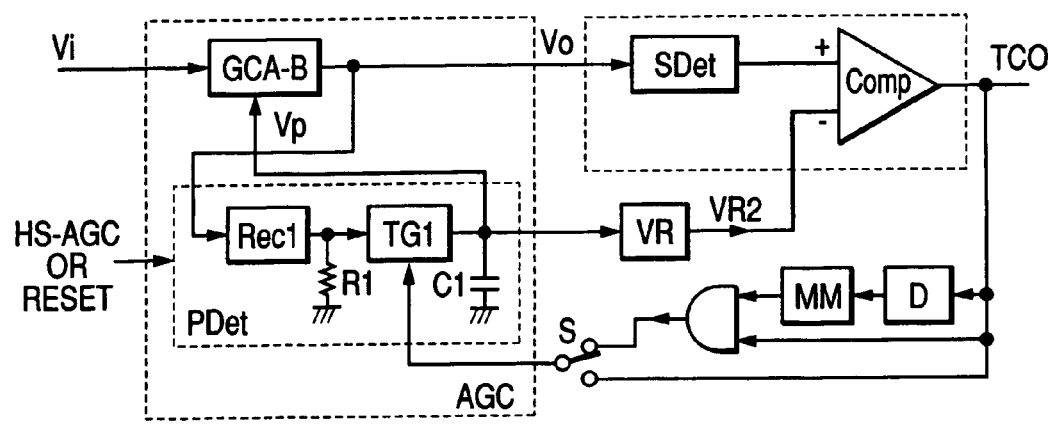

FIGS. 14A and 14B are circuit diagrams of AM-modulated signal reception circuits in the fifth embodiment of the present invention. The AM-modulated signal reception circuit in the fifth embodiment as shown in FIG. 14A is constructed by additionally furnishing any of the AM-modulated signal reception circuits in the second-fourth embodiments with a delay circuit D which delays the output signal TCO of the comparator Comp, a monostable multivibrator MM which outputs a pulse of predetermined time width on the basis of the output signal of the delay circuit D, and a changeover switch S which changes-over the output of the monostable multivibrator MM and the output signal TCO of the comparator Comp so as to feed the control signal of the transfer gate TG1.

The AM-modulated signal reception circuit in the fifth embodiment as shown in FIG. 14B is constructed by additionally furnishing any of the AM-modulated signal reception circuits in the second-fourth embodiments with a delay circuit D which delays the output signal TCO of the comparator Comp, a monostable multivibrator MM which outputs a pulse of predetermined time width on the basis of the output signal of the delay circuit D, an AND circuit which subjects the output of the monostable multivibrator MM and the output signal TCO of the comparator Comp to AND processing, and a changeover switch S which changes-over the output of the AND circuit and the output signal TCO of the comparator Comp so as to feed the control signal of the transfer gate TG1.

The circuit in FIG. 14A indicates also the fact that the reference voltage VR2 can be generated from the output of the peak detection circuit PDet, but the independent reference voltage VR2 may well be employed as shown in FIG. 11A, etc. Besides, instead of the transfer gate TG1, the constant current circuit I1 for the discharge path through which the discharge current I1 flows may well be turned ON/OFF as in the example shown in FIG. 11D.

Each AM-modulated signal reception circuit in the fifth embodiment can perform an AGC method in addition to the AGC method in the second-fourth embodiments. More specifically, when a path which includes the delay circuit D and the monostable multivibrator MM is selected by the changeover switch S, the transfer gate TG1 (or the constant current I1 which can be turned ON/OFF) becomes the conductive state for the predetermined pulse width time set by the monostable multivibrator MM, after the delay time which the delay circuit D sets since the output TCO of the comparator Comp has changed to the output corresponding to the large amplitude input state. Consequently, the peak detection circuit PDet causes the gain control amplifier block GCA-B to perform the AGC operation while the conductive state of the transfer gate TG1 is kept. In contrast, in the other time zone, the peak detection circuit PDet holds the state detected immediately before the output change and fixes the gain of the gain control amplifier block GCA-B.

The delay circuit D serves to create the predetermined wait time, and it may well be incorporated into the monostable multivibrator MM. The changeover switch S serves to make the two AGC methods available, and it may well have another logical construction or a construction employing a plurality of transfer gates. The changeover control is performed by a microcomputer or the like which belongs to the AM-modulated signal reception circuit.

According to the circuit in FIG. 14A, idle reception is started by throwing the switch S onto the side on which the output signal TCO of the comparator Comp is directly used for the control of the transfer gate TG1. When it is permitted to confirm a state where the output signal TCO of the comparator Comp becomes alternating outputs of "H"/"L", regular reception is performed by changing-over the switch S to the path which includes the delay circuit D and the monostable multivibrator MM. Thus, it is possible to realize the reception in which the duration of the "H" output of the output signal TCO of the comparator Comp is precise (also the duration of the "L" output becomes precise).

The operation will be detailed below. In the AM-modulated signal reception circuit for the radio timepiece, a band-pass filter BPF having a narrow band of a bandwidth of 10 Hz or so is used in order to remove noise outside the bandwidth and to heighten a reception sensitivity on the minimum level side. Therefore, the envelope of the peak value of the output signal of the gain control amplifier block GCA-B exhibits a gentle change corresponding to the narrow band of the bandwidth of 10 Hz or so (a time period of about 100 msec is expended on the change).

Figure 36:
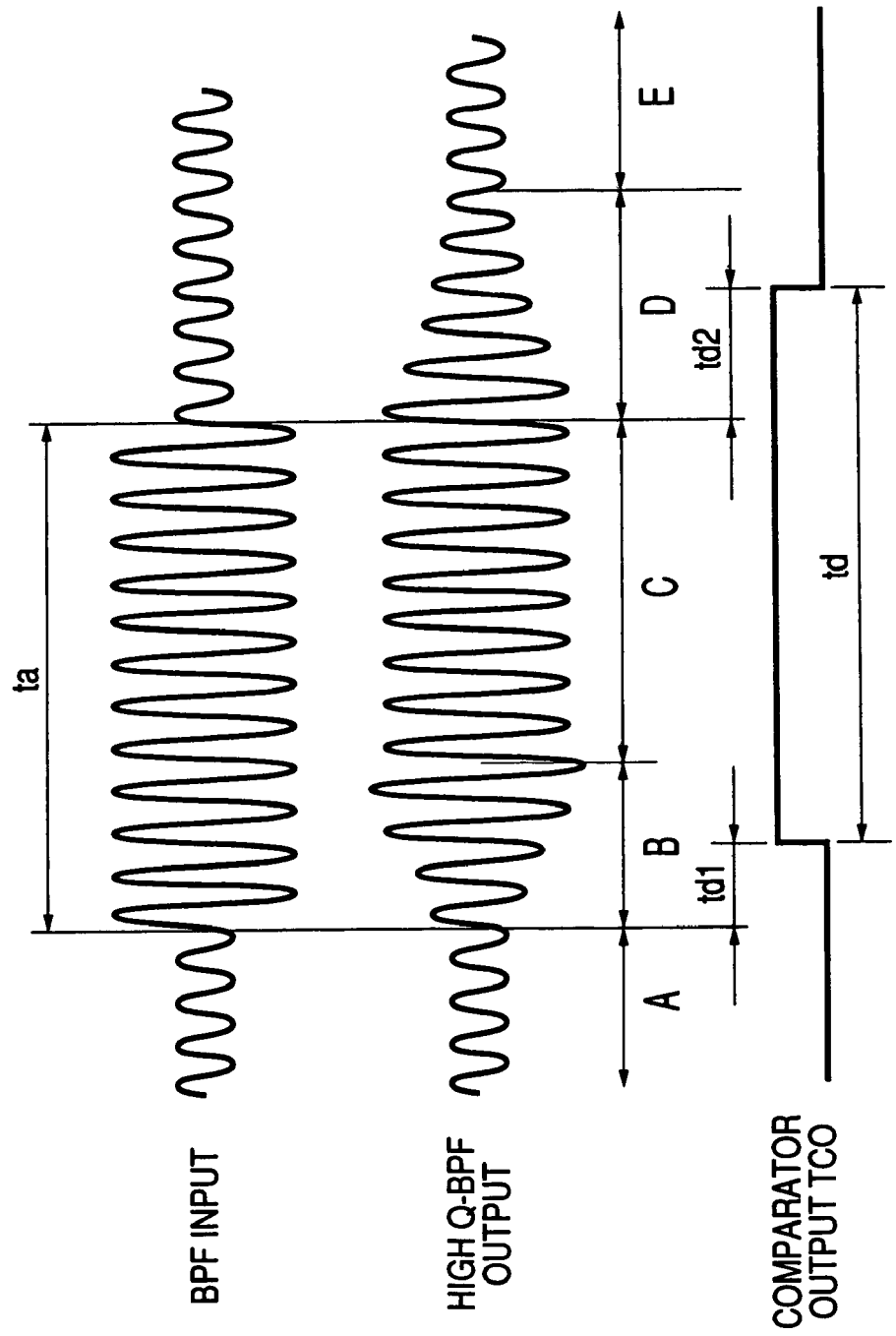
FIG. 36 is a diagram schematically showing waveform examples at the input and output of a band-pass filter BPF which is included in a gain control amplifier block GCA-B in the fifth embodiment.
Figure 37:
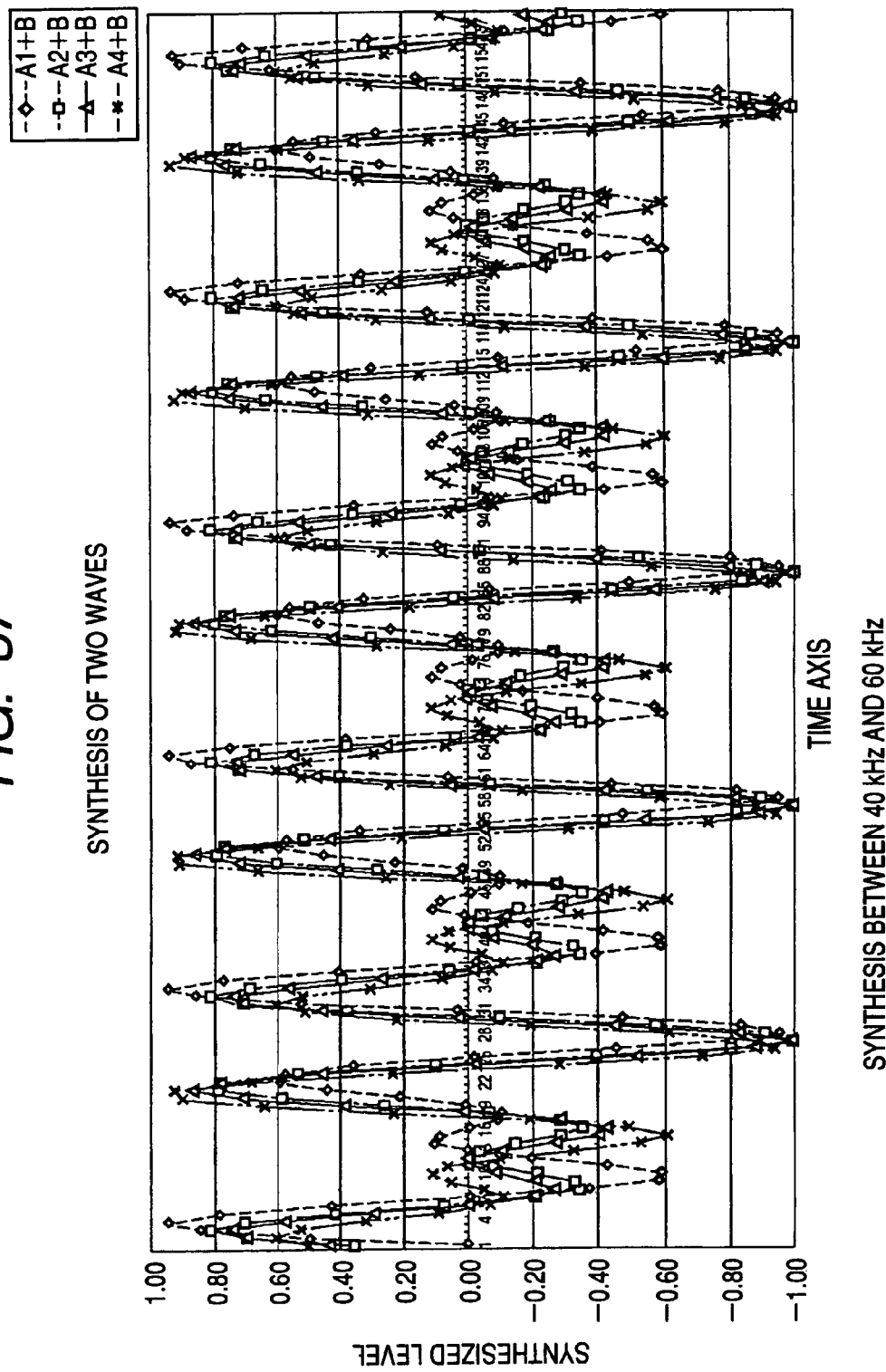
FIGS. 37-41 are graphs each showing a waveform example in the case where two waves are analogously added in the seventh or ninth embodiment.
Figure 38:
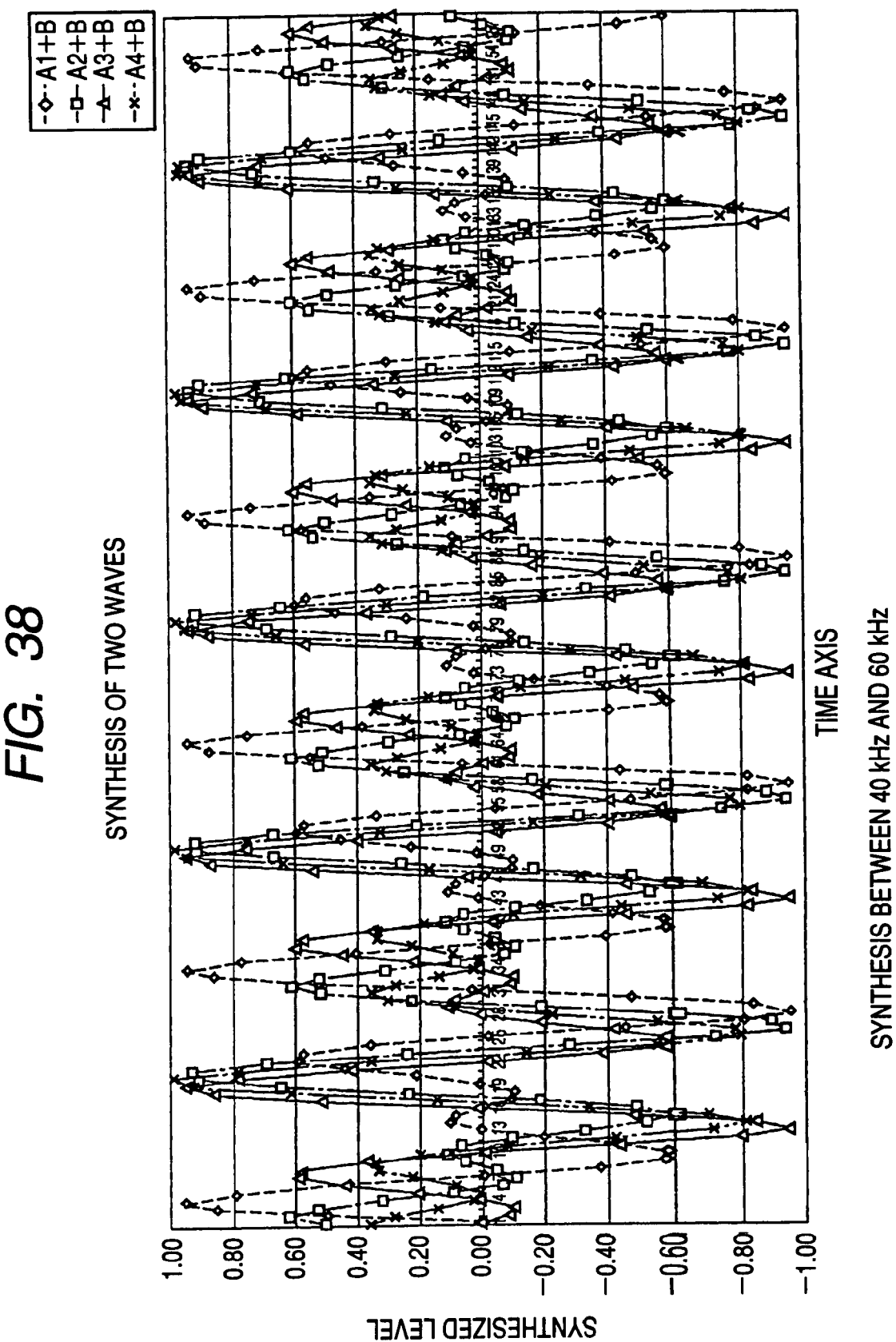
Figure 39:
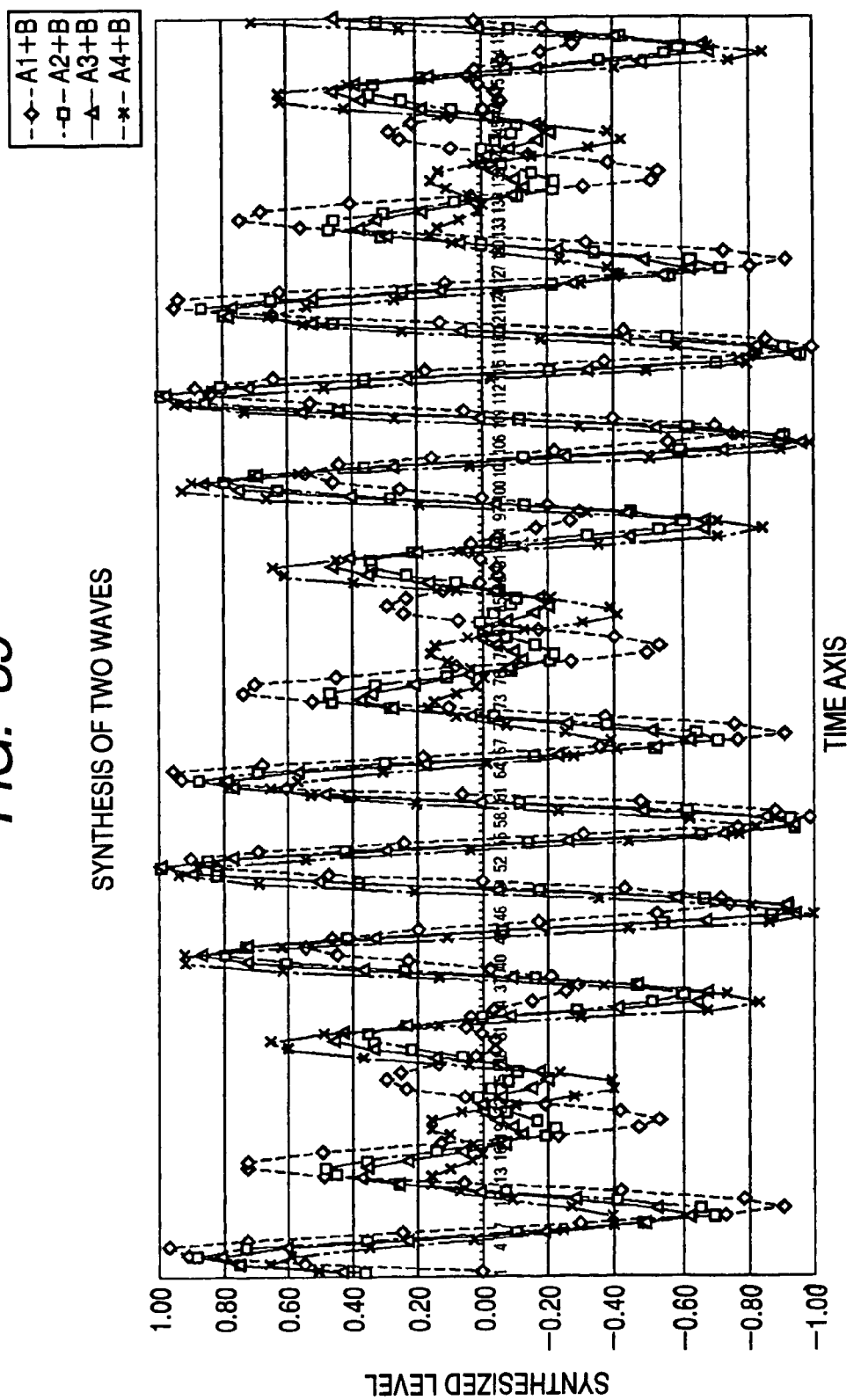
Figure 40:
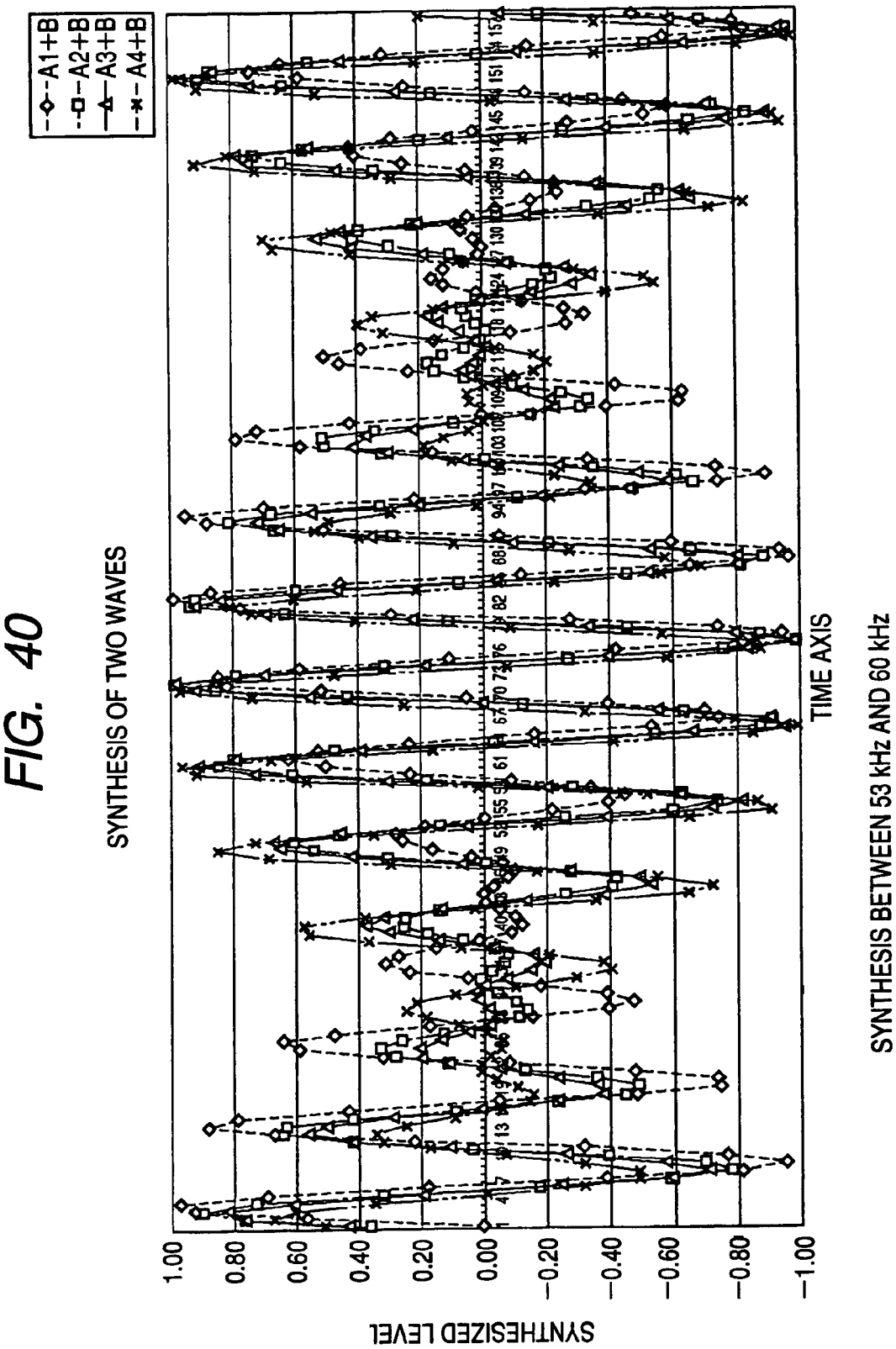
Figure 41:
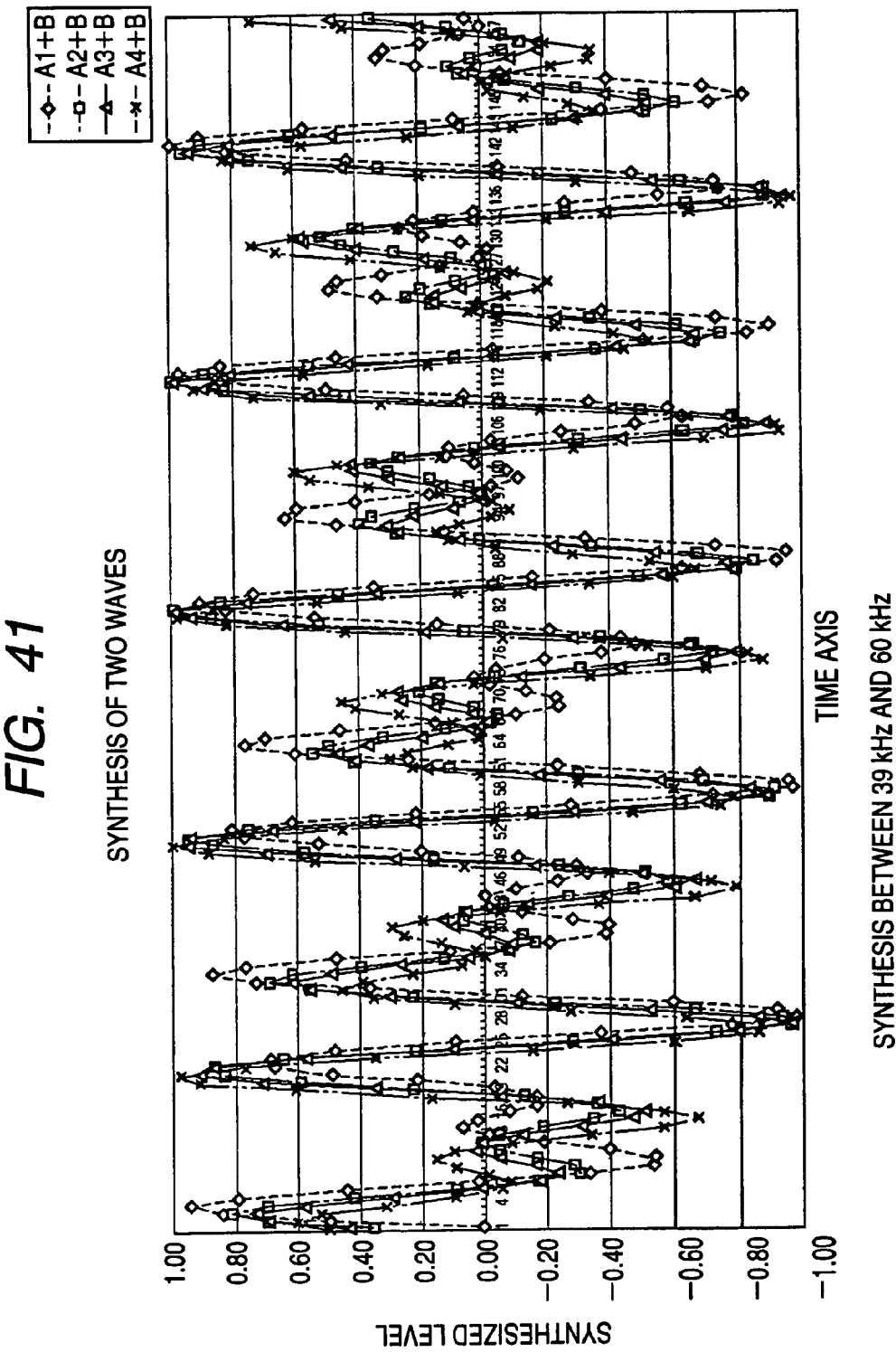

FIG. 36 schematically shows examples of waveforms at the input and output of the band-pass filter BPF which is included in the gain control amplifier block GCA-B. A region A in FIG. 36 is the rearmost part of the small amplitude input state, a region B is a part where the input has changed into the large amplitude input state and where the amplitude is gradually increased in accordance with the band limitation characteristic of the band-pass filter BPF (the narrow band of the bandwidth of 10 Hz or so), a region C is a part where the large amplitude input is continued and where the output amplitude Vo is stably controlled to a predetermined level (constant level state) by the AGC control, a region D is a part where the input has changed into the small amplitude input state and where the amplitude is gradually decreased in accordance with the band limitation characteristic of the band-pass filter BPF, and a region E is the foremost part of the small amplitude input state. The region E is connected to the region A after a predetermined time period, and the regions A-E are iterated.

The AGC operation of the prior-art circuit, and the AGC operation (ordinary AGC operation) of each of the AM-modulated signal reception circuits in the second-fourth embodiments in the conductive state of the transfer gate TG1, function so that the output amplitude Vo of the gain control amplifier block GCA-B may be always uniformalized to the amplitude shown in the C region. That is, in the smaller amplitude regions other than the C region, the amplitude is increased toward the amplitude of the C region at a response rate which is limited by the time constant of the AGC circuit.

Accordingly, regarding the output amplitude Vo of the gain control amplifier block GCA-B based on the AGC operation of the prior-art circuit, the A-region amplitude is larger than the E-region amplitude in FIG. 36, the rise of the B region is accelerated by the AGC operation in spite of the existence of the band limitation characteristic of the band-pass filter BPF, and that fall of the C region which is a gentle fall based on the band limitation characteristic of the band-pass filter BPF is further decelerated by the AGC operation. Owing to this phenomenon, when the input reference voltage VR2 of the comparator Comp is set at a value corresponding to the medium between the level of the C region and a level equal to $\frac{1}{10}$ of the former level (in case of the reception of the standard radio wave in Japan), the pulse width of the output signal TCO of the comparator Comp inevitably stretches on the side corresponding to the large amplitude (td1<td2 holds in FIG. 36).

Figure 5:
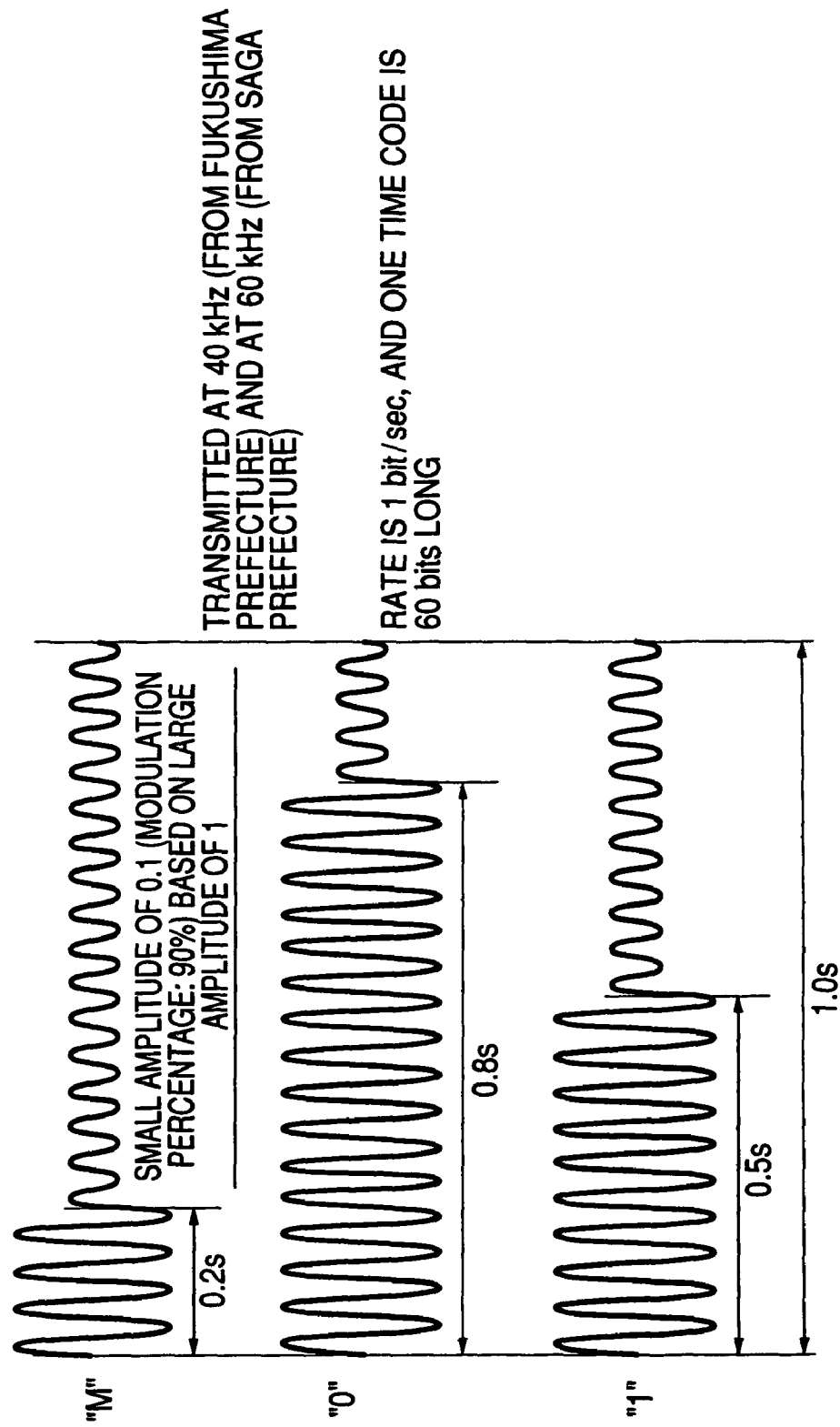
FIG. 5 is a waveform diagram of standard radio waves.

As understood from FIG. 5, the codes "M", "0" and "1" are identified by the pulse widths of the logic output TCO corresponding to the large amplitude. Therefore, the precision of the pulse width leads to that of the identification.

Also in the AGC operation in each of the second-fourth embodiments, in the regions where the output signal TCO of the comparator Comp becomes outputs corresponding to the small amplitude, the gain control amplifier block GCA-B has the fixed gain, and the amplitude increasing phenomenon of the output amplitude Vo of the gain control amplifier block GCA-B does not appear meantime. In the latter half of the region B and the first half of the region D, however, the output signal TCO of the comparator Comp becomes outputs corresponding to the large amplitude, and the amplitude increasing phenomenon appears as stated above. The pulse width on the side corresponding to the large amplitude, inevitably stretches though the stretch is sharply improved over that in the prior-art circuit.

In order to suppress the influence of the amplitude increasing phenomenon in the prior-art circuit, the time constant of the AGC circuit during the appearance of the amplitude increasing phenomenon (the time constant of the peak detection circuit PDet, or the time constant of the low-pass filter LPF) needs to be set sufficiently larger than the gentle rise and fall times based on the band limitation characteristic of the band-pass filter BPF.

Further, in order to widen a reception range to a minute input, a variable gain range needs to be widened by enlarging the maximum gain of the AGC amplifier. When this improvement is made, the change of the gain relative to the change of the output Vp of the peak detection circuit PDet enlarges, and hence, the time constant of the AGC circuit needs to be made still larger for the purpose of suppressing the amplitude increasing phenomenon.

In the circuit shown in FIG. 14A, in a case where the delay time of the delay circuit D is set at a time period corresponding substantially to the region B and where the pulse width of the monostable multivibrator MM is set at the minimum duration of the large amplitude (the time period corresponding to the code "M" in FIG. 5), the gain control amplifier block GCA-B is permitted to perform the ordinary AGC operation for the minimum duration of the C region affording the perfect flat level, and to perform the fixed gain operation for the other time period, and the amplitude increasing phenomenon can be perfectly eliminated. Therefore, the time widths of the large amplitude state and the small amplitude state become precise.

The gain control amplifier block GCA-B is merely caused to perform the ordinary AGC operation for the minimum duration of the C region affording the perfect flat level, so that the time constant of the AGC need not be enlarged even when the maximum gain or the variable gain range is increased.

In this manner, it is permitted to make the time constant of the peak detection circuit PDet much smaller, and it is realized to enhance the AGC response and to lower the time constant capacitance C1.

When the regular reception through the delay circuit D, etc. is directly performed immediately after the turn-ON of power supply in the reception circuit shown in FIG. 14A, the AGC operation might be performed in the small amplitude input state extending from the region E to the region A, thereby to fix the gain by adjusting the output amplitude Vo of the gain control amplifier block GCA-B in the small amplitude input state, to the level corresponding to the C region in FIG. 36. In this state, the input of the comparator Comp always becomes larger than an input level corresponding to the large amplitude input state, and hence, the output signal TCO of the comparator Comp is also fixed to a level corresponding to the large amplitude input state (as a malfunction).

The idle reception first picks out the large amplitude input state, and establishes the AGC state for adjusting the output amplitude Vo in this state to the level corresponding to the C region. Thereafter, the regular reception through the delay circuit D, etc. is performed. Thus, the reception in which the pulse width of the output signal TCO of the comparator Comp is precise becomes possible.

Besides, it is optimal to set the reference voltage VR2 at the intermediate value between the output peak value and bottom value of the envelope detection circuit SDet. In the circuit shown in FIG. 14A, even when the holding capacitance C1 of the peak detection circuit PDet is small, the output Vp of the peak detection circuit PDet is stabler than in the prior-art circuit or in the second-fourth embodiments, and a method in which the reference voltage VR2 is determined from the peak detection circuit PDet is more effective.

The delay time of the delay circuit D is set at the time period corresponding substantially to the region B, so as to prevent the excessive amplitude increase of the output amplitude Vo attributed to a gain increase arising meantime. The delay circuit D may well be omitted in a construction in which the amplitude increase of the output amplitude Vo attributed to the gain increase arising meantime poses no problem, and in which the reference voltage VR2 is set a fixed value by way of example.

Besides, in a case where the monostable multivibrator MM has issued an erroneous pulse for any cause, the AGC operation becomes an abnormal operation. The malfunction in such a case can be prevented by the construction in which, as shown in FIG. 14B, the output of the monostable multivibrator MM and the output signal TCO of the comparator Comp are subjected to the AND synthesis.

As thus far described, according to the fifth embodiment, the following advantages are brought forth:

(1) It is permitted to make the time constant of the peak detection circuit PDet much smaller, and it is realized to enhance the AGC response and to lower the time constant capacitance C1.
(2) The output amplitude of the gain control amplifier block GCA-B is stably controlled, and the time widths of the large amplitude state and small amplitude state become precise.
(3) The method in which the reference voltage VR2 is determined from the peak detection circuit PDet, becomes effective.
(4) It is possible to prevent that increase of the AGC time constant which is ascribable to the enlargements of the maximum gain and variable gain range of the variable gain amplifier.
(5) Owing to the advantages (1)-(4), it is possible to realize the AM signal reception circuit of wide reception level range and few malfunctions.

Sixth Embodiment

Figure 15:
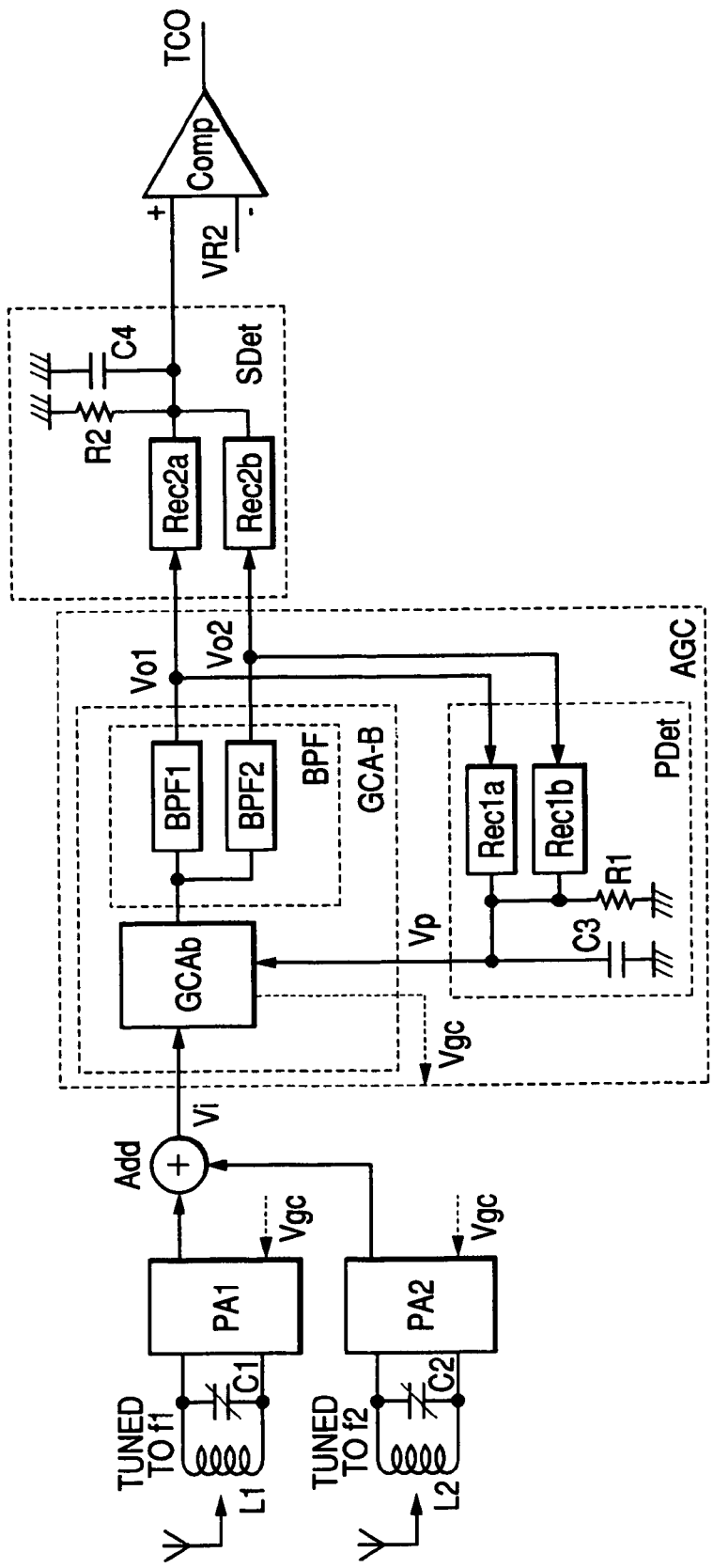
FIG. 15 is a circuit diagram of an AM-modulated signal reception circuit in the sixth embodiment.

FIG. 15 is a circuit diagram of an AM-modulated signal reception circuit in the sixth embodiment of the present invention. The AM-modulated signal reception circuit in FIG. 15 is capable of the simultaneous receptions of a plurality of stations. It includes a first tuning circuit which is constituted by an antenna coil L1, a tuning capacitance C1, etc. for the tuning reception of a radio wave of carrier frequency f1, and a preamplifier PA1 which amplifies and then delivers the output signal of the first tuning circuit. It also includes a second tuning circuit which is constituted by an antenna coil L2, a tuning capacitance C2, etc. for the tuning reception of a radio wave of carrier frequency f2, and a preamplifier PA2 which amplifies and then delivers the output signal of the second tuning circuit. Also included is an adder circuit Add which adds up the outputs of the preamplifiers PA1 and PA2 so as to deliver the resulting output. A gain control amplifier block GCA-B receives the output of the adder circuit Add as an input signal Vi and amplifies the input signal Vi by lowering its gain upon the rise of an external DC control voltage VP and heightening its gain upon the fall of the voltage Vp, and it extracts and then outputs a band signal Vo1 having a center frequency f1 and a bandwidth $\Delta f1$ and a band signal Vo2 having a center frequency f2 and a bandwidth $\Delta f2$. A peak detection circuit PDet is constituted by a rectification circuit Rec1$a$ which rectifies the band signal Vo1 so as to charge a peak holding capacitor C3, a rectification circuit Rec1$b$ which rectifies the band signal Vo2 so as to charge the peak holding capacitor C3, and a discharge resistance R1 which discharges the stored charges of the peak holding capacitor C3, and it outputs the charged voltage of the holding capacitor C3 to the gain control amplifier block GCA-B as the DC control voltage Vp. An envelope detection circuit SDet is constituted by a rectification circuit Rec2$a$ which rectifies the band signal Vo1 so as to charge a peak holding capacitor C4, a rectification circuit Rec2$b$ which rectifies the band signal Vo2 so as to charge the peak holding capacitor C4, and a discharge resistance R2 which discharges the stored charges of the peak holding capacitor C4, and it outputs the charged voltage of the peak holding capacitor C4 as an envelope detection output. A comparator Comp compares the output of the envelope detection circuit SDet and a reference voltage VR2 so as to output a comparison signal TCO.

Figure 24:
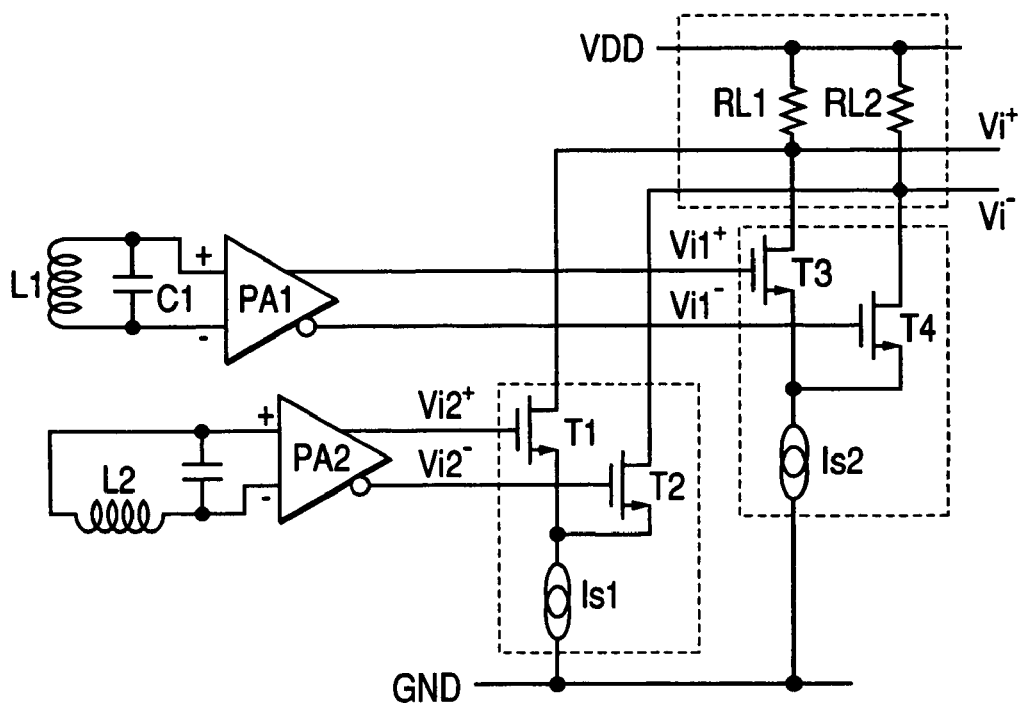
FIG. 24 is a circuit diagram of an adder circuit in FIG. 15 in the sixth embodiment or in FIG. 16 in the seventh embodiment.

Incidentally, FIG. 24 shows a practicable example of the adder circuit in the sixth embodiment here, and in the seventh embodiment to be described later. The outputs of the preamplifiers PA1 and PA2 are converted into differential current signals by circuits enclosed with broken lines, the current signals are subjected to wired current additions, and the added currents are converted into voltage signals by load resistances RL1 and RL2.

The gain control amplifier block GCA-B is constructed including a variable gain amplifier block GCAb which compares the control voltage Vp with an internal reference voltage VR1 not shown, so as to control the gain and to amplify the input signal Vi, a band-pass filter BPF1 which is means for extracting the band signal Vo1 having the center frequency f1 and the bandwidth Δf1, and a band-pass filter BPF2 which is means for extracting the band signal Vo2 having the center frequency f2 and the bandwidth Δf2.

The preamplifiers PA1 and PA2 may well be incorporated into the AGC operation loop as variable gain amplifiers, in the same manner as described in the basic constructional example of the prior-art circuit (in FIG. 6). Besides, buffer circuits which satisfy the terminating conditions of the individual band-pass filters BPF and which drive the individual rectification circuits Rec are interposed between the band-pass filters BPF and the rectification circuits Rec, but they are omitted from FIG. 15 because such an arrangement can be readily inferred by a person skilled in the art.

The antenna coil L1 has a bar antenna structure in some cases, or it is connected to an external antenna in the other cases. The antenna coil L1 and the tuning capacitance C1 which receive radio waves in the vicinity of the carrier frequency f1 and convert the received radio waves into a voltage (current) signal, are tuned to the carrier frequency f1 and emphasize the voltage (current) signal of the frequency f1 by a resonance operation. The preamplifier PA1 further amplifies this voltage (current) signal so as to output the amplified signal to the adder circuit Add.

Likewise, the antenna coil L2, tuning capacitance C2 and preamplifier PA2 receive the radio wave of the carrier frequency f2, convert the received radio wave into a voltage (current) signal and amplify the voltage (current) signal so as to output the amplified signal to the adder circuit Add.

The adder circuit Add analogously adds up the amplified voltage (current) signals of the carrier frequencies f1 and f2, and it outputs the resulting signal to the gain control amplifier block GCA-B.

The variable gain amplifier block GCAb amplifies the output Vi of the adder circuit Add with the gain which holds the external DC control voltage Vp constant. The band-pass filter BPF1 extracts the band signal Vo1 having the center frequency f1 and the bandwidth Δf1, from the amplified signal, so as to output the extracted band signal Vo1. Likewise, the band-pass filter BPF2 extracts the band signal Vo2 having the center frequency f2 and the bandwidth Δf2, from the amplified signal, so as to output the extracted band signal Vo2.

The band signal Vo1 is rectified by passing through the rectification circuit Rec1$a$, and the band signal Vo2 through the rectification circuit Rec1$b$. The resulting signals are stored in the peak holding capacitor C3, and the DC control voltage Vp is generated by the stored charges of this capacitor C3.

The charging operation, and the operation of discharging the stored charges of the peak holding capacitor C3 in accordance with a time constant of R1×C3 by the discharge resistance R1, incarnate the function of the peak detection circuit PDet.

Here, the voltage amplitudes of the band signals Vo1 and Vo2 are usually such that one is larger than the other. Therefore, the output Vp of the peak detection circuit PDet is determined by only the amplitude level of the larger side, and it does not depend upon the amplitude level of the smaller side.

The gain control amplifier block GCA-B and the peak detection circuit PDet perform the AGC operation in combination. Since the output signal Vp of the peak detection circuit PDet depends only upon the amplitude level of the larger side of the two band signals, the AGC operation acts so as to hold the amplitude level of the larger side constant, and the level of the smaller side is amplified by the gain of the AGC operation. Accordingly, the ratio between the reception amplitude levels is kept as the ratio of the output amplitudes.

In the envelope detection circuit SDet, the band signal Vo1 is rectified by passing through the rectification circuit Rec2$a$, and the band signal Vo2 through the rectification circuit Rec2$b$. The resulting signals are stored in the peak holding capacitor C4. The charging operation, and the operation of discharging the stored charges of the peak holding capacitor C4 in accordance within a time constant of R2×C4 by the discharge resistance R2, incarnate the function of the envelope detection circuit SDet.

As in the description of the peak detection circuit PDet, the output of the envelope detection circuit SDet becomes a succession of the amplitude levels of the larger side of the voltage amplitudes of the band signals Vo1 and Vo2. The output of the envelope detection circuit SDet and the reference voltage VR2 are compared by the comparator Comp, so as to be converted into the comparison signal TCO.

As standard radio waves in Japan, the same time codes are transmitted from stations located in Fukushima Prefecture (at 40 kHz) and Saga Prefecture (at 60 kHz), at the same times by identical AM modulation. In a case where the radio wave signals of the two stations are received within the State of Japan, a time difference arises due to the difference between the arrival distances of the radio wave signals to a reception point, but it is on the order of several msec. As understood from the waveform example of the standard radio wave in FIG. 5, the time difference is negligible relative to the fact that the time width of each bit is on the order of several hundred msec. Therefore, even when the radio waves of the two stations are simultaneously received, the time codes do not collapse.

The side on which the reception input level is extraordinarily small is not amplified to a noticeable level, and it is consequently ignored. In case of the reception input levels which are close to each other, even when they individually fluctuate due to phading phenomena, etc., the side of better reception situation is automatically selected and received without fail. Therefore, a stable reception is realized.

As thus far described, according to the sixth embodiment, the following advantages are brought forth:

(1) The input signal on the side on which the reception input level is extraordinarily small is ignored, and even when the reception input levels close to each other fluctuate due to the phading phenomena, etc., the stable reception is realized.

(2) In spite of the two-station simultaneous reception circuit, a large number of parts are shared, and hence, the number of components and dissipation power increase little.

(3) As compared with a method wherein two stations are individually received so as to adopt a better result, the method of this embodiment realizes reception in a shorter time.

(4) Owing to the advantages (2) and (3), total dissipation power becomes lower than in the method wherein the two stations are individually received.

Seventh Embodiment

Figure 16:
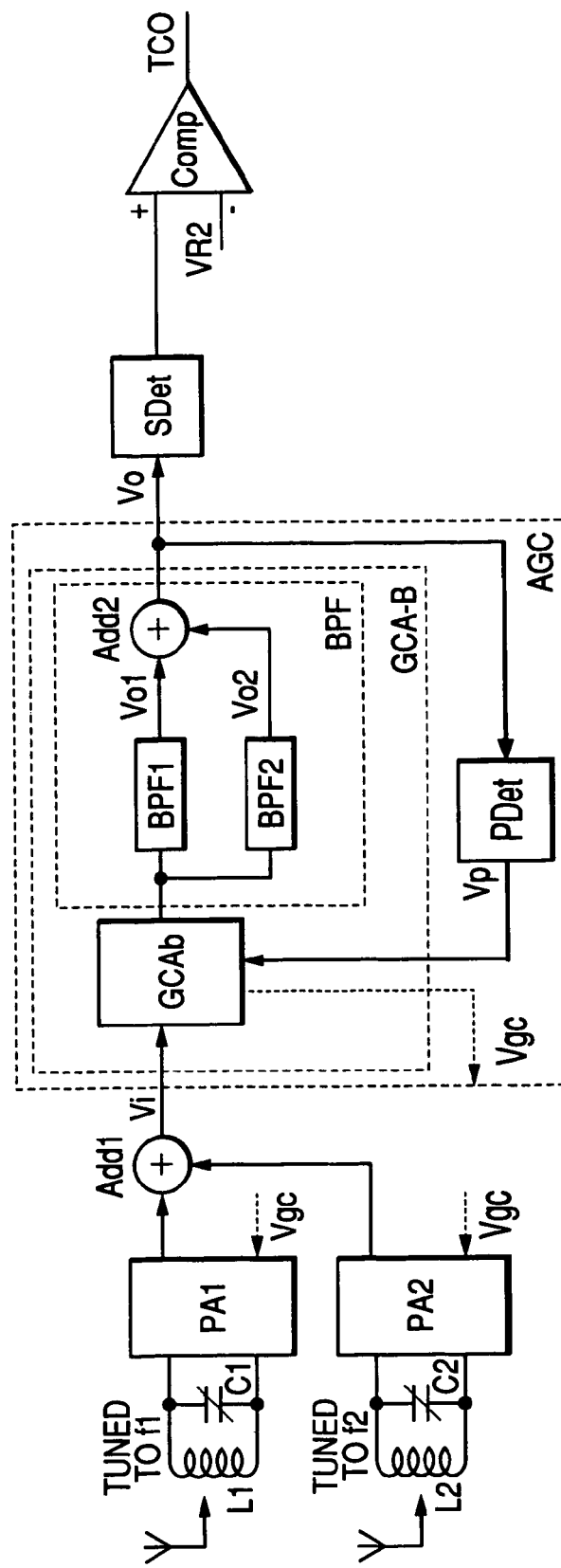
FIG. 16 is a circuit diagram of an AM-modulated signal reception circuit in the seventh embodiment.

FIG. 16 is a circuit diagram of an AM-modulated signal reception circuit in the seventh embodiment of the present invention. The AM-modulated signal reception circuit for plural-station simultaneous reception as shown in FIG. 16 is so constructed that, in the foregoing AM-modulated signal reception circuit for the plural-station simultaneous reception in the sixth embodiment, the gain control amplifier block GCA-B is additionally furnished with a second adder circuit Add2 which adds up the outputs of the band-pass filter BPF1 for extracting the band signal Vo1 having the center frequency f1 and the bandwidth Δf1, and the band-pass filter BPF2 for extracting the band signal Vo2 having the center frequency f2 and the bandwidth Δf2, whereupon the output of the second adder circuit Add2 is inputted to the peak detection circuit PDet as well as the envelope detection circuit SDet.

The preamplifiers PA1 and PA2 may well be incorporated into the AGC operation circuit as variable gain amplifiers, in the same manner as described in the basic constructional example of the prior-art circuit (in FIG. 6).

Incidentally, FIG. 24 shows a practicable example of each of the adder circuits Add1 and Add2 in this embodiment. The outputs of the preamplifiers PA1 and PA2 are converted into differential current signals by circuits enclosed with broken lines, the current signals are subjected to wired current additions, and the added currents are converted into voltage signals by load resistances RL1 and RL2.

The basic operation as the AM-modulated signal reception circuit for the plural-station simultaneous reception is the same as that of the sixth embodiment described above, and shall be therefore omitted from description.

In the seventh embodiment, the output Vo1 of the band-pass filter BPF1 and the output Vo2 of the band-pass filter BPF2 are added by the second adder circuit Add2.

FIG. 37-FIG. 41 show examples of the analog addition syntheses of waves having different frequencies. In each of the examples shown in FIG. 37-FIG. 41, sinusoidal waves each having an amplitude value of 0.5 are synthesized as their initial phases are changed, and the sum amplitude value between the respective amplitude values occurs at an occurrence rate which is roughly equal to the differential frequency between the two waves. As a result, the AGC operation proceeds so that the synthesized amplitude values may become a predetermined level, and detection is performed on the basis of the envelope of the peak values of the amplitude values.

In the sixth embodiment, the input calculation noises of the two preamplifiers PA1 and PA2 are added and then appear at the output (noise increases). In contrast, in the seventh embodiment, the output becomes roughly equal to the sum amplitude between the two waves, and hence, the variable gain amplifier may operate with a gain which is lower to that extent. Therefore, the noise increase is mitigated.

Besides, the two waves are amplified with the identical gain. As in the sixth embodiment, therefore, the stable reception is realized for the reasons that the side on which the reception input level is extraordinarily small is not amplified to a noticeable level, being consequently ignored, and that, in case of the reception input levels which are close to each other, even when they individually fluctuate due to phading phenomena, etc., the side of better reception situation is chiefly added and received without fail.

Further, in spite of the two-station simultaneous reception circuit, a large number of parts are shared, and hence, the number of components and dissipation power increase little.

Still further, as compared with a method wherein two stations are individually received so as to adopt a better result, the method of this embodiment can receive the radio wave in a half time period and can lower dissipation power expended on the whole reception, considering also the above advantages.

Yet further, when the second-fifth embodiments are applied, the advantages of the respective embodiments are attained as they are.

In addition, regarding a method of accepting the radio waves, the antenna coils may have a bar antenna structure, or they may well be connected to an antenna by antenna cables.

As thus far described, according to the seventh embodiment, the advantage of reducing the noise is brought forth in addition to the advantages of the sixth embodiment.

Eighth Embodiment

Figure 17:
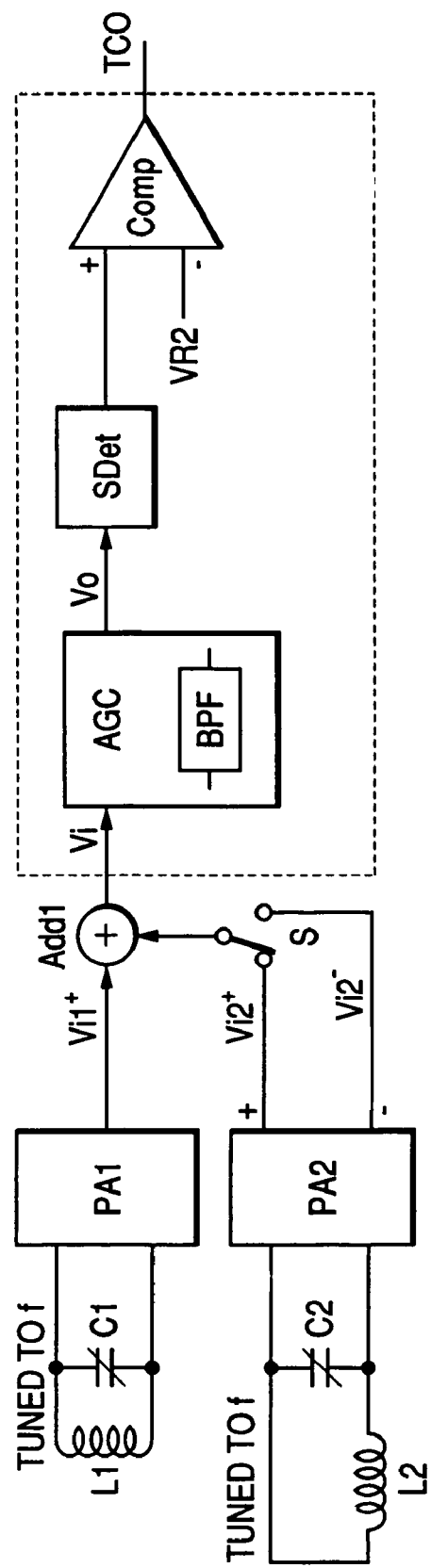
FIG. 17 is a circuit diagram of an AM-modulated signal reception circuit in the eighth embodiment.

FIG. 17 is a circuit diagram of an AM-modulated signal reception circuit in the eighth embodiment of the present invention. The AM-modulated signal reception circuit in FIG. 17 is so constructed that, in the AM-modulated signal reception circuit in the sixth embodiment, bar antennae are respectively employed as the antenna coils L1 and L2, which are arranged on a horizontal plane so as to be orthogonal to each other. Besides, the tuning frequency between the antenna coil L1 and the tuning capacitance C1, and the tuning frequency between the antenna coil L2 and the tuning capacitance C2 are set at an identical tuning frequency f. Further, a phase changeover switch S which changes-over the output phase of the preamplifier PA2 between a positive phase and a negative phase is inserted between the output of the preamplifier PA2 and the input terminal of the adder circuit Add.

In this embodiment, since the single tuning frequency f is received, a single band-pass filter BPF suffices within an AGC circuit in FIG. 17. Behind the AGC circuit, the same circuits as in the prior-art circuit or in each of the second-fifth embodiments can be employed.

The preamplifiers PA1 and PA2 may well be incorporated into the AGC circuit as variable gain amplifiers, in the same manner as described in the basic constructional example of the prior-art circuit (in FIG. 6).

Figure 25:
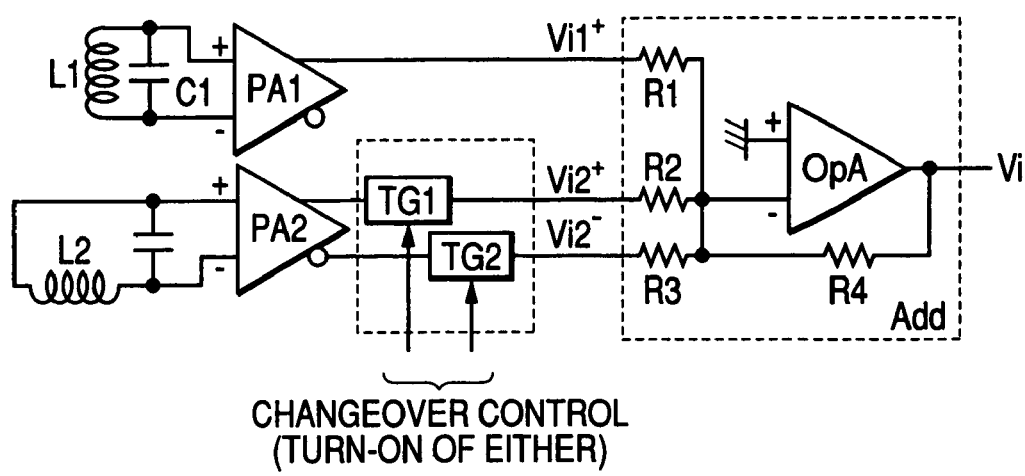
FIG. 25 and FIG. 26 are circuit diagrams of adder circuits which include the polarity changeover of preamplifiers PA2 in FIG. 17 in the eighth embodiment and in FIG. 18 in the ninth embodiment, respectively.
Figure 26:
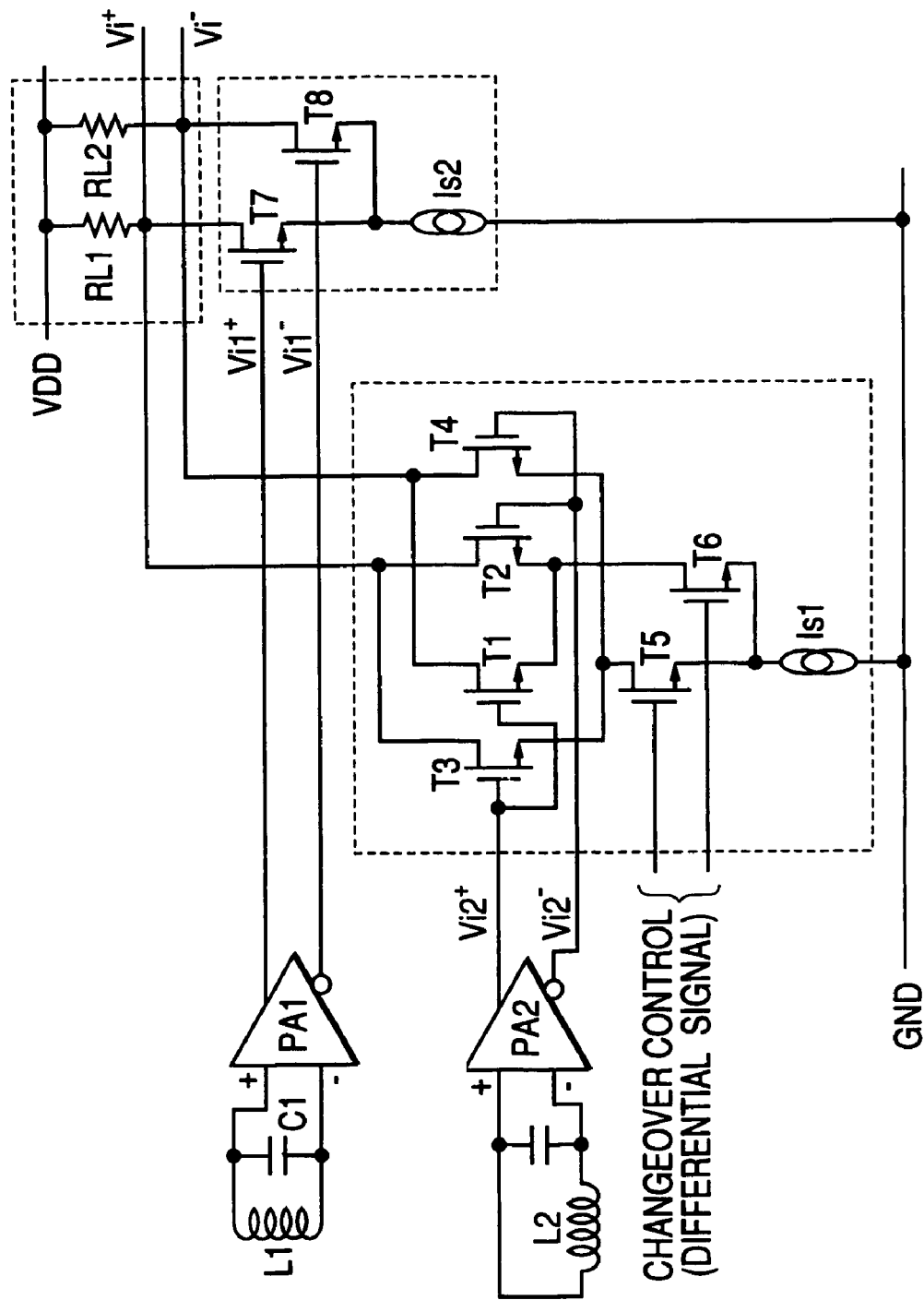

Incidentally, FIGS. 25 and 26 show practicable examples of adder circuits each of which includes the polarity changeover of the preamplifier PA2. In the adder circuit shown in FIG. 25, either a transfer gate TG1 or TG2 is brought into its conductive state, thereby to add the positive-phase or negative-phase output of the preamplifier PA2 and the output of the preamplifier PA1. Besides, in the adder circuit shown in FIG. 26, either of transistors T5 and T6 is brought into-its conductive state, whereby either a differential pair of transistors T3 and T4 or a differential pair of transistors T1 and T2 falls into its active state, and the output of the preamplifier PA2 is added with that of the preamplifier PA1 in the positive phase or the negative phase.

A reception portion which is constituted by the two antenna coils L1 and L2 and tuning capacitances C1 and C2, and the two preamplifiers PA1 and PA2, receives and outputs the identical frequency, that is, a radio wave transmitted from an identical transmitting station.

Figure 19:
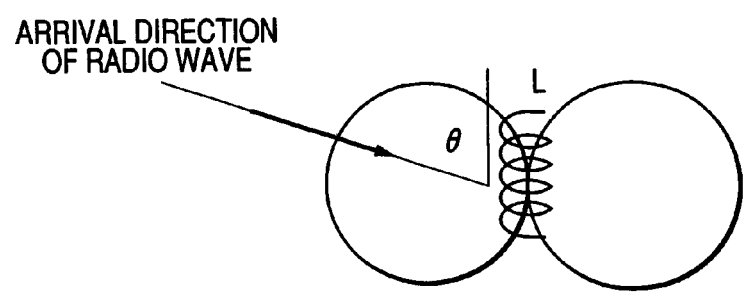
FIG. 19 is a diagram showing the angle θ of an antenna coil relative to the arrival direction of a radio wave.

If the distance between the two bar antennae in the orthogonal arrangement is sufficiently shorter than the wavelength of the transmitted radio wave, reception voltages developing across the two antenna coils L1 and L2 become inphase or antiphase in accordance with the winding directions of these coils, and only reception levels differ depending upon angles θ (0-360 degrees) relative to the arrival direction of the radio wave (refer to FIG. 19).

Figure 42:
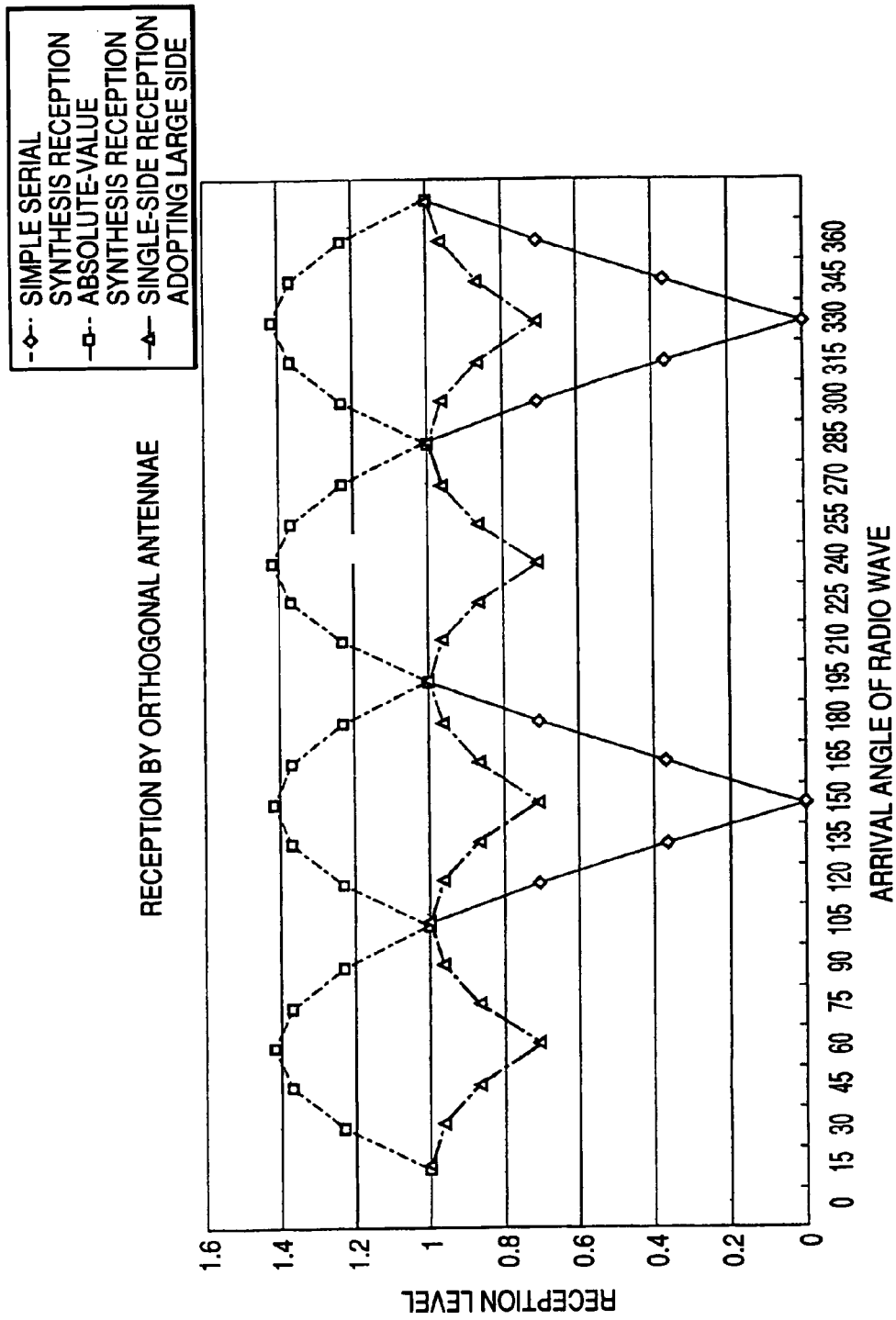
FIG. 42 is a graph showing a reception level versus the arrival angle of a radio wave.

Letting the reception level of the antenna coil L1 be V1=Vo×cos θ, the reception level of the antenna coil L2 becomes V2=Vo×sin θ. When the reception levels are subjected to a simple addition (V=V1+V2), an angle at which the result of the addition becomes zero because the reception levels have equal magnitudes and opposite phases. However, when the reception levels are added so as to always become inphase (as V=|V1|+|V2|, by manipulating the phase changeover switch S, the addition V becomes Vo–1.4 Vo without fail (refer to FIG. 42).

In case of a radio timepiece of wall clock type or the like, the direction of a bar antenna in the radio timepiece is determined by the sense of an installation wall or the like, and with the single bar antenna, a radio wave cannot be received at all, at certain angles. In contrast when the AM-modulated signal reception circuit according to this embodiment is employed, a reception sensitivity which corresponds to, at least, a reception level obtained by orienting the single bar antenna in the best direction can be attained at any angle.

The switch S is changed-over at the first reception after the installation of the radio timepiece, the exchange of a power source battery, or the like, and the feasibilies of receptions in the positive phase and negative phase of the preamplifier PA2 are tested so as to select the better phase. A later reception is tried in the phase which was feasible at the last reception. Herein, if the reception is successful, the time code corresponding to this reception is used, and if it ends in failure, the phase is inverted so as to try a further reception.

Also in this embodiment, when the second-fifth embodiments are applied, the advantages of the respective embodiments are attained as they are.

As thus far described, according to the eighth embodiment, whichever direction the AM-modulated signal reception circuit is located in, the reception sensitivity corresponds to, at least, the reception level obtained by orienting the single bar antenna in the best direction.

Ninth Embodiment

Figure 18:
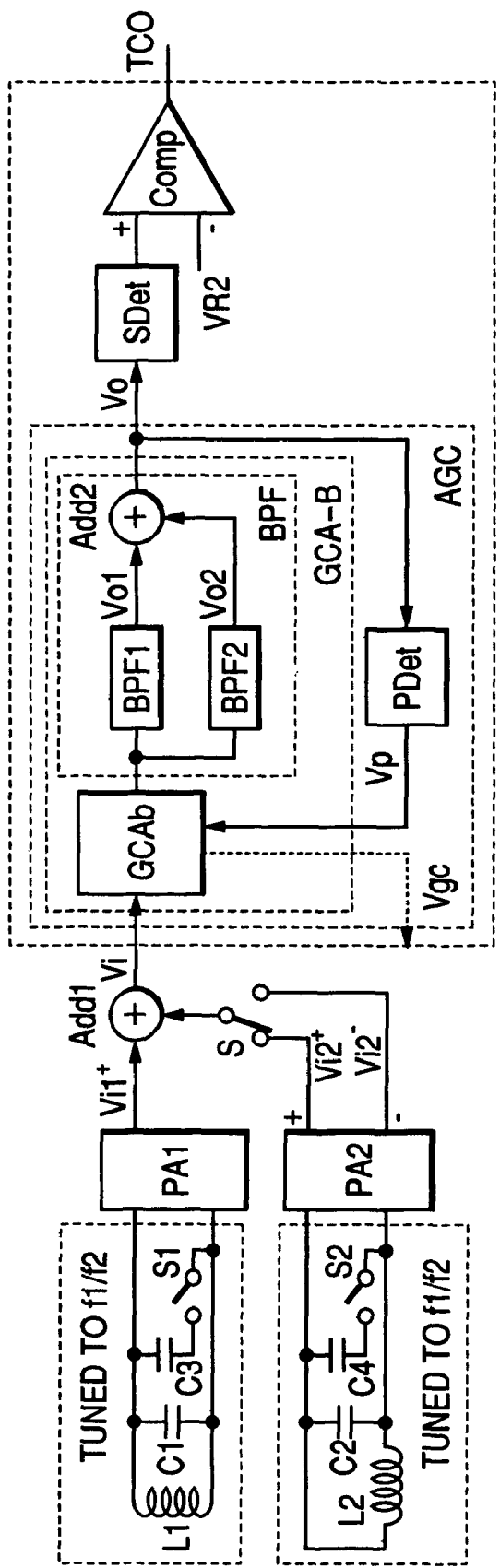
FIG. 18 is a circuit diagram of an AM-modulated signal reception circuit in the ninth embodiment.

FIG. 18 is a circuit diagram of an AM-modulated signal reception circuit in the ninth embodiment of the present invention. The AM-modulated signal reception circuit in FIG. 18 is so constructed that, in the AM-modulated signal reception circuit in the seventh embodiment, bar antennae are respectively employed as the antenna coils L1 and L2, which are arranged on a horizontal plane so as to be orthogonal to each other. Besides, the tuning frequency between the antenna coil L1 and the tuning capacitance C1, and the tuning frequency between the antenna coil L2 and the tuning capacitance C2 are set at an identical tuning frequency f1. Further, a tuning capacitance C3 which can be electrically connected and disconnected by a switch S1 is added to the tuning capacitance C1, while a tuning capacitance C4 which can be electrically connected and disconnected by a switch S2 is added to the tuning capacitance C2. Herein, the tuning frequency between the antenna coil L1 and the tuning capacitances C1 and C3, and the tuning frequency between the antenna coil L2 and the tuning capacitances C2 and C4 are set at an identical tuning frequency f2. Still further, a phase changeover switch S which changes-over the output phase of the preamplifier PA2 between a positive phase and a negative phase is inserted between the output of the preamplifier PA2 and the input terminal of the adder circuit Add.

FIG. 37-FIG. 41 show examples of the analog addition syntheses of waves having different frequencies. In each of the examples shown in FIG. 37-FIG. 41, sinusoidal waves each having an amplitude value of 0.5 are synthesized as their initial phases are changed, and the sum amplitude value between the respective amplitude values occurs at an occurrence rate which is roughly equal to the differential frequency between the two waves. As a result, the AGC operation proceeds so that the synthesized amplitude values may become a predetermined level, and detection is performed on the basis of the envelope of the peak values of the amplitude values.

Incidentally, FIGS. 25 and 26 show practicable examples of adder circuits each of which includes the polarity changeover of the preamplifier PA2. In the adder circuit shown in FIG. 25, either a transfer gate TG1 or TG2 is brought into its conductive state, thereby to add the positive-phase or negative-phase output of the preamplifier PA2 and the output of the preamplifier PA1. Besides, in the adder circuit shown in FIG. 26, either of transistors T5 and T6 is brought into its conductive state, whereby either a differential pair of transistors T3 and T4 or a differential pair of transistors T1 and T2 falls into its active state, and the output of the preamplifier PA2 is added with that of the preamplifier PA1 in the positive phase or the negative phase.

Owing to the combination between the ON/OFF states of the switches S1 and S2, the tuning frequencies can be selected at will in such a manner that the tuning frequency connected to the preamplifier PA1, and the tuning frequency connected to the preamplifier PA2 are both set at the tuning frequency f1 or f2, or that one of them is set at the tuning frequency f1, while the other is set at the tuning frequency f2.

Besides, the output phase of the preamplifier PA2 can be selected at will so as to be the positive phase or the negative phase, by the switch S.

Accordingly, both the reception method of the seventh embodiment and the reception method of the eighth embodiment for the tuning frequency f1 or f2 become possible in accordance with the combination among the phase of the switch S and the ON/OFF states of the switches S1 and S2.

The switches S, and S1 and S2 are changed-over at the first reception after the installation of the radio timepiece, the exchange of a power source battery, or the like, and the feasibilies of receptions are tested so as to select the feasible combination. A later reception is tried in the combination which was feasible at the last reception. Herein, if the reception is successful, the time code corresponding to this reception is used, and if it ends in failure, the combination is changed so as to try a further reception. It is efficient that the success rates of the individual combinations are stored, and that the combination of high success rate is preferred.

Also in this embodiment, when the second-fifth embodiments are applied, the advantages of the respective embodiments are attained as they are.

As thus far described, in the ninth embodiment, both the reception method of the seventh embodiment and the reception method of the eighth embodiment for the tuning frequency f1 or f2 are permitted by the combination among the phase of the switch S and the ON/OFF states of the switches S1 and S2, and advantages with those of the two embodiments joined are attained.

Tenth Embodiment

Figure 20:
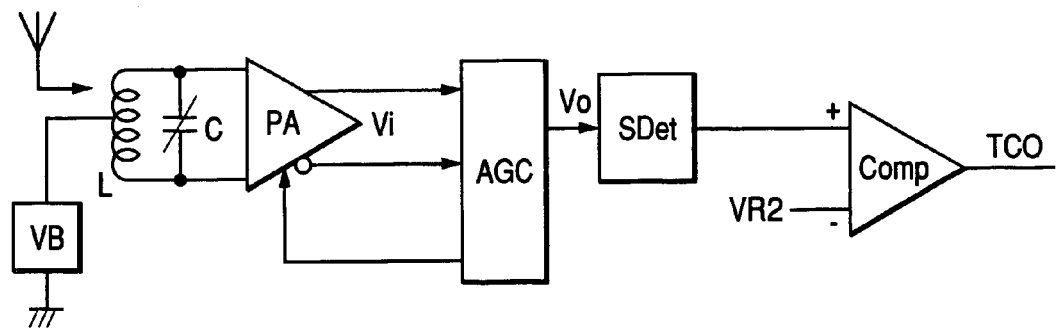
FIG. 20 is a circuit diagram of an AM-modulated signal reception circuit in the tenth embodiment.

FIG. 20 is a circuit diagram of an AM-modulated signal reception circuit in the tenth embodiment of the present invention. The AM-modulated signal reception circuit in FIG. 20 is so constructed that, in the prior-art circuit or each of the AM-modulated signal reception circuits in the second-ninth embodiments as uses the differential input amplifier as the preamplifier PA, the input biases of the preamplifier PA are fed from a center tap which is provided in the antenna coil L.

Since the operation as the AM-modulated signal reception circuit is the same as in each of the foregoing embodiments, it shall be omitted from description. In order to enhance the input minimum sensitivity of the AM-modulated signal reception circuit, the preamplifier PA needs to have its noise lowered. In the method wherein, as in the prior-art circuit, the biases are fed by disposing the bias circuits for both the differential inputs, or a method wherein biases are fed by disposing a bias circuit for one of operating inputs, and through an antenna coil for the other, thermal noise, etc. generated by the bias circuit or circuits are directly amplified by the preamplifier, and they mix into the output of the differential preamplifier.

In the method wherein the biases are fed from the center tap of the antenna coil L to the inputs of the differential input preamplifier PA, noise generated by a bias circuit VB becomes the common mode input noise of the differential input amplifier PA, and it does not appear at the output of the differential input amplifier PA. It is accordingly possible to realize the AM-modulated signal reception circuit in which the thermal noise, etc. generated by the bias circuit have been eliminated.

As thus far described, according to the tenth embodiment, the AM-modulated signal reception circuit which is free from the thermal noise, etc. generated by the bias circuit can be realized in addition to the advantages of the second-ninth embodiments.

Eleventh Embodiment

FIGS. 21A-21D are circuit diagrams of AM-modulated signal detection circuits in the eleventh embodiment of the present invention. The AM-modulated signal detection circuits in the eleventh embodiment are circuits which correspond to the detection circuit SDet in the prior-art circuit or each of the AM-modulated signal reception circuits in the second-tenth embodiments.

Figure 21A:
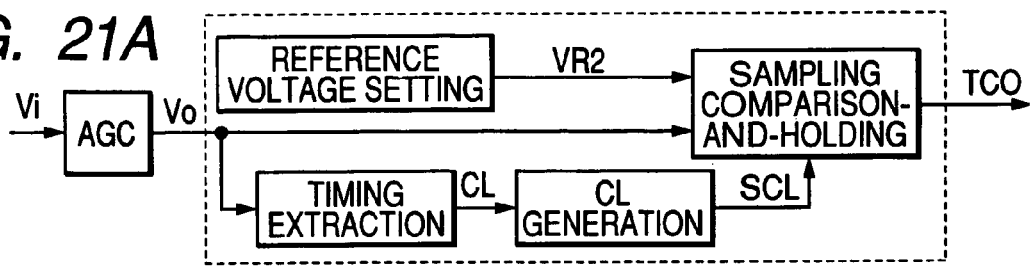
FIGS. 21A-21D are circuit diagrams of AM-modulated signal detection circuits in the eleventh embodiment.

The AM-modulated signal detection circuit in FIG. 21A includes a timing extraction unit which extracts a carrier frequency component from the output signal Vo of the AGC circuit in the prior-art circuit or each of the AM-modulated signal reception circuits in the second-tenth embodiments, so as to output a clock pulse CL at the carrier frequency. Also included is a clock generation unit which receives the clock pulse CL from the timing extraction unit so as to output a sampling clock pulse SCL. A reference voltage setting unit outputs a comparison reference voltage VR2. A sampling comparison-and-holding unit subjects the output signal Vo of the AGC circuit and the comparison reference voltage VR2 to a sampling comparison at the input of the sampling clock pulse SCL, so as to output a comparison signal TCO and to hold this comparison signal until the next sampling clock pulse SCL is inputted.

Figure 21B:
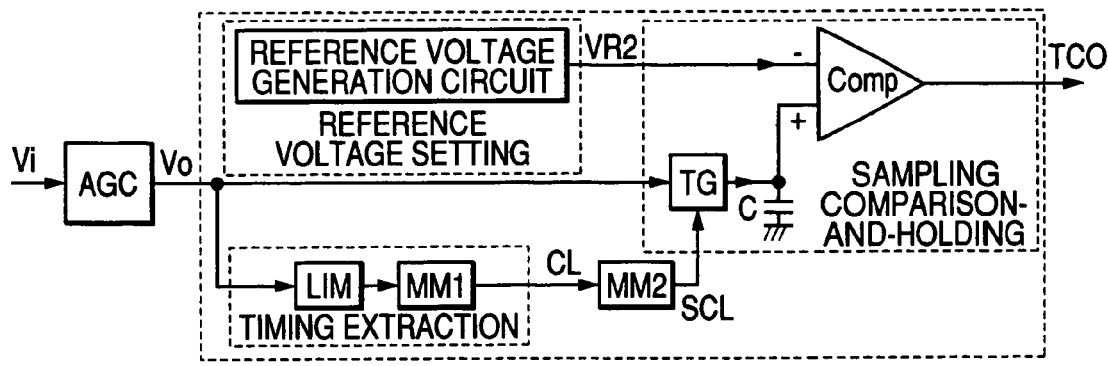

In the AM-modulated signal detection circuit shown in FIG. 21B, the reference voltage setting unit stated above is constructed of a reference voltage generation circuit. The timing extraction unit is constructed of a limit amplifier LIM which limit-amplifies the output signal Vo of the AGC circuit, and a first monostable multivibrator MM1 which outputs the clock pulse CL when triggered by the output of the limit amplifier LIM. The clock generation unit is constructed of a second monostable multivibrator MM2 which generates the sampling clock pulse SCL upon receiving the clock pulse CL of the first monostable multivibrator MM1. The sampling comparison-and-holding unit is constructed of a holding capacitance C one end of which is grounded, a transfer gate TG which brings the output Vo of the AGC circuit of the AM-modulated signal reception circuit and the other end of the holding capacitance C into a conductive state at the input of the sampling clock pulse SCL, and a comparator Comp which compares the voltage of the other end of the holding capacitance C with the comparison reference voltage VR2.

The first monostable multivibrator MM1 creates a predetermined wait time for adjusting a timing phase, and it may well be constructed of a delay circuit.

Figure 21C:
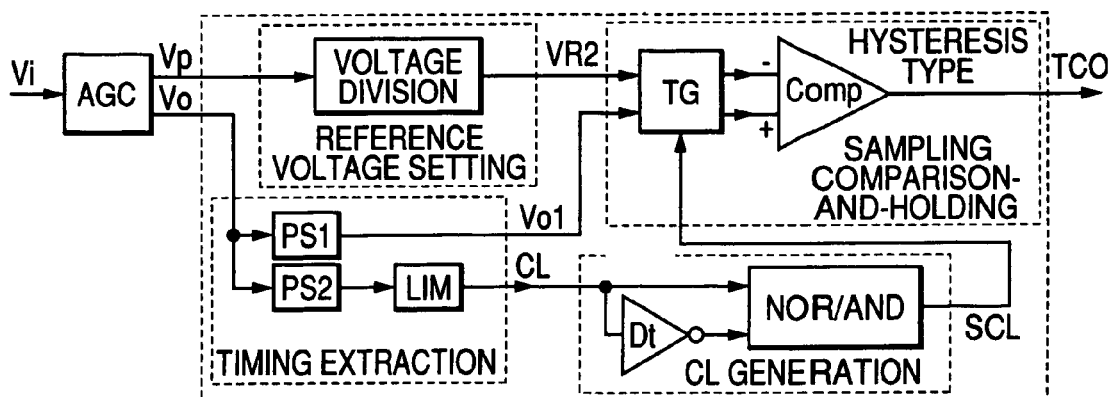

In the AM-modulated signal detection circuit shown in FIG. 21C, the reference voltage setting unit stated above is constructed of a voltage division circuit which divides the voltage of the output Vp of the peak detection circuit PDet (not shown) in the AGC circuit, so as to output the reference voltage VR2. The timing extraction unit is constructed of a first phase shift circuit PS1 which advances (or retards) the phase of the output Vo of the AGC circuit so as to deliver an output Vo1, a second phase shift circuit PS2 which retards (or advances) the phase of the output Vo of the AGC circuit so as to deliver an output, and a limit amplifier LIM which limit-amplifies the output of the second phase shift circuit PS2 so as to output the clock pulse CL. The clock generation unit is constructed of a delay circuit Dt which inverts and delays the clock pulse CL, and a logic synthesis circuit NOR/AND which subjects the output of the delay circuit Dt and the clock pulse CL to NOR or AND synthesis so as to output the sampling clock pulse SCL. The sampling comparison-and-holding unit is constructed of a hysteresis type comparator Comp whose output signal TCO is determined by differential inputs and which holds an output state assumed immediately before opening, in an input open state, and a transfer gate TG which falls into its conductive state at the input of the sampling clock pulse SCL, so as to connect the output Vo1 of the first phase shift circuit PS1 and the reference voltage VR2 to the differential inputs of the hysteresis type comparator Comp.

Figure 31:
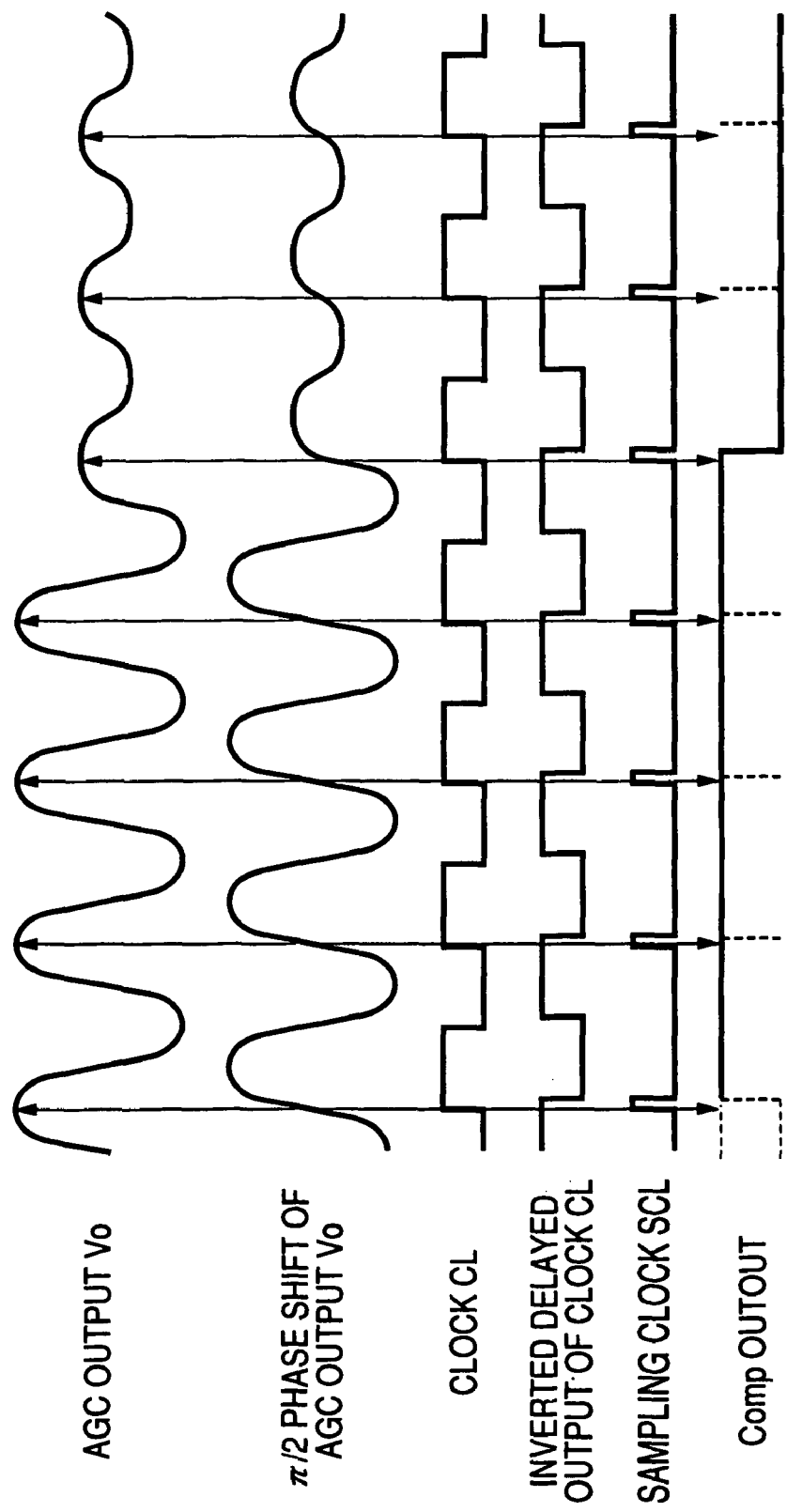
FIG. 31 is a diagram showing waveforms at the individual parts of the detection circuit.

The first phase shift circuit PS1 and the second phase shift circuit PS2, including the delay of the limit amplifier LIM, serve to obtain a waveform having a phase shift of $\pi/2$, as shown in FIG. 31. In a case where the phase can be shifted $\pi/2$ by the phase shift (phase retardation) based on the second phase shift circuit PS2, and the delay of the limit amplifier LIM, the first phase shift circuit PS1 can be omitted.

Figure 21D:
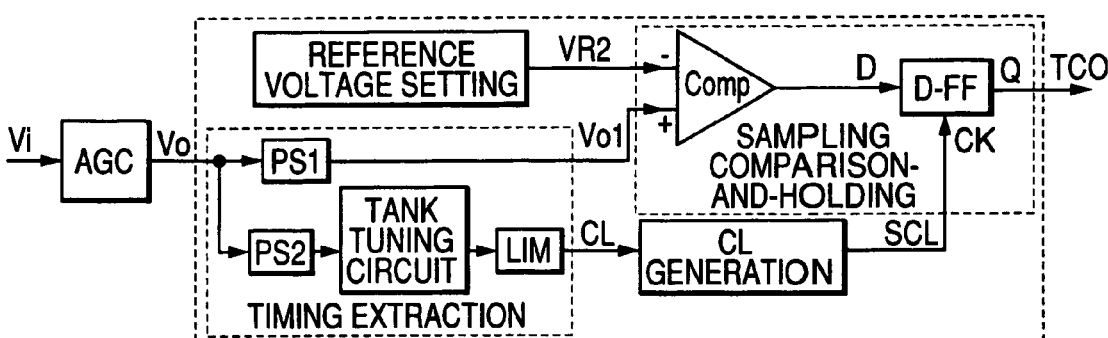

In the AM-modulated signal detection circuit shown in FIG. 21D, the sampling comparison-and-holding unit stated above is constructed of a comparator Comp which compares the output Vo1 of the first phase shift circuit PS1 and the reference voltage VR2 so as to output a comparison result signal, and a D-type flip-flop D-FF which receives the output of the comparator Comp as a data input D and also receives the sampling clock pulse SCL as a clock input CK, and which outputs its logic output Q as the output signal TCO of the AM-modulated signal detection circuit. The timing extraction unit includes a tank tuning circuit employing a crystal oscillator or the like, so as to stabilize the timing of the output CL.

The various units in FIGS. 21B-21D are functionally independent of one another, and they may well be exchanged among the drawings.

The clock CL or the sampling clock pulse SCL can be derived outside the detection circuit, so as to be utilized as a clock reproduced from the reception signal, in an equipment not shown.

FIG. 31 shows waveforms for explaining the operation of each of the detection circuits in this embodiment. The AM-modulated signal output Vo of the AGC circuit of the AM-modulated signal reception circuit in the prior-art circuit or each of the second-tenth embodiments, assumes only the two states of the large amplitude state and the small amplitude state (refer to the waveform at the first stage in FIG. 31).

In the basic circuit shown in FIG. 21A, the reference voltage setting unit outputs as the reference voltage value VR2, a voltage which is intermediate between the peak value (or bottom value) of the large amplitude state of the AM-modulated signal output Vo and the peak value (or bottom value) of the small amplitude state.

The timing extraction unit generates the clock pulse CL of the carrier frequency from the AM-modulated signal output Vo. The clock pulse CL has its leading edge (or trailing edge) timed to the vicinity of the peak value (or the vicinity of the bottom value) of the AM-modulated signal output Vo (that is, the phase of the clock pulse CL is shifted $\pi/2$ from that of the AM-modulated signal output Vo).

The clock generation unit generates the sampling clock pulse SCL from the carrier frequency clock pulse CL, and outputs it at a timing in the vicinity of the peak value (or the vicinity of the bottom value) of the AM-modulated signal output Vo.

When the sampling clock pulse SCL is "H" (or "L"), the sampling comparison-and-holding unit subjects the AM-modulated signal output Vo and the reference voltage value VR2 to the sampling comparison so as to output the comparison result as the signal TCO. Besides, when the sampling clock pulse SCL is "L" (or "H"), the unit holds the comparison result signal TCO outputted immediately before the change of the sampling clock pulse SCL.

Owing to the above operation, the peak value (or bottom value) of the large amplitude state of the AM-modulated signal output Vo and the peak value (or bottom value) of the small amplitude state are extracted at the timings of the sampling clock pulses SCL, and a signal which corresponds to the envelope of the extracted values is obtained, whereby the two-valued logic signal TCO corresponding to either of the large amplitude state and the small amplitude state can be derived from the AM-modulated signal output Vo which assumes the two states.

Figure 7:
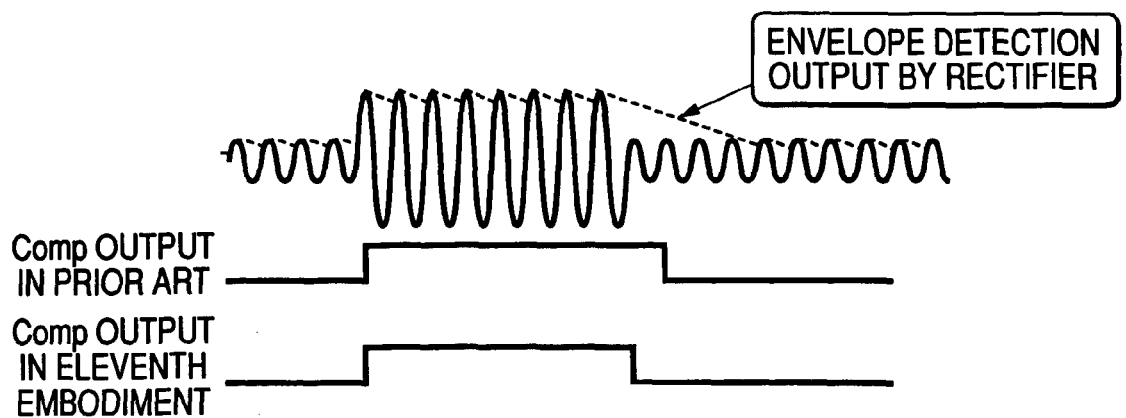
FIG. 7 is a diagram for comparing Comp (comparator) output waveforms in a large amplitude state in the prior art and in the eleventh embodiment of the present invention.

In the prior-art detection circuit SDet (in FIG. 6) which employs the rectifier Rec2, capacitor C2 and resistance R2, when the time constant which is determined by the product between the capacitance C2 and the resistance R2 is enlarged in order to remove the carrier frequency component of the AM-modulated waveform which assumes the two states of the large amplitude and small amplitude of the standard-radio-wave time code (refer to FIG. 5), a so-called "slack" appears in the envelope in the case where the large amplitude state shifts into the small amplitude state, with the result that the time width of the output signal TCO of the comparator Comp corresponding to the large amplitude state spreads (refer to FIG. 7).

In contrast, according to the detection circuit in the eleventh embodiment, the peak values (or bottom values) of the individual carrier amplitudes are sampled in succession, so that the "slack" as mentioned above does not appear in the time width of the output signal TCO of the comparator Comp corresponding to the large amplitude state, and the precise time width of the output signal TCO is attained.

Besides, when the sampling comparison-and-holding unit as shown in FIG. 21C or 21D is employed, a capacitance element, such as the capacitor C2, in the detection circuit SDet can be dispensed with, and this is suitable for IC implementation.

Figure 32:
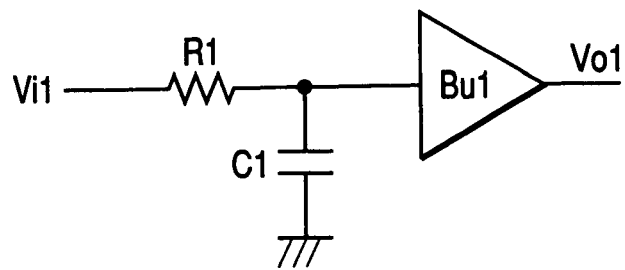
FIG. 32 and FIG. 33 are circuit diagrams of phase shift circuits in FIGS. 21C and 21D in the eleventh embodiment, respectively.
Figure 33:
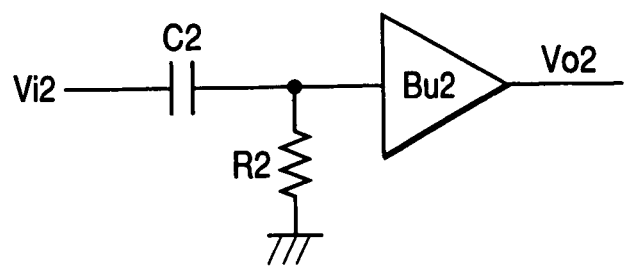

FIG. 32 and FIG. 33 show examples of phase shift circuits each of which shifts a phase to the amount of $\pi/2$ from the AM-modulated signal output Vo. Capacitance elements are necessitated for the phase shift circuit, and the monostable multivibrator which creates the time width corresponding to $\pi/2$. Since, however, the capacitance elements may have small capacitance values concerning a time zone of about ¼ of the carrier frequency, the IC implementation of the example is highly possible.

As thus far described, according to the detection circuits in the eleventh embodiment, the following advantages are brought forth:

(1) In receiving the standard-radio-wave time code which is transmitted as the time widths of the two states of the large amplitude and small amplitude, the detection output is obtained with the preciser time widths than in the prior-art envelope detection circuit.

(2) The capacitance element necessary for the prior-art envelope detection circuit can be dispensed with.

Twelfth Embodiment

Figure 22A:
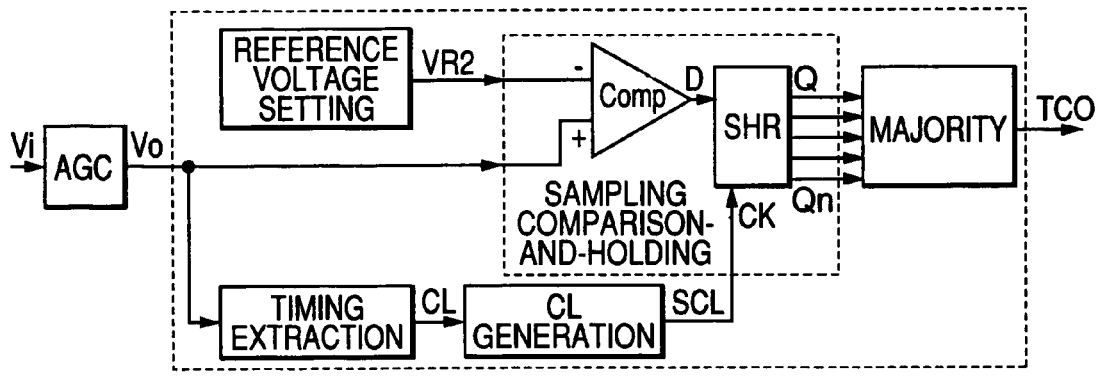
FIGS. 22A and 22B are circuit diagrams of AM-modulated signal detection circuits in the twelfth embodiment.
Figure 22B:
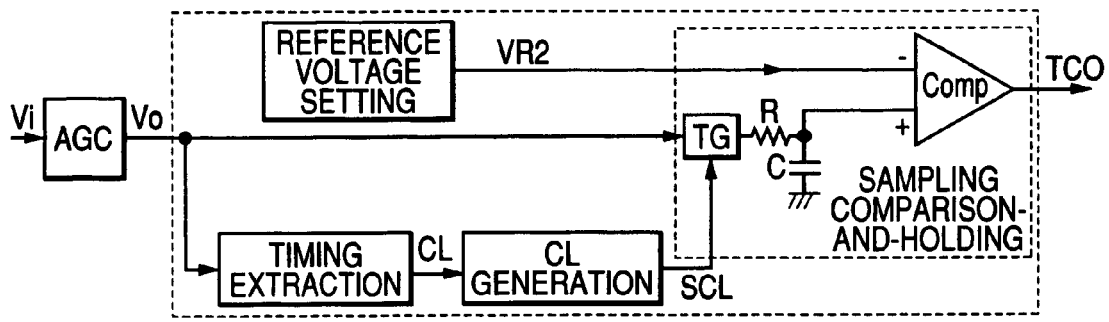

FIGS. 22A and 22B are circuit diagrams of AM-modulated signal detection circuits in the twelfth embodiment of the present invention. The AM-modulated signal detection circuit in the twelfth embodiment as shown in FIG. 22A is so constructed that the sampling comparison-and-holding unit in the eleventh embodiment is constituted by a comparator Comp which compares the reference voltage VR2 and the output signal Vo of the AGC circuit (or the output Vo1 of the first phase shift circuit PS1) so as to output a comparison result signal, a serial-in parallel-out shift register SHR of n bits (n being an odd number), which receives the output of the comparator Comp as data D and which receives the sampling clock pulse SCL as a clock CK, and a majority circuit which subjects the "H"/"L" outputs of the parallel outputs Q1-Qn of the shift register SHR to majority processing, so as to output "H" when the number of bits of the "H" outputs is larger, and "L" when smaller.

The operation of the detection circuit in the twelfth embodiment as shown in FIG. 22A is the same as that of the detection circuit in the eleventh embodiment except the majority processing, and shall be therefore omitted from description.

When noise is superposed on the AM-modulated signal output signal Vo at the timing of the sampling clock pulse SCL, the output of the comparator Comp sometimes falls into an erroneous output state (the TCO output becomes a so-called "pulled-out state"). Such erroneous output states can be prevented or relieved by taking an average value.

Besides, if the amplitude of the AM-modulated signal output Vo is slowly increasing or decreasing under the influence of the band-pass filter BPF of narrow band included in the AGC circuit, both the rise and fall of the timings at which the "H"/"L" majority decision of the parallel outputs of the shift register SHR is inverted lag precisely a time period which is obtained by multiplying ½ of the number of parallel bits by a sampling rate. Therefore, even when the number of bits of the shift register SHR is increased, the precise time of the change point of the AM-modulated signal output Vo can be calculated by making a time correction.

Figure 34:
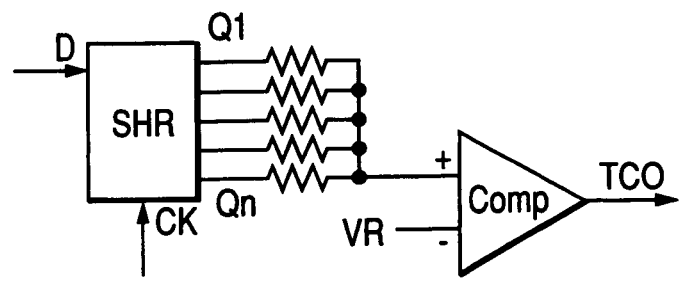
FIG. 34 and FIG. 35 are diagrams each showing a majority circuit in FIG. 29 in the twelfth embodiment.
Figure 35:
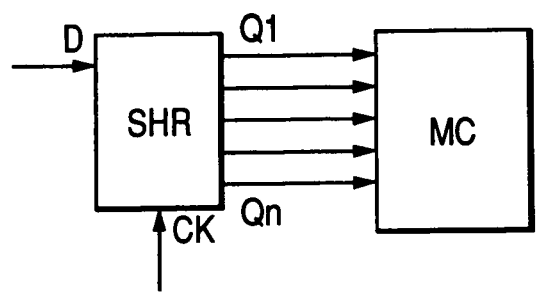

FIG. 34 shows an example of the majority circuit. In the radio timepiece or the like, the logic outputs TCO are accepted and converted into time information by a microcomputer or the like. If the logic output acceptance by the microcomputer or the like is premised, the parallel bit outputs of the shift register SHR (or serial bit outputs) may well be directly accepted and processed as shown in FIG. 35.

The majority processing of the digital bits has relevance to the averaging processing of analog signals. It is also allowed to adopt a circuit arrangement in which a resistance R is connected anteriorly to the capacitance C in FIG. 21B, thereby to construct a CR averaging circuit (refer to FIG. 22B), and in which the AM-modulated signal output Vo is averaged and then compared with the reference voltage VR2.

As thus far described, according to the detection circuits in the twelfth embodiment, when the noise is superposed on the AM-modulated signal output Vo, the outputs of the comparator Comp can be prevented or relieved from falling into the erroneous output states.

Figure 23:
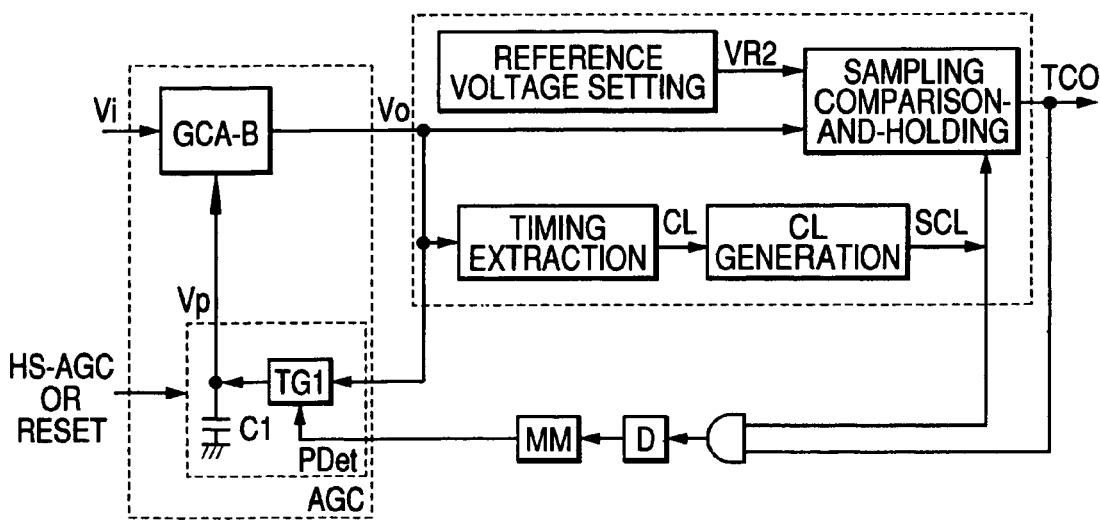
FIG. 23 is a circuit diagram showing a circuit example in which the idea of the reception circuit in the fifth embodiment is incorporated into the detection circuit in the eleventh embodiment or the twelfth embodiment.

A circuit in FIG. 23 is such that the idea of the reception circuit in the fifth embodiment is incorporated into the detection circuit in the eleventh embodiment or twelfth embodiment. The rectifier Rec1 and the resistance R1 for the discharge path can be dispensed with in the peak detection circuit PDet included in the AGC circuit, and the peak holding capacitance C1 can have its capacitance value lowered to the extent that it can be built in an IC.

The use of the power source circuit Reg which can control the power supply from the external power source VDD to the individual circuits by the control signal PON (for the creation of the ON state and standby state of the operation, the regulation of supply voltages, etc.) is effective when applied to the second-twelfth embodiments.

As described above in detail, according to the variable gain amplifier of the present invention, a differential input amplifier which is constructed including transistors T1 and T2 that constitute a differential pair, and a constant current circuit Is that operates as an absorption current circuit for the transistors T1 and T2 constituting the differential pair, comprises a variable impedance which is connected between sources of the respective transistors T1 and T2 constituting the differential pair, wherein the gain of the differential input amplifier is made variable by variably controlling the value of the variable impedance. Therefore, an output dynamic range in the case of lowering the minimum operating supply voltage and lowering the gain does not narrow, and a linear input range widens with the lowering of the gain, so that the variable gain amplifier has a good linearity between an input and an output, and the variable gain range thereof can be widened.

Besides, according to the AM-modulated signal reception circuit of the present invention, an AM-modulated signal reception circuit which receives an AM-modulated signal Vi in two states of a large amplitude state and a small amplitude state, and which identifies the two states, comprises a gain control amplifier block (GCA-B) whose gain is controlled by a peak value voltage Vp fed to a peak value input terminal, and which amplifies the input AM-modulated signal Vi and delivers an output Vo, an envelope detection circuit (SDet) which subjects the amplification output Vo of the gain control amplifier block (GCA-B) to envelope detection, a comparator circuit (Comp) which compares the output of the envelope detection circuit (SDet) and a reference voltage VR2 so as to output a logic signal TCO, and a peak detection circuit (PDet) which receives the output signal TCO of the comparator circuit (Comp) as a control input, which, when the input is in an "H" status (or "L" status), detects the peak value of the output Vo of the gain control amplifier block (GCA-B) so as to output the detection peak value Vp to the peak value input terminal of the control amplifier block (GCA-B), and which, when the output signal TCO of the comparator circuit (Comp) has changed into the "L" status (or "H" status), holds the detection peak value Vp detected immediately before the change, so as to output the held peak detection value to the peak value input terminal. Therefore, the capacitance value of the peak holding capacitance of the peak detection circuit (PDet) can be lowered, and the follow-up characteristic of an AGC circuit can be improved.

Further, according to the AM-modulated signal detection circuit of the present invention, an AM-modulated signal detection circuit in an AM-modulated signal reception circuit which receives an AM-modulated signal Vi in two states of a large amplitude state and a small amplitude state, and which identifies the two states, comprises a timing extraction unit which extracts a carrier frequency component from the output signal Vo of an AGC circuit for controlling and amplifying the received AM-modulated signal to a predetermined amplitude value, and which outputs a clock pulse CL timed to the peak position of the amplitude of the output signal Vo of the AGC circuit, a clock generation unit which receives the clock pulse CL as its input, and which outputs a sampling clock pulse SCL timed to the above peak position, a reference voltage setting unit which outputs a comparison reference voltage VR2, and a sampling comparison-and-holding unit which, when the sampling clock pulse SCL is inputted, subjects the output Vo of the AGC circuit and the comparison reference voltage VR2 to sampling comparison, so as to output a comparison result signal TCO and to hold it until the next sampling clock pulse SCL is inputted. Therefore, the change of the amplitude can be immediately responded to by uniformalizing the rise characteristic and fall characteristic of a detection waveform.

What is claimed is:

1. An AM-modulated signal reception circuit which receives an AM-modulated signal Vi in two states of a large amplitude state and a small amplitude state, and which identifies the two states; comprising:
   a gain control amplifier block (GCA-B) whose gain is controlled by a peak value voltage Vp from a peak value input terminal, and which amplifies the input AM-modulated signal Vi so as to deliver an output Vo;
   an envelope detection circuit (SDet) which detects an envelope of the amplification output Vo of said gain control amplifier block (GCA-B);
   a comparator circuit (Comp) which compares an output of said envelope detection circuit (SDet) and a reference voltage VR2 so as to output a logic signal TCO; and
   a peak detection circuit (PDet) which receives the output signal TCO of said comparator circuit (Comp) as a control input, which, when the control input is an "H" status (or "L" status), detects a peak value of the output Vo of said gain control amplifier block (GCA-B) so as to deliver the detection peak value Vp to the peak value input terminal of said control amplifier block (GCA-B), and which, when the output signal of said comparator circuit (Comp) has changed into the "L" status (or "H" status), holds the detection peak value Vp detected immediately before the change, so as to output the held detection peak value to said peak value input terminal.

2. An AM-modulated signal reception circuit according to claim 1, wherein said peak detection circuit (PDet) includes:
   a rectification circuit (Rec1) which rectifies the output signal Vo of said gain control amplifier block (GCA-B);
   a resistance R1 for a discharge path, which is connected between an output of said rectification circuit (Rec1) and ground (or a supply voltage);
   a transfer gate (TG1) whose conduction terminal is connected to the output of said rectification circuit (Rec1) at its one end and is connected to said peak value input terminal of said gain control amplifier block (GCA-B) at its other end, which receives said output signal TCO of said comparator circuit (Comp) as a control input, and which falls into a conductive state when the control input is in said "H" status (or "L" status) and falls into a nonconductive state when said control input is in said "L" status (or "H" status); and a peak holding capacitance C1 which is connected between the other end of the conduction terminal of said transfer gate (TG1) and ground (or a supply voltage).

3. An AM-modulated signal reception circuit according to claim 1, wherein said peak detection circuit (PDet) includes:
a rectification circuit (Rec1) which rectifies the output signal Vo of said gain control amplifier block (GCA-B);
a peak holding capacitance C1 which is connected between an output of said rectification circuit (Rec1) and ground (or a supply voltage);
a resistance R1 for a discharge path, one end of which is connected to the output of said rectification circuit (Rec1) and said peak value input terminal of said gain control amplifier block (GCA-B); and
a transfer gate (TG1) whose conduction terminal is connected to the other end of said resistance R1 for the discharge path at its one end and is connected to the ground at its other end, which receives said output signal TCO of said comparator circuit (Comp) as a control input, and which falls into a conductive state when the control input is in said "H" status (or "L" status) and falls into a nonconductive state when said control input is in said "L" status (or "H" status).

4. An AM-modulated signal reception circuit according to claim 2, wherein said peak detection circuit (PDet) further includes a second discharge path (resistance R3 or constant current circuit I3) through which a current smaller than that of said resistance R1 for the discharge path or said constant current circuit I1 for the discharge path is caused to flow, and which is connected in parallel with said peak holding capacitance C1.

5. An AM-modulated signal reception circuit according to claim 4 wherein said peak detection circuit (PDet) includes:
a rectification circuit (Rec1) which rectifies the output signal Vo of said gain control amplifier block (GCA-B);
a peak holding capacitance C1 which is connected between an output of said rectification circuit (Rec1) and ground (or a supply voltage); and
a constant current circuit I1 for a discharge path and provided with a control input, whose current output terminal is connected to the output of said rectification circuit (Rec1) and said peak value input terminal of said gain control amplifier block (GCA-B), whose ground terminal is connected to ground, which receives said output signal TCO of said comparator circuit (Comp) as the control input, and which outputs a constant current I1 from the current output terminal when said control input is in said "H" status (or "L" status) and turns OFF the constant current I1 when said control input is in said "L" status (or "H" status).

6. An AM-modulated signal reception circuit according to claim 2, wherein said transfer gate (TG1) or said constant current circuit I1 for the discharge path and provided with the control input as is included in said peak detection circuit (PDet) is controlled by a signal which is obtained by OR synthesis between said output signal TCO of said comparator circuit (Comp) and an external control signal HS-AGC.

7. An AM-modulated signal reception circuit according to claim 2, further comprising forcible discharge means for forcibly discharging charges stored in said peak holding capacitance C1 of said peak detection circuit (PDet), by an external control signal RESET.

8. An AM-modulated signal reception circuit according to claim 2, further comprising control means for forcibly turning ON said transfer gate TG1 as is included in said peak detection circuit (PDet), in a case where said output signal TCO of said comparator circuit (Comp) does not fall into the output status corresponding to the large amplitude input, for a predetermined time period.

9. An AM-modulated signal reception circuit according to claim 8, wherein said control means for the forcible turn-ON includes a timer circuit which receives said output signal TCO of said comparator circuit (Comp) as an input, and which outputs "0" as soon as said output signal TCO has changed into the output status corresponding to the large amplitude reception mode and outputs "1" upon lapse of a predetermined time period when said output signal TCO has changed into the output status corresponding to the small amplitude reception mode, and OR synthesis means for executing OR synthesis between the output of said timer circuit and said output signal TCO of said comparator circuit (Comp) and then outputting a signal for the control.

10. An AM-modulated signal reception circuit according to claim 2, further comprising means for forcibly turning OFF charge and discharge of said peak holding capacitance C1 of said peak detection circuit (PDet).

11. An AM-modulated signal reception circuit according to claim 2, further comprising a delay circuit (D) which delays the output signal TCO of said comparator circuit (Comp), a monostable multivibrator (MM) which receives an output of said delay circuit (D) so as to output a pulse of predetermined time width, and a changeover switch (S) which changes-over the output of said monostable multivibrator (MM) and said output signal TCO of said comparator circuit (Comp) so as to feed the changed-over output to the control input terminal of said transfer gate TG1 (or constant current circuit I1 capable of turn ON/OFF) of said peak detection circuit (PDet).

12. An AM-modulated signal reception circuit according to claim 2, further comprising a delay circuit (D) which delays the output signal TCO of said comparator circuit (Comp), a monostable multivibrator (MM) which receives an output of said delay circuit D so as to output a pulse of predetermined time width, an AND circuit which executes AND synthesis between the output of said monostable multivibrator (MM) and said output signal TCO of said comparator circuit (Comp), and a changeover switch (S) which changes-over an output of said AND circuit and said output signal TCO of said comparator circuit (Comp) so as to feed the changed-over output to the control input terminal of said transfer gate TG1 (or constant current circuit I1 capable of turn ON/OFF) of said peak detection circuit (PDet).

13. An AM-modulated signal reception circuit which simultaneously receives radio waves from a plurality of stations, comprising:
a first tuning circuit which includes an antenna coil L1 and a tuning capacitance C1 for tuning reception of the radio wave of carrier frequency f1;
a preamplifier (PA1) which amplifies an output signal of said first tuning circuit;
a second tuning circuit which includes an antenna coil L2 and a tuning capacitance C2 for tuning reception of the radio wave of carrier frequency f2;
a preamplifier (PA2) which amplifies an output signal of said second tuning circuit;
an adder circuit (Add) which adds up outputs of the preamplifiers (PA1) and (PA2);
a gain control amplifier block (GCA-B) which amplifies an output signal Vi of said adder circuit (Add) by lowering its gain when a DC control voltage Vp rises and by heightening its gain when the DC control voltage Vp lowers, and which includes two band-pass filters (BPF1, BPF2) that output a band signal Vo1 having a bandwidth Δf1 at the center frequency f1 and a band signal Vo2 having a bandwidth Δf2 at the center frequency f2;

a peak detection circuit (PDet) which includes a peak holding capacitor C1, a rectification circuit (Rec1a) that rectifies the band signal Vo1 so as to charge said peak holding capacitor C1, a rectification circuit (Rec1b) that rectifies the band signal Vo2 so as to charge said peak holding capacitor C1, and a discharge resistance R1 that discharges stored charges of said peak holding capacitor C1, and which outputs a charged voltage of said holding capacitor C1 as the control voltage Vp to said gain control amplifier block (GCA-B);

an envelope detection circuit (SDet) which includes a peak holding capacitor C2, a rectification circuit (Rec2a) that rectifies said band signal Vo1 so as to charge said peak holding capacitor C2, a rectification circuit (Rec2b) that rectifies said band signal Vo2 so as to charge said peak holding capacitor C2, and a discharge resistance R2 that discharges stored charges of said peak holding capacitor C2, and which outputs a charged voltage of said peak holding capacitor C2 as an envelope detection output; and a comparator (Comp) which compares the output of said envelope detection circuit (SDet) and a reference voltage VR2 so as to output a signal TCO.

14. An AM-modulated signal reception circuit according to claim 13, further comprising a second adder circuit (Add2) which adds up the output of the band-pass filter (BPF1) of said gain control amplifier block (GCA-B), for extracting said band signal Vo1 having the bandwidth Δf1 at said center frequency f1, and the output of the band-pass filter (BPF2) thereof for extracting said band signal Vo2 having the bandwidth Δf2 at said center frequency f2, and an output of which is inputted to said peak detection circuit (PDet) and said envelope detection circuit (SDet).

15. An AM-modulated signal reception circuit according to claim 13, wherein the antenna coils L1 and L2 are bar antennae, which are arranged on a horizontal plane so as to be orthogonal to each other, a tuning frequency of said antenna coil L1 and said tuning capacitance C1 and a tuning frequency of said antenna coil L2 and said tuning capacitance C2 are set at an identical frequency f, a phase changeover switch (S) which changes-over an output phase of said preamplifier (PA2) between positive and negative phases is inserted between the output of said preamplifier (PA2) and an input terminal of said adder circuit (Add), and the band-pass filters built in said gain control amplifier block (GCA-B) are constructed as a single band-pass filter (BPF).

16. An AM-modulated signal reception circuit according to claim 14, wherein:

the antenna coils L1 and L2 are bar antennae, which are arranged on a horizontal plane so as to be orthogonal to each other, and a tuning frequency of said antenna coil L1 and said tuning capacitance C1 and a tuning frequency of said antenna coil L2 and said tuning capacitance C2 are set at an identical frequency f1;

a tuning capacitance C3 which can be electrically connected and disconnected by a switch (S1) is added to said tuning capacitance C1, while a tuning capacitance C4 which can be electrically connected and disconnected by a switch (S2) is added to said tuning capacitance C2;

a tuning frequency of said antenna coil L1 and the tuning capacitances C1 and C3, and a tuning frequency of said antenna coil L2 and the tuning capacitances C2 and C4 are set at an identical frequency f2; and a phase changeover switch (S) which changes-over an output phase of said preamplifier (PA2) between positive and negative phases is inserted between the output of said preamplifier (PA2) and an input terminal of said adder circuit (Add).

17. A detection circuit in an AM-modulated signal reception circuit which receives an AM-modulated signal Vi in two states of a large amplitude state and a small amplitude state, and which identifies the two states; comprising:

a timing extraction unit which extracts a carrier frequency component from an output signal Vo of an AGC circuit that controls and amplifies the received AM-modulated signal to a predetermined amplitude value, and which outputs a clock pulse CL that is timed to a peak position of an amplitude of an output signal Vo of the AGC circuit;

a clock generation unit to which the clock pulse CL is inputted so as to output a sampling clock pulse SCL timed to the peak position;

a reference voltage setting unit which outputs a comparison reference voltage VR2; and a sampling comparison-and-holding unit which samples and compares the output Vo of said AGC circuit and the comparison reference voltage VR2 so as to output a comparison result signal TCO when the sampling clock pulse SCL is inputted, and which holds the sampled and compared voltages until the next sampling clock pulse SCL is inputted.

18. A detection circuit according to claim 17, wherein said reference voltage setting unit is a voltage division circuit which outputs the reference voltage value VR2 that is obtained by dividing an output signal Vp of a peak detection circuit (PDet) included in said AGC circuit.

19. A detection circuit according to claim 17, wherein said timing extraction unit includes a limit amplifier (LIM) which limit-amplifies the output Vo of said AGC circuit, and a first monostable multivibrator (MM1) which outputs the clock pulse CL when triggered by an output of said limit amplifier (LIM).

20. A detection circuit according to claim 17, wherein said timing extraction unit includes a first phase shift circuit (PS1) which advances (or retards) a phase of the output signal Vo of said AGC circuit so as to deliver an output Vo1, a second phase shift circuit (PS2) which retards (or advances) the phase of said output signal Vo of said AGC circuit so as to output the resulting signal, and a limit amplifier (LIM) which limit-amplifies the output of said second phase shift circuit (PS2) so as to output the clock pulse CL.

21. A detection circuit according to claim 17, wherein said clock generation unit is a second monostable multivibrator (MM2) which receives the clock pulse CL so as to generate the sampling clock pulse SCL.

22. A detection circuit according to claim 17, wherein said clock generation unit includes a delay circuit (Dt) which inverts and delays the clock pulse CL, and a logic synthesis circuit (NOR/AND) which executes NOR or AND synthesis between an output of said delay circuit (Dt) and said clock pulse CL so as to output the sampling clock pulse SCL.

23. A detection circuit according to claim 17, wherein said sampling comparison-and-holding unit includes a holding capacitance C one end of which is grounded, a transfer gate (TG) which brings a path between the output Vo of said AGC circuit and the other end of said holding capacitance C, into a conductive state when the sampling clock pulse SCL is inputted, and a comparator (Comp) which compares a voltage at said other end of said holding capacitance C and the comparison reference voltage VR2.

24. A detection circuit according to claim 20, wherein said sampling comparison-and-holding unit includes a hysteresis type comparator (Comp) whose output signal TCO is determined in accordance with differential inputs, and which holds a logic output status assumed immediately before opening, in an input open state, and a transfer gate (TG) which, when the sampling clock pulse SCL is inputted, falls into a conductive state so as to connect the output Vo1 of said first phase shift-circuit (PS1) and the reference voltage VR2 to the differential inputs of said hysteresis type comparator (Comp).

25. A detection circuit according to claim 20, wherein said sampling comparison-and-holding unit includes a comparator (Comp) which compares the output signal Vo1 of said first phase shift circuit (PS1) and the reference voltage VR2, and a D-type flip-flop which receives an output of said comparator (Comp) as its data input D, which receives the sampling clock pulse SCL as its clock input CK, and which delivers its logic output Q as the logic output TCO of the AM-modulated signal detection circuit.

26. A detection circuit according to claim 23, wherein said sampling comparison-and-holding unit further includes a resistance R which is inserted into a contact point between said transfer gate (TG) and said holding capacitance C.

27. A detection circuit according to claim 25, wherein said D-type flip-flop of said sampling comparison-and-holding unit includes a serial-in parallel-out shift register (SHR) of n bits (n being an odd number) which receives an output of said comparator (Comp) as its data input D and also receives the sampling clock pulse SCL as its clock input CK, and a majority circuit which subjects "H"/"L" outputs of parallel outputs Q1-Qn of said shift register (SHR) to majority processing, so as to output "H" when the number of bits of the "H" outputs is larger and to output "L" when smaller.

28. A detection circuit according to claim 20, wherein said timing extraction unit further includes a tank tuning circuit which is interposed between said second phase shift circuit (PS2) and said limit amplifier (LIM).

\* \* \* \* \*